United States Patent
Kouno

(10) Patent No.: US 8,072,241 B2
(45) Date of Patent: Dec. 6, 2011

(54) SEMICONDUCTOR DEVICE HAVING DIODE-BUILT-IN IGBT AND SEMICONDUCTOR DEVICE HAVING DIODE-BUILT-IN DMOS

(75) Inventor: Kenji Kouno, Gifu (JP)

(73) Assignee: DENSO CORPORATION, Kariya (JP)

( * ) Notice: Subject to any disclaimer, the term of this patent is extended or adjusted under 35 U.S.C. 154(b) by 542 days.

(21) Appl. No.: 12/230,794

(22) Filed: Sep. 4, 2008

(65) Prior Publication Data
US 2009/0057832 A1    Mar. 5, 2009

(30) Foreign Application Priority Data

| Sep. 5, 2007 | (JP) | 2007-229959 |
| Oct. 15, 2007 | (JP) | 2007-268328 |
| Apr. 2, 2008 | (JP) | 2008-096017 |
| Apr. 2, 2008 | (JP) | 2008-096018 |

(51) Int. Cl.
*H01L 29/78* (2006.01)
*H03K 19/08* (2006.01)

(52) U.S. Cl. .......... 326/61; 326/118; 327/480

(58) Field of Classification Search .......... 326/61, 326/118; 361/87; 327/478–480
See application file for complete search history.

(56) References Cited

U.S. PATENT DOCUMENTS

| 5,306,937 | A |   | 4/1994 | Nishimura |   |
| 5,325,258 | A | * | 6/1994 | Choi et al. | 361/87 |
| 5,375,029 | A | * | 12/1994 | Fukunaga et al. | 361/101 |
| 5,396,117 | A | * | 3/1995 | Housen et al. | 327/480 |
| 5,432,471 | A | * | 7/1995 | Majumdar et al. | 327/380 |
| 5,444,591 | A |   | 8/1995 | Chokhawala et al. |   |
| 5,559,656 | A |   | 9/1996 | Chokhawala |   |
| 5,619,047 | A |   | 4/1997 | Bauer |   |
| 5,619,074 | A |   | 4/1997 | Berch et al. |   |
| 5,702,961 | A |   | 12/1997 | Park |   |
| 5,710,508 | A | * | 1/1998 | Watanabe | 323/284 |
| 5,828,112 | A |   | 10/1998 | Yamaguchi |   |
| 6,215,289 | B1 |   | 4/2001 | Simonnet |   |
| 6,215,634 | B1 | * | 4/2001 | Terasawa | 361/100 |
| 6,594,131 | B2 | * | 7/2003 | Umekawa | 361/93.7 |

(Continued)

FOREIGN PATENT DOCUMENTS
DE    10201378    7/2003
(Continued)

OTHER PUBLICATIONS

R. Natarajan, et al., "An 800V Integrated DMOS-IGBT/PiN or MPS-Rectifier Power Device," ICs, Kitakyushu, (2004), pp. 261-264.

(Continued)

*Primary Examiner* — Jason M Crawford
(74) *Attorney, Agent, or Firm* — Posz Law Group, PLC

(57) ABSTRACT

A semiconductor device includes: a semiconductor substrate; a diode-built-in insulated-gate bipolar transistor having an insulated-gate bipolar transistor and a diode, which are disposed in the substrate, wherein the insulated-gate bipolar transistor includes a gate, and is driven with a driving signal input into the gate; and a feedback unit for detecting current passing through the diode. The driving signal is input from an external unit into the feedback unit. The feedback unit passes the driving signal to the gate of the insulated-gate bipolar transistor when the feedback unit detects no current through the diode, and the feedback unit stops passing the driving signal to the gate of the insulated-gate bipolar transistor when the feedback unit detects the current through the diode.

8 Claims, 21 Drawing Sheets

U.S. PATENT DOCUMENTS

| | | | |
|---|---|---|---|
| 6,717,785 B2 * | 4/2004 | Fukuda et al. | 361/93.1 |
| 6,829,152 B2 * | 12/2004 | Miura et al. | 363/40 |
| 6,842,064 B2 * | 1/2005 | Yamamoto | 327/480 |
| 6,867,454 B2 | 3/2005 | Hattori | |
| 7,414,867 B2 * | 8/2008 | Hussein et al. | 363/56.03 |
| 2001/0026429 A1 | 10/2001 | Fukuda et al. | |
| 2005/0017290 A1 | 1/2005 | Takahashi et al. | |
| 2005/0258493 A1 | 11/2005 | Aono et al. | |
| 2006/0055056 A1 | 3/2006 | Miura et al. | |
| 2008/0258172 A1 | 10/2008 | Takahashi et al. | |
| 2009/0057832 A1 | 3/2009 | Kouno | |
| 2009/0114947 A1 * | 5/2009 | Fukuda et al. | 257/140 |
| 2010/0090248 A1 * | 4/2010 | Kouno | 257/140 |
| 2010/0156506 A1 * | 6/2010 | Tsuzuki et al. | 327/478 |
| 2010/0187567 A1 * | 7/2010 | Tanabe et al. | 257/140 |

FOREIGN PATENT DOCUMENTS

| | | |
|---|---|---|
| JP | A-H2-202375 | 8/1990 |
| JP | A-H2-309676 | 12/1990 |
| JP | A-H3-190566 | 8/1991 |
| JP | A-H7-94730 | 4/1995 |
| JP | A-H10-32976 | 2/1998 |
| JP | A-H11-54747 | 2/1999 |
| JP | A-2000-200906 | 7/2000 |
| JP | A-2002-185295 | 6/2002 |
| JP | A-2004-88001 | 3/2004 |
| JP | A-2004-180386 | 6/2004 |
| JP | A-2004-208407 | 7/2004 |
| JP | A-2007-71796 | 3/2007 |
| JP | A-2007-194660 | 8/2007 |
| JP | A-2007-287988 | 11/2007 |
| JP | A-2008-53648 | 3/2008 |
| JP | A-2008-72848 | 3/2008 |

OTHER PUBLICATIONS

H. Takahashi et al., "RC-IGBT for Motor Control," vol. 81, No. 5 (2007). (English Abstract enclosed).

Office Action mailed Feb. 28, 2011 issued in corresponding CN application No. 200810212562.7 (English translation enclosed).

Office Action mailed on Jul. 12, 2011 in the corresponding Japanese patent application No. 2008-226982 (English translation enclosed).

Notice of Reason for Refusal mailed Aug. 2, 2011 in corresponding JP application No. 2008-228356 (and English translation).

Second Office Action mailed Aug. 31, 2011 in corresponding Chinese application No. 200810212562.7 (with English translation).

* cited by examiner

SEMICONDUCTOR DEVICE HAVING DIODE-BUILT-IN IGBT AND SEMICONDUCTOR DEVICE HAVING DIODE-BUILT-IN DMOS

CROSS REFERENCE TO RELATED APPLICATIONS

This application is based on Japanese Patent Applications No. 2007-229959 filed on Sep. 5, 2007, No. 2007-268328 filed on Oct. 15, 2007, No. 2008-96017 filed on Apr. 2, 2008 and No. 2008-96018 filed on Apr. 2, 2008, the disclosures of which are incorporated herein by reference.

FIELD OF THE INVENTION

The present invention relates to a semiconductor device having a diode-built-in IGBT, and a semiconductor device having a diode-built-in DMOS.

BACKGROUND OF THE INVENTION

In the past, a proposal has been made of an IGBT with a body diode that has diode elements and IGBT elements formed in the same semiconductor substrate (refer to, for example, a patent document 1, that is, JP-A-6-351226 corresponding to U.S. Pat. No. 5,559,656). The IGBT with a body diode has the anode electrodes of the diode elements and the emitter electrodes of the IBGT elements formed in common with each other, and has the cathode electrodes of the diode elements and the collector electrodes of the IGBT elements formed in common with each other. The IGBT with a body diode is incorporated in, for example, an inverter circuit, and used to control a load according to a pulse-width modulation (PWM) control method.

However, when the conventional IGBT with a body diode is incorporated in an inverter circuit, a gate signal for the IGBT elements is, in principle, a signal that has the phase thereof inverted between the upper and lower arms of the inverter circuit. The gate signal is therefore inputted to the IGBT elements even at the timing at which, for example, the diode elements freewheel. In other words, the action of the diode elements and the action of the IGBT elements take place simultaneously. Incidentally, the action of the IGBT elements signifies that the gate signal is inputted to the IGBT elements.

As mentioned above, when the action of the diode elements and the action of the IGBT elements take place simultaneously, since the electrodes are formed in common, if the channels in the IGBT elements conduct, the anodes and cathodes of the diode elements are brought to the same potential. Consequently, the body diode including the diode elements cannot readily act in a forward direction due to the gate potential of the IGBT elements. As a result, the forward voltage Vf of the diode elements increases, and the forward loss caused by the diode elements increases.

As a method for avoiding the foregoing problem by devising a device structure, formation of a diode-only region, that is, a region devoid of a gate separately from a body diode of an IGBT is conceivable as described in, for example, "Proceedings of 2004 International Symposium on Power Semiconductor Devices & Amp; ICs" (pp 261-264). However, a region that does not act as the IGBT, that is, a region that performs a diode action alone expands. Consequently, if the diode-only region is formed with a chip size left unchanged, the on-state voltage of the IGBT increases. Incidentally, if the on voltage of the diode is fixed, the chip size increases.

On the other hand, for dc-dc converters, a method of implementing synchronous rectification control by incorporating a double-diffused metal-oxide FET semiconductor (DMOS) with a body diode as a switching device in a control circuit is widely known. When a current flows into diode elements included in the DMOS with a body diode, a forward voltage is developed in the diode elements and a dc loss equivalent to the forward voltage is produced. Therefore, when such synchronous rectification control is implemented, a method of sensing the current in DMOS elements using a current transformer for the purpose of bringing a gate signal for reflux DMOS elements to an on-state voltage level is generally adopted (refer to, for example, JP-A-2004-180386).

However, the current transformer is needed as a current sensing device. This poses a problem in that the circuit scale gets larger. As a method that solves the problem, a method of monitoring a voltage across the terminals of a switching device is conceivable (refer to, for example, JP-A-2004-208407). However, according to this method, a control IC whose input terminal can withstand a high supply voltage is needed. Since noise resistivity is strictly requested at the time of conducting a high voltage, addition of a protective device or any other highly resistive design is needed. This poses a problem in that the cost of the control IC increases.

Thus, it is required to prevent an increase in a forward loss caused by a diode, which is included in a semiconductor device including an IGBT with a body diode, by avoiding the interference of the action of diode elements with the action of IGBT elements. Further, it is required to prevent an increase in a loss in a forward voltage of the diode elements, which are included in a semiconductor device including a DMOS with a body diode, by synchronizing the action of the diode elements with the action of DMOS elements.

As described in, for example, JP-A-2004-88001, a method of using current detection elements, which have the same structure as insulated-gate bipolar transistor (IGBT) elements do, to detect whether a current has flowed into freewheeling diode (FWD) elements, feeding back the result of the detection to a gate drive circuit, and setting the gate driving signal for the IGBT elements to an off-state voltage level when the FWD elements are put into action is conceivable. However, since the current detection elements having such a structure are affected by a gate potential, a current cannot readily flow into the current detection elements. A detective voltage cannot therefore be developed at the current detection elements. In other words, feedback cannot be precisely performed, and an increase in a forward loss caused by the commutation diode elements cannot be effectively suppressed.

Thus, it is required to provide a semiconductor device capable of suppressing an increase in a forward loss caused by FWD elements despite a construction having the FWD elements incorporated in IGBT elements.

SUMMARY OF THE INVENTION

In view of the above-described problem, it is an object of the present disclosure to provide a semiconductor device having a diode-built-in IGBT. It is another object of the present disclosure to provide a semiconductor device having a diode-built-in DMOS.

According to a first aspect of the present disclosure, a semiconductor device includes: a semiconductor substrate; a diode-built-in insulated-gate bipolar transistor having an insulated-gate bipolar transistor and a diode, which are disposed in the substrate, wherein the insulated-gate bipolar transistor includes a gate, and is driven with a driving signal input into the gate; and a feedback unit for detecting current passing through the diode. The driving signal is input from an external unit into the feedback unit. The feedback unit passes the driving signal to the gate of the insulated-gate bipolar transistor when the feedback unit detects no current through the diode. The feedback unit stops passing the driving signal to the gate of the insulated-gate bipolar transistor when the feedback unit detects the current through the diode.

In the above semiconductor device the interference of the action of the diode with the action of the IGBT can be avoided. Further, since the diode and IGBT are simultaneously turned on, an increase in a loss in the forward voltage of the diode can be prevented.

According to a second aspect of the present disclosure, a semiconductor device includes: a semiconductor substrate; a diode-built-in double diffused metal oxide semiconductor transistor having a double diffused metal oxide semiconductor transistor and a diode, which are disposed in the substrate; wherein the double diffused metal oxide semiconductor transistor includes a gate, which is driven with a driving signal input into the gate; and a feedback unit for detecting current passing through the diode. The driving signal is input from an external unit into the feedback unit. The feedback unit stops driving the double diffused metal oxide semiconductor transistor when the feedback unit detects no current through the diode, and the feedback unit drives the double diffused metal oxide semiconductor transistor so that current having a direction equal to a forward direction of the forward current flows through the double diffused metal oxide semiconductor transistor when the feedback unit detects a forward current through the diode.

In the above device, an increase in a dc loss equivalent to a forward voltage occurring when the forward current flows into the diode can be prevented.

According to a third aspect of the present disclosure, a semiconductor device includes: a semiconductor substrate; a diode-built-in insulated-gate bipolar transistor having an insulated-gate bipolar transistor and a diode unit, which are disposed in the substrate, wherein the insulated-gate bipolar transistor includes a gate, and is driven with a driving signal input into the gate, wherein the diode unit includes a diode element and a diode current sensing element, and wherein the diode current sensing element passes current in proportion to current flowing through the diode element; a sensing resistor coupled with the diode current sensing element; and a feedback unit. The driving signal is input from an external unit into the feedback unit. The feedback unit provides a first diode current threshold, which defines whether the diode element passes current. The feedback unit compares a voltage between two ends of the sensing resistor with the first diode current threshold. The feedback unit passes the driving signal to the gate of the insulated-gate bipolar transistor so that the insulated-gate bipolar transistor turns on when the voltage between two ends of the sensing resistor is equal to or larger than the first diode current threshold, and the feedback unit stops passing the driving signal to the gate of the insulated-gate bipolar transistor so that the insulated-gate bipolar transistor turns off when the voltage between two ends of the sensing resistor is smaller than the first diode current threshold.

In the above device, the interference between the action of the diode and the action of the IGBT can be avoided. Further, an increase in a loss in the forward voltage of the diode can be prevented.

According to a fourth aspect of the present disclosure, a semiconductor device includes: a semiconductor substrate; a diode-built-in insulated-gate bipolar transistor having an insulated-gate bipolar transistor and a diode unit, which are disposed in the substrate, wherein the insulated-gate bipolar transistor includes a gate, and is driven with a driving signal input into the gate, wherein the diode unit includes a diode element and a diode current sensing element, and wherein the diode current sensing element passes current in proportion to current flowing through the diode element; a sensing resistor coupled with the diode current sensing element; and first and second feedback units. The first feedback unit provides a decision threshold, which defines whether the insulated-gate bipolar transistor is in an on-state. The first feedback unit compares a gate voltage of the insulated-gate bipolar transistor with the decision threshold. The first feedback unit outputs a first diode current threshold when the gate voltage is larger than the decision threshold. The first diode current threshold shows that the insulated-gate bipolar transistor is in the on-state. The first feedback unit outputs a second diode current threshold when the gate voltage is equal to or smaller than the decision threshold. The second diode current threshold shows that the insulated-gate bipolar transistor is in an off-state, and the second diode current threshold is larger than the first diode current threshold. The driving signal is input from an external unit into the second feedback unit. The second feedback unit compares a voltage between two ends of the sensing resistor with the first diode current threshold when the voltage between two ends of the sensing resistor decreases. The feedback unit passes the driving signal to the gate of the insulated-gate bipolar transistor so that the insulated-gate bipolar transistor turns on when the voltage between two ends of the sensing resistor is equal to or larger than the first diode current threshold in a case where the voltage between two ends of the sensing resistor decreases. The feedback unit stops passing the driving signal to the gate of the insulated-gate bipolar transistor so that the insulated-gate bipolar transistor turns off when the voltage between two ends of the sensing resistor is smaller than the first diode current threshold in a case where the voltage between two ends of the sensing resistor decreases. The second feedback unit compares the voltage between two ends of the sensing resistor with the second diode current threshold when the voltage between two ends of the sensing resistor increases. The feedback unit stops passing the driving signal to the gate of the insulated-gate bipolar transistor so that the insulated-gate bipolar transistor turns off when the voltage between two ends of the sensing resistor is smaller than the second diode current threshold in a case where the voltage between two ends of the sensing resistor increases, and the feedback unit passes the driving signal to the gate of the insulated-gate bipolar transistor so that the insulated-gate bipolar transistor turns on when the voltage between two ends of the sensing resistor is equal to or larger than the second diode current threshold in a case where the voltage between two ends of the sensing resistor increases.

In the above device, the IGBT can be controlled stably without being vibrated. Moreover, the interference between the action of the diode and the action of the IGBT can be avoided in order to prevent an increase in a forward loss in the diode.

According to a fifth aspect of the present disclosure, a semiconductor device includes: a semiconductor substrate; a diode-built-in insulated-gate bipolar transistor having an insulated-gate bipolar transistor unit and a diode unit, which are disposed in the substrate, wherein the insulated-gate bipolar transistor unit includes an insulated-gate bipolar transistor and an IGBT current sensing element, wherein the insulated-gate bipolar transistor includes a gate, and is driven with a driving signal input into the gate, wherein the IGBT current sensing element passes current in proportion to current flowing through the insulated-gate bipolar transistor, wherein the diode unit includes a diode element and a diode current sensing element, and wherein the diode current sensing element passes current in proportion to current flowing through the diode element; a sensing resistor coupled with the IGBT current sensing element and the diode current sensing element; an IGBT feedback unit; and a diode Schmitt unit. The driving signal is input from an external unit into the IGBT feedback unit. The IGBT feedback unit provides an over current threshold, which defines whether over current passes through the insulated-gate bipolar transistor. The IGBT feedback unit compares a voltage between two ends of the sensing resistor with the over current threshold. The IGBT feedback unit passes the driving signal to the gate of the insulated-gate bipolar transistor so that the insulated-gate bipolar transistor turns on when the voltage between two ends of the sensing resistor is equal to or smaller than the over current threshold. The IGBT feedback unit stops passing the driving signal to the gate of the insulated-gate bipolar transistor so that the insulated-gate bipolar transistor turns off when the voltage between two ends of the sensing resistor is larger than the first diode current threshold. The driving signal is further input from the external unit into the diode Schmitt unit. The diode Schmitt unit provides a first diode current threshold, which defines whether the diode element passes current, and a second diode current threshold, which is larger than the first diode current threshold. The diode Schmitt unit compares the voltage between two ends of the sensing resistor with the first diode current threshold when the voltage between two ends of the sensing resistor decreases. The diode Schmitt unit passes the driving signal to the gate of the insulated-gate bipolar transistor so that the insulated-gate bipolar transistor turns on when the voltage between two ends of the sensing resistor is equal to or larger than the first diode current threshold in a case where the voltage between two ends of the sensing resistor decreases. The diode Schmitt unit stops passing the driving signal to the gate of the insulated-gate bipolar transistor so that the insulated-gate bipolar transistor turns off when the voltage between two ends of the sensing resistor is smaller than the first diode current threshold in a case where the voltage between two ends of the sensing resistor decreases. The diode Schmitt unit compares the voltage between two ends of the sensing resistor with the second diode current threshold when the voltage between two ends of the sensing resistor increases. The diode Schmitt unit stops passing the driving signal to the gate of the insulated-gate bipolar transistor so that the insulated-gate bipolar transistor turns off when the voltage between two ends of the sensing resistor is smaller than the second diode current threshold in a case where the voltage between two ends of the sensing resistor increases, and the diode Schmitt unit passes the driving signal to the gate of the insulated-gate bipolar transistor so that the insulated-gate bipolar transistor turns on when the voltage between two ends of the sensing resistor is equal to or larger than the second diode current threshold in a case where the voltage between two ends of the sensing resistor increases.

In the above device, the diode Schmitt unit can prevent a chattering from occurring during implementation of feedback control in the IGBT. Moreover, when an over current has flowed into the IGBT, the IGBT feedback unit ceases driving the IGBT so as to protect the IGBT from being broken.

According to a sixth aspect of the present disclosure, a semiconductor device includes: a semiconductor substrate; a diode-built-in insulated-gate bipolar transistor having an insulated-gate bipolar transistor unit and a diode unit, which are disposed in the substrate, wherein the insulated-gate bipolar transistor unit includes an insulated-gate bipolar transistor and an IGBT current sensing element, wherein the insulated-gate bipolar transistor includes a gate, and is driven with a driving signal input into the gate, wherein the IGBT current sensing element passes current in proportion to current flowing through the insulated-gate bipolar transistor, wherein the diode unit includes a diode element and a diode current sensing element, and wherein the diode current sensing element passes current in proportion to current flowing through the diode element; a first sensing resistor coupled with the IGBT current sensing element; a second sensing resistor coupled with the diode current sensing element; an IGBT Schmitt unit; and a diode Schmitt unit. The driving signal is input from an external unit into the IGBT Schmitt unit. The IGBT Schmitt unit provides a first over current threshold, which defines whether over current passes through the insulated-gate bipolar transistor, and a second over current threshold, which is smaller than the first over current threshold. The IGBT Schmitt unit compares a first voltage between two ends of the first sensing resistor with the first over current threshold when the first voltage increases. The IGBT Schmitt unit passes the driving signal to the gate of the insulated-gate bipolar transistor so that the insulated-gate bipolar transistor turns on when the first voltage is equal to or smaller than the first over current threshold in a case where the first voltage increases. The IGBT Schmitt unit stops passing the driving signal to the gate of the insulated-gate bipolar transistor so that the insulated-gate bipolar transistor turns off when the first voltage is larger than the first over current threshold in a case where the first voltage increases. The IGBT Schmitt unit compares the first voltage with the second over current threshold when the first voltage decreases. The IGBT Schmitt unit stops passing the driving signal to the gate of the insulated-gate bipolar transistor so that the insulated-gate bipolar transistor turns off when the first voltage is larger than the second over current threshold in a case where the first voltage decreases. The IGBT Schmitt unit passes the driving signal to the gate of the insulated-gate bipolar transistor so that the insulated-gate bipolar transistor turns on when the first voltage is equal to or smaller than the second over current threshold in a case where the first voltage decreases. The driving signal is further input from the external unit into the diode Schmitt unit. The diode Schmitt unit provides a first diode current threshold, which defines whether the diode element passes current, and a second diode current threshold, which is larger than the first diode current threshold. The diode Schmitt unit compares a second voltage between two ends of the second sensing resistor with the first diode current threshold when the second voltage decreases. The diode Schmitt unit passes the driving signal to the gate of the insulated-gate bipolar transistor so that the insulated-gate bipolar transistor turns on when the second voltage is equal to or larger than the first diode current threshold in a case where the second voltage decreases. The diode Schmitt unit stops passing the driving signal to the gate of the insulated-gate bipolar transistor so that the insulated-gate bipolar transistor turns off when the second voltage is smaller than the first diode current threshold in a case where the second voltage decreases. The diode Schmitt unit compares the second voltage with the second diode current threshold when the second voltage increases. The diode Schmitt unit stops passing the driving signal to the gate of the insulated-gate bipolar transistor so that the insulated-gate bipolar transistor turns off when the second voltage is smaller than the second diode current threshold in a case where the second voltage increases, and the diode Schmitt unit passes the driving signal to the gate of the insulated-gate bipolar transistor so that the insulated-gate bipolar transistor turns on when the second voltage is equal to or larger than the second diode current threshold in a case where the second voltage increases.

In the above device, an increase in a forward loss in the diode can be prevented, and a chattering by the IGBT can be prevented. Moreover, since a current flowing into the IGBT sensing element and a current flowing into the diode element are sensed by the different sensing resistors, the thresholds can be designed according to the output characteristics of the IGBT sensing element and diode sensing element.

According to a seventh aspect of the present disclosure, a semiconductor device includes: a semiconductor substrate having a first conductivity type, having a first principal surface and a second principal surface, and including a main region and a sensing region, wherein an area of the sensing region on the first principal surface is smaller than the main region; a diode-built-in insulated-gate bipolar transistor having an insulated-gate bipolar transistor and a free wheel diode, which are disposed in the main region of the substrate, wherein the insulated-gate bipolar transistor has a gate electrode, and is driven with a driving signal input into the gate electrode; and a diode current sensing element disposed in the sensing region of the substrate. The free wheel diode includes a FWD anode having a second conductive type and a FWD cathode having the first conductive type. The FWD anode is provided by a first surface portion of the main region in the substrate on the first principal surface, and provides a base of the insulated-gate bipolar transistor. The FWD cathode is disposed in a second surface portion of the main region in the substrate on the second principal surface. The insulated-gate bipolar transistor includes a collector disposed in a third surface portion of the main region in the substrate on the second principal surface, which is different from the second surface portion. The diode current sensing element includes a sensing element anode having the second conductive type. The sensing element anode is disposed in a fourth surface portion of the sensing region in the substrate on the first principal surface, and the diode current sensing element passes current in proportion to current flowing through the free wheel diode.

In the above device, an increase in a forward loss caused by the FWD diode can be effectively suppressed.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

A first embodiment of the present disclosure will be described below with reference to the drawings. A semiconductor device of the present embodiment is used as a power switching device (which may be called an insulated-gate bipolar transistor (IGBT) device with a body diode) to be incorporated in an inverter module for electric and hybrid vehicles (EHVs).

Figure 1:
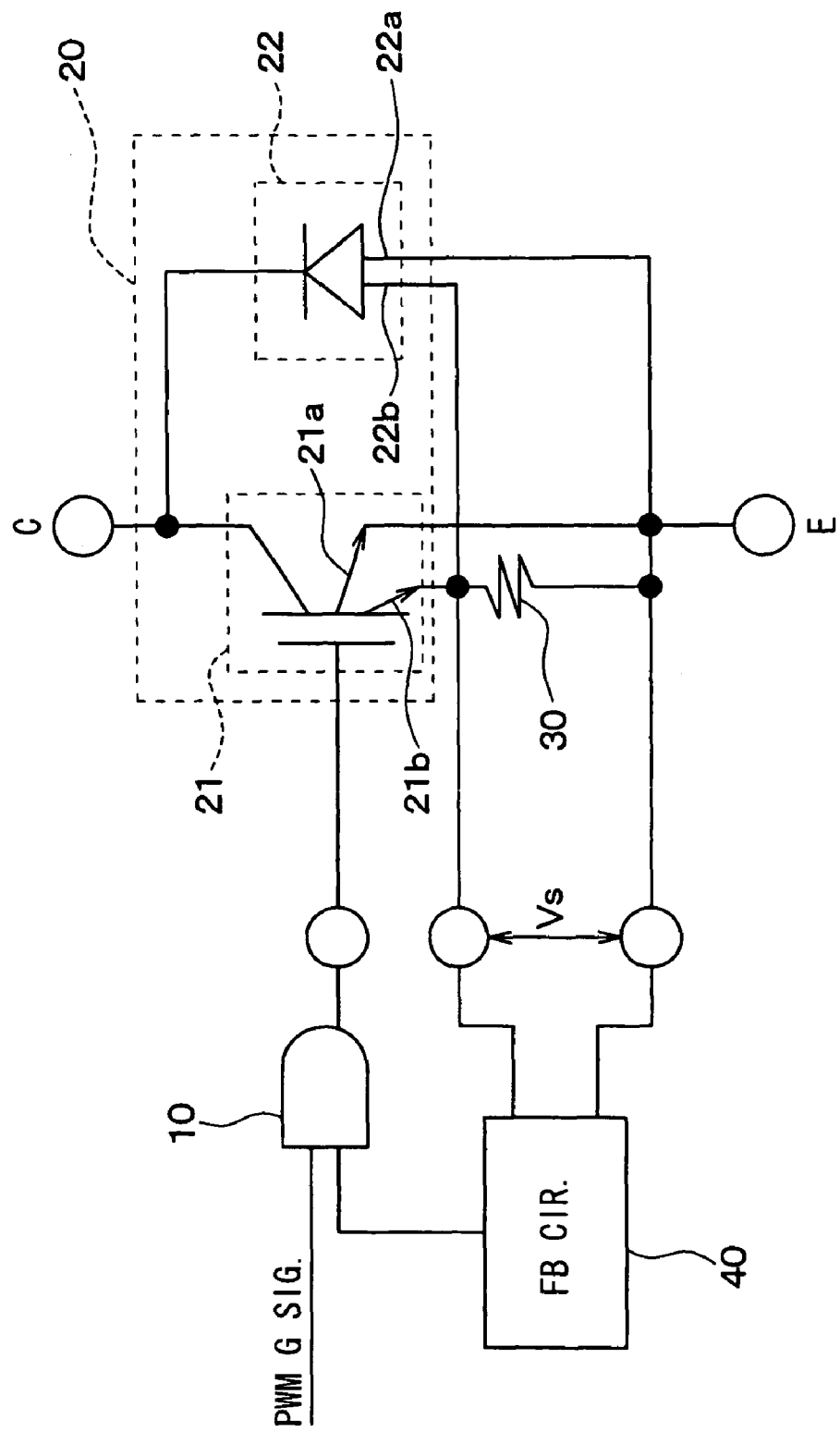
FIG. 1 is a circuit diagram of a semiconductor device in accordance with a first embodiment.

FIG. 1 is a circuit diagram of the semiconductor device in accordance with the present embodiment. As shown in the drawing, the semiconductor device includes an AND circuit 10, an IGBT 20 with a body diode, a sense resistor 30, and a feedback circuit 40.

The AND circuit 10 is a logic circuit that when all inputted signals have a high level, outputs a high-level signal, and is a so-called AND gate. An external pulse-width-modulated (PWM) gate signal with which the IGBT 20 with a body diode is driven, and an output of the feedback circuit 40 are inputted to the AND circuit 10. Incidentally, the PWM gate signal is produced by an external PWM signal generation circuit or the like, and is applied to the input terminal of the AND circuit 10. Moreover, the PWM gate signal is equivalent to a driving signal.

The IGBT 20 with a body diode includes an IGBT part 21 and a diode part 22. The IGBT 20 with a body diode has the IGBT part 21 and diode part 22 formed in the same semiconductor substrate.

The IGBT part 21 includes IGBT elements 21a for main cells that are connected to a load or the like, and IGBT sensing elements 21b for current detection cells that are used to detect a current flowing into the main-cell IGBT elements 21a. The IGBT elements 21a and IGBT sensing elements 21b are formed to have the same structure. A current proportional to a current flowing into the IGBT elements 21a flows into the IGBT sensing elements 21b. The IGBT elements 21a and IGBT sensing elements 21b are formed to have, for example, a trench gate structure, and have the gates thereof formed in common.

Incidentally, as the IGBT elements 21a and IGBT sensing elements 21b, for example, elements each having a trench gate structure that includes a trench, a gate insulating film, and a gate electrode may be adopted. Specifically, p-type base regions that are defined as channel regions are formed in the superficial part of an n-type drift layer, n+-type source regions are formed in the superficial parts of the respective p-type base regions, and trenches are formed to penetrate through the n+-type source regions and p-type base regions so as to reach an n--type drift layers. Further, gate insulating films made of SiO2 and gate electrodes made of a poly silicon are sequentially formed on the internal walls of the respective trenches.

The gate voltages of the main-cell IGBT elements 21a and of the current-detection cell IGBT sensing elements 21b are controlled based on a pulse-width-modulated (PWM) gate signal having passed through the AND circuit 10. Specifically, for example, when the PWM gate signal permitted to pass through the AND circuit 10 is a high-level signal, the IGBT elements 21a can be turned on in order to drive them. When the PWM gate signal is a low-level signal, the IGBT elements 21a can be turned off in order to cease driving them. On the other hand, when the passage of the PWM gate signal through the AND circuit 10 is ceased, the IGBT elements 21a and IGBT sensing elements 21b are not driven.

Moreover, a load or a power supply that is not shown is connected to the collectors of the IGBT elements 21a, and a main current flows between the collectors of the IGBT elements 21a and the emitters thereof. The collectors of the IGBT sensing elements 21b on the current detection cell sides are formed in common with the collectors of the IGBT elements 21a on the main cell sides, and the emitters of the IGBT sensing elements 21a on the current detection cell sides are connected to one of the terminals of the sense resistor 30. The other terminal of the sense resistor 30 is connected to the emitters of the IGBT elements 21a. Consequently, a sense current for current detection that flows from the emitters of the IGBT sensing elements 21b on the current detection cell sides, that is, a current proportional to a current that flows into the main-cell IGBT elements 21a flows into the sense resistor 30, and the potential difference Vs between the terminals of the sense resistor 30 is fed back to the feedback circuit 40.

The diode part 22 is intended to commutate a load current that flows into the IGBT elements 21a, and includes diode elements 22a for main cells that are connected to the IGBT elements 21a, and diode sensing elements 22b for current detection cells that are used to detect a current flowing into the main-cell diode elements 22a. The cathodes of the main-cell diode elements 22a and current-detection cell diode sensing elements 22b are formed in common.

The anodes of the diode elements 22a included in the diode part 22 are connected to the emitters of the IGBT elements 21a, and the anodes of the diode sensing elements 22b are connected to one of the terminals of the sense resistor 30. The cathodes of the diode elements 22a and diode sensing elements 22b are connected to the collectors of the IGBT elements 21a.

Incidentally, as the diode elements 22a and diode sensing elements 22b, for example, elements having numerous trench gate structures, which are identical to those of the IGBT part 21, formed in the superficial part of the semiconductor substrate, and having n+-type regions formed in the back of an n-type silicon substrate may be adopted. In this construction, p-type base regions and n-type drift layers included in the IGBT part 21 can function as a pn diode.

The feedback circuit 40 decides whether a current has flowed into the diode elements 22a or whether an over current has flowed into the IGBT elements 21a. Based on the result of the decision, the feedback circuit 40 permits or ceases passage of the PWM gate signal that is inputted to the AND circuit 10. Therefore, the feedback circuit 40 has a diode current sensing threshold Vth1 that is used to decide whether a current has flowed into the diode elements 22a, and an over current sensing threshold Vth2 that is used to decide whether an over current has flowed into the IGBT elements 21a. In the present embodiment, the diode current sensing threshold Vh1 and over current sensing threshold Vth2 are set to voltage values.

If the IGBT elements 21a are normally driven, that is, if no current flows into the diode elements 22a, a current flows from the IGBT sensing elements 21b to the sense resistor 30. Assuming that the potential at the emitters of the IGBT elements 21a is regarded as a reference, the potential difference Vs between the terminals of the sense resistor 30 has a positive value. In contrast, if a current flows into the diode elements 22a, a current flows from the sense resistor 30 to the diode sensing elements 22b. Assuming that the potential at the emitters of the IGBT elements 21a is regarded as a reference, the potential difference Vs between the terminals of the sense resistor 30 becomes negative. Consequently, the diode current sensing threshold Vth1 is set to a negative value in order to detect whether a current has flowed into the diode elements 22a.

On the other hand, when the IGBT elements 21a are normally driven, the potential difference Vs between the terminals of the sense resistor 30 assumes, as mentioned above, a positive value. However, if over current flows into the IGBT elements 21a, since the value of a sense current flowing from the IGBT sensing elements 21b to the sense resistor 30 increases, the over current sensing threshold Vth2 is set to a positive value.

For driving the IGBT elements 21a, the feedback circuit 40 outputs a signal with which the passage of the PWM gate signal to be inputted to the AND circuit 10 is permitted, and inputs the potential difference Vs between the terminals of the sense resistor 30. If the potential difference Vs is smaller than the diode current sensing threshold Vth1 or is larger than the over current sensing threshold Vth2, the feedback circuit 40 outputs a signal with which the passage of the PWM gate signal to be inputted to the AND circuit 10 is ceased. Moreover, the feedback circuit 40 is formed with a combination of, for example, operational amplifiers or the like. The overall configuration of the semiconductor device in accordance with the present embodiment has been described so far.

Incidentally, the AND circuit 10, sense resistor 30, and feedback circuit 40 are equivalent to a feedback means or a feedback unit.

Figure 2:
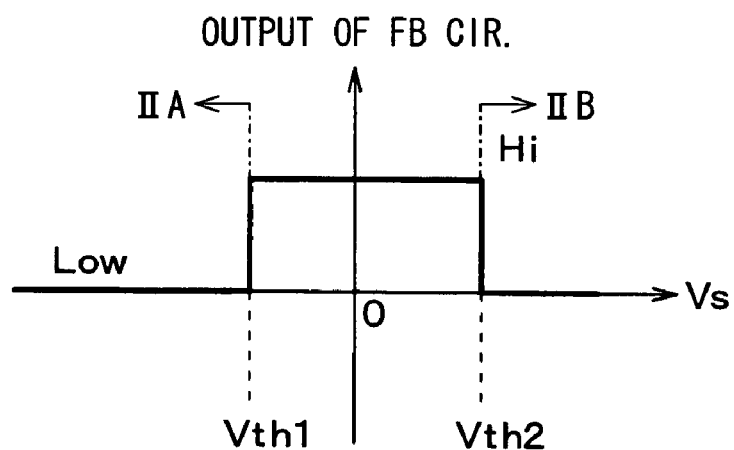
FIG. 2 shows the relationship among the potential difference Vs between the terminals of a sense resistor, a diode current sensing threshold Vth1, an over current sensing threshold Vth2, and an output of a feedback circuit which is established in the first embodiment.

Next, the actions in the semiconductor device will be described with reference to FIG. 2. FIG. 2 shows the relationship among the potential difference Vs between the terminals of the sense resistor 30, the diode current sensing threshold Vth1, the over current sensing threshold Vth2, and the output of the feedback circuit 40. IIA represents a region in which the potential difference Vs equal to or smaller than the diode current sensing threshold Vth1, and shows that diode current is detected so that a passage of a gate signal is ceased. IIB represents a region in which the potential difference Vs equal to or larger than the over current sensing threshold Vth2, and shows that over current is detected so that a passage of a gate signal is ceased. To begin with, the normal actions in the semiconductor device will be described below.

A PWM gate signal is produced as a driving signal, with which the IGBT elements 21a of the semiconductor device are driven, by a PWM signal generation circuit or any other external circuit, and is inputted to the AND circuit 10. On the other hand, the diode elements 22a are left off, and no current flows into the diode sensing elements 22b. Consequently, the potential at one of the terminals of the sense resistor 30 that is connected to the IGBT sensing elements 21b gets higher than the potential at the other terminal thereof connected to the emitters of the IGBT elements 21a. Consequently, the potential difference Vs between the terminals of the sense resistor 30 assumes a positive value with the potential at the emitters of the IGBT elements 21a as a reference.

Consequently, as shown in FIG. 2, the potential difference Vs is larger than the negative diode current sensing threshold Vth1. The feedback circuit 40 decides that no current has flowed into the diode elements 22a. Consequently, the output of the feedback circuit 40 is, as shown in FIG. 2, set to a high level, and inputted to the AND circuit 10. When the high-level PWM gate signal and the output of the feedback circuit 40 are inputted to the AND circuit 10, the PWM gate signal is permitted to pass through the AND circuit 10 and inputted to the IGBT part 21. The IGBT part 21 is therefore turned on. Thus, the IGBT elements 21a are driven, and a current flows into the load that is not shown and is connected to the collectors or emitters of the IBGT elements 21a.

When a current flows into the diode elements 22a, since the potential at the other one of the terminals of the sense resistor 30 which is connected to the emitters of the IGBT elements 21a gets higher than the potential at one of the terminals thereof connected to the emitters of the IGBT elements 21b, the potential difference Vs between the terminals of the sense resistor 30 becomes negative with the potential at the emitters of the IGBT elements 21a as a reference.

Consequently, when the potential difference Vs is smaller than the diode current sensing threshold Vth1, the feedback circuit 40 decides that a current has flowed into the diode elements 22a. The output of the feedback circuit 40 is therefore an output with which the passage of the PWM gate signal to be inputted to the AND circuit is ceased, and is inputted to the AND circuit 10.

Since a signal with which the IGBT part 21 is driven is not inputted from the AND circuit 10, driving the IGBT elements 21a is ceased. In other words, when the diode elements 22a act in a forward direction, the IGBT elements 21a do not act.

As long as the IGBT elements 21a and diode elements 22a are formed in the same semiconductor substrate, such an incident will not occur that when the diode elements 22a act in the forward direction, if the channels of the IBGT elements 21a conduct, the anodes and cathodes of the diode elements 22a are brought to the same potential. The diode elements 22a will therefore not be able to readily act in the forward direction due to the gate potential of the IGBT elements 21a. In other words, the interference between the action of the diode elements 22a and the action of the IGBT elements 21a, or more particularly, the interference between the potential at the diode elements 22a and the gate signal for the IGBT elements 21a can be avoided. Consequently, since an increase in the forward voltage of the diode elements 22a can be avoided, an increase in a loss in the forward voltage of the diode elements 22a can be prevented.

On the other hand, if an over current flows into the IGBT elements 21a, a sense current that flows from the IGBT sensing elements 21b to the sense resistor 30 increases proportionally to the over current. When the IGBT elements 21a normally act, the potential difference Vs gets higher than the potential difference Vs attained when a current flows into the IGBT elements 21a.

Consequently, when the potential difference Vs gets larger than the over current sensing threshold Vth2, the feedback circuit 40 decides that an over current has flowed into the IGBT elements 21a. Eventually, as mentioned above, the passage of the PWM gate signal to be inputted to the AND circuit 10 is ceased with the output of the feedback circuit 40, and driving the IGBT elements 21a is ceased. Thus, the IGBT elements 21a can be protected from being broken with the over current that flows into the IGBT elements 21a.

As mentioned above, in the present embodiment, the diode current sensing threshold Vth1 and over current sensing threshold Vth2 are defined. Therefore, if the potential difference Vs between the terminals of the sense resistor 30 is equal to or larger than the diode current sensing threshold Vth1 and equal to or smaller than the over current sensing threshold Vth2 with the potential at the emitters of the IGBT elements 21a regarded as a reference, the output of the feedback circuit 40 is an output with which the passage of the PWM gate signal to be inputted to the AND circuit 10 is ceased.

As mentioned above, in the present embodiment, a current flowing into the diode elements 22a is sensed by the diode sensing elements 22b and sense resistor 30. In other words, whether a current has flowed into the diode elements 22a is decided by monitoring the potential difference Vs between the terminals of the sense resistor 30 connected to the IGBT sensing elements 21b. Based on the result of the decision, the output of the feedback circuit 40 is used to permit or cease the passage of the PWM gate signal to be inputted to the AND circuit 10.

Consequently, if a current flows into the diode elements 22a, driving the IGBT elements 21a is ceased, that is, the passage of the PWM gate signal to be inputted to the AND circuit 10 is ceased, and the IGBT elements 21a is stopped. Therefore, the action of the IGBT elements 21a and the action of the diode elements 22a can be prevented from being interfered with each other. Consequently, an increase in the forward voltage Vf of the diode elements 22a occurring when the IGBT elements 21a act along with the action of the diode elements 22a can be prevented. Eventually, an increase in a forward loss derived from the increase in the forward voltage Vf of the diode elements 22a can be prevented.

Moreover, the feedback circuit 40 senses a current, which flows into the sense resistor 30, so as to thus decide whether an over current has flowed into the IGBT elements 21a. If the feedback circuit 40 decides that the over current has flowed into the IGBT elements 21a, driving the IGBT elements 21a can be ceased. The IGBT elements 21a can therefore be protected from being broken.

Further, since the semiconductor device is constructed by adopting the AND circuit 10, sense resistor 30, and feedback circuit 40, the element structure of the IGBT 20 with a body diode need not be modified and the chip size need not be increased.

Second Embodiment

In the present embodiment, the temperature of a semiconductor device is detected, and the diode current sensing threshold Vth1 is changed to another on the basis of the detected temperature.

Figure 3:
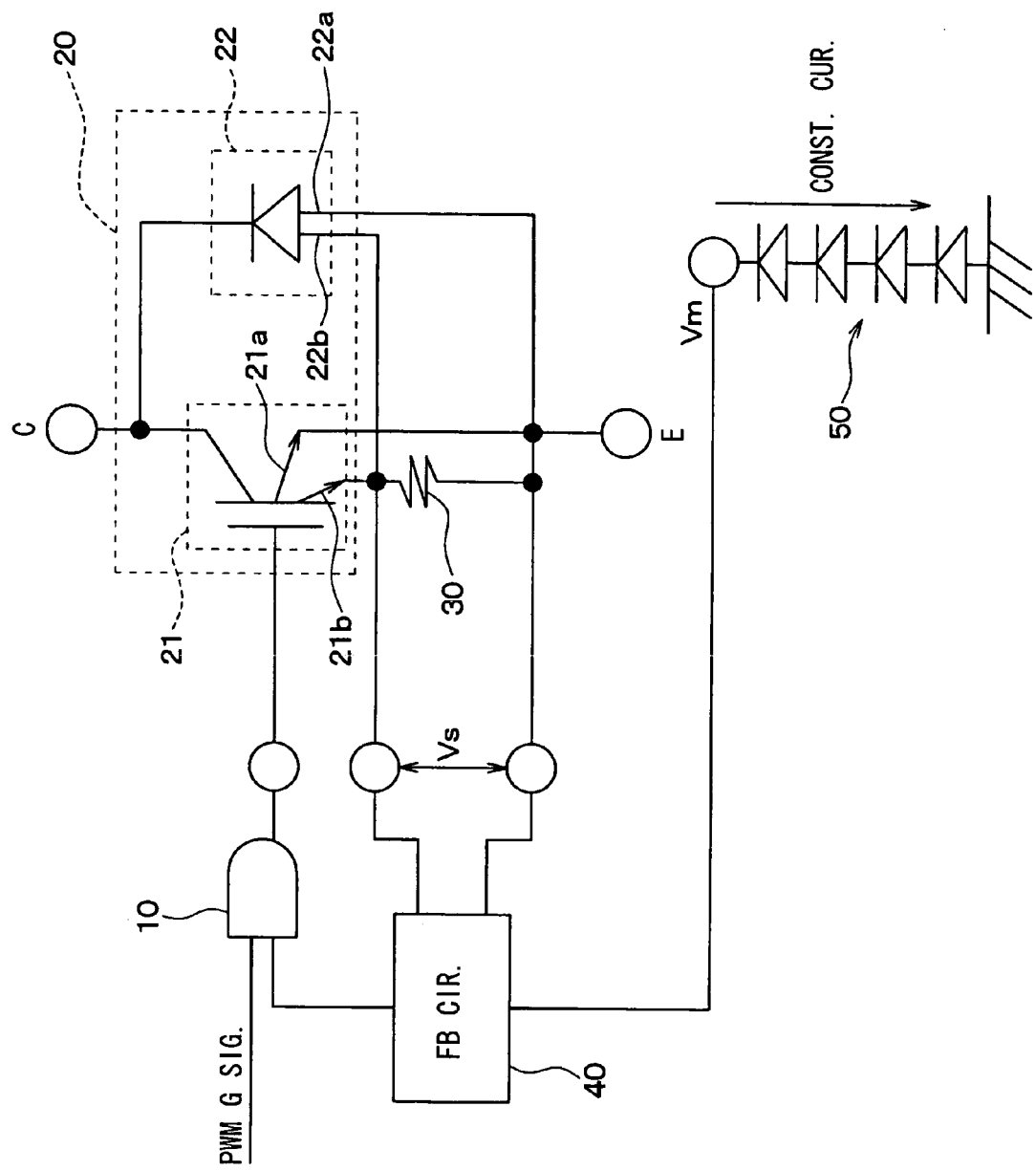
FIG. 3 is a circuit diagram of a semiconductor device in accordance with a second embodiment.

FIG. 3 is a circuit diagram of a semiconductor device in accordance with the present embodiment. As shown in the drawing, the semiconductor device in accordance with the present embodiment has temperature sensitive diode elements 50 added to the construction shown in FIG. 1.

The temperature sensitive diode elements 50 are used to measure the temperature of the semiconductor device, or more particularly, the temperature of the IGBT 20 with a body diode. The temperature sensitive diode elements 50 output temperature-dependent voltages, that is, have the forward voltages thereof varied, and output forward voltages dependent on heat dissipated along with the action of the IGBT 20 with a body diode.

The temperature sensitive diode elements 50 are constructed by, for example, forming polysilicon layers as n-type layers or p-type layers on insulating films formed on a semiconductor substrate. As shown in FIG. 3, the present embodiment adopts a circuit form in which: four temperature sensitive diode elements 50 are connected in series with one another; and a total forward voltage Vm of the temperature sensitive diode elements 50 that is a forward voltage with respect to a ground is inputted to the feedback circuit 40.

A constant current flows from the feedback circuit 40 to the temperature sensitive diode elements 50. As mentioned above, the forward voltage Vm of the temperature sensitive diode elements 50 that varies depending on temperature is inputted to the feedback circuit 40.

Moreover, in the present embodiment, the feedback circuit 40 has two diode current sensing thresholds Vth1 and Vth1'. Hereinafter, the threshold Vth1 shall be called a first diode current sensing threshold, and the threshold Vth1' shall be called a second diode current sensing threshold. The second diode current sensing threshold Vth1' is set to a larger value than the first diode current sensing threshold Vth1 is.

Further, if the feedback circuit 40 decides that the forward voltage Vm outputted from the temperature sensitive diode elements 50 exceeds a temperature threshold indicating the high-temperature state of the IGBT 20 with a body diode, the feedback circuit 40 compares the potential difference Vs between the terminals of the sense resistor 30 with the second diode current sensing threshold Vth1' but does not compare the potential difference Vs with the first diode current sensing threshold Vth1.

Specifically, when the IGBT 20 with a body diode enters the high-temperature state, the feedback circuit 40 makes it easier to decide whether a current has flowed into the diode elements 22a irrespective of however microscopic the current flowing into the diode elements 22a is. Consequently, even when the microscopic current flows into the diode elements 22a, the feedback circuit 40 ceases driving the IGBT elements 21a so as to suppress heat dissipation from the IGBT 20 with a body diode.

Figure 4:
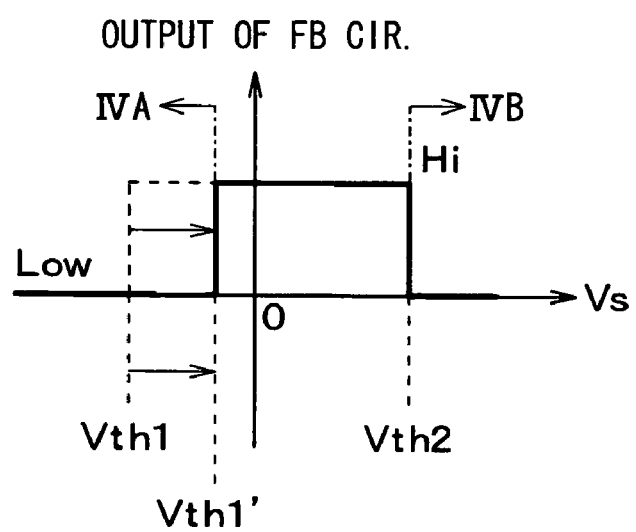
FIG. 4 shows the relationship among the potential difference Vs between the terminals of a sense resistor, a first diode current sensing threshold Vth1, a second diode current sensing threshold Vth1', an over current sensing threshold Vth2, and an output of a feedback circuit which is established in the second embodiment.

Next, referring to FIG. 4, the actions in the semiconductor device to be performed when the IGBT 20 with a body diode enters the high-temperature state will be described below. FIG. 4 shows the relationship among the potential difference Vs between the terminals of the sense resistor 30, the first diode current sensing threshold Vth1, the second diode current sensing threshold Vth1', the over current sensing threshold Vth2, and the output of the feedback circuit 40. IVA represents a region in which the potential difference Vs equal to or smaller than the diode current sensing threshold Vth1', and shows that diode current is detected so that a passage of a gate signal is ceased. IVB represents a region in which the potential difference Vs equal to or larger than the over current sensing threshold Vth2, and shows that over current is detected so that a passage of a gate signal is ceased.

Similarly to the first embodiment, when both the PWM gate signal and the output of the feedback circuit 40 are inputted to the AND circuit 10, the passage of the PWM gate signal to be inputted to the AND circuit 10 is permitted, and the IGBT elements 21a are driven. In this case, the forward voltage Vm dependent on the temperature of the IGBT 20 with a body diode is detected by the temperature sensitive diode elements 50, and is inputted to the feedback circuit 40.

If the feedback circuit 40 decides that the forward voltage Vm inputted from the temperature sensitive diode elements 50 exceeds a temperature threshold, the first diode current sensing threshold Vth1 is, as shown in FIG. 4, changed to the second diode current sensing threshold Vth1'.

Consequently, although the sense current flowing into the sense resistor 30 is smaller than that detected when the potential difference Vs is compared with the first diode current sensing threshold Vth1, the flow of the current into the diode elements 22a can be decided.

When the potential difference Vs between the terminals of the sense resistor 30 gets smaller than the second diode current sensing threshold Vth1', the feedback circuit 40 decides that a current has flowed into the diode elements 22a. Driving the IGBT elements 21a is, similarly to that in the first embodiment, ceased.

As mentioned above, when the temperature of the IGBT 20 with a body diode gets high, a criterion for deciding whether a current has flowed into the diode elements 22a is changed from one to another. This makes it easier to decide whether a current has flowed into the diode elements 22a. Consequently, even when a current flowing into the diode elements 22a has a small current value, the interference of the gate signal for the IGBT elements 21a with the potential at the diode elements 22a can be prevented. Further, since driving the IGBT elements 21a is ceased, heat dissipation of the IGBT 20 with a body diode can be suppressed.

Third Embodiment

In the second embodiment, the components are constructed as independent parts. In the present embodiment, the components of the second embodiment are integrated into one chip.

Figure 5A:
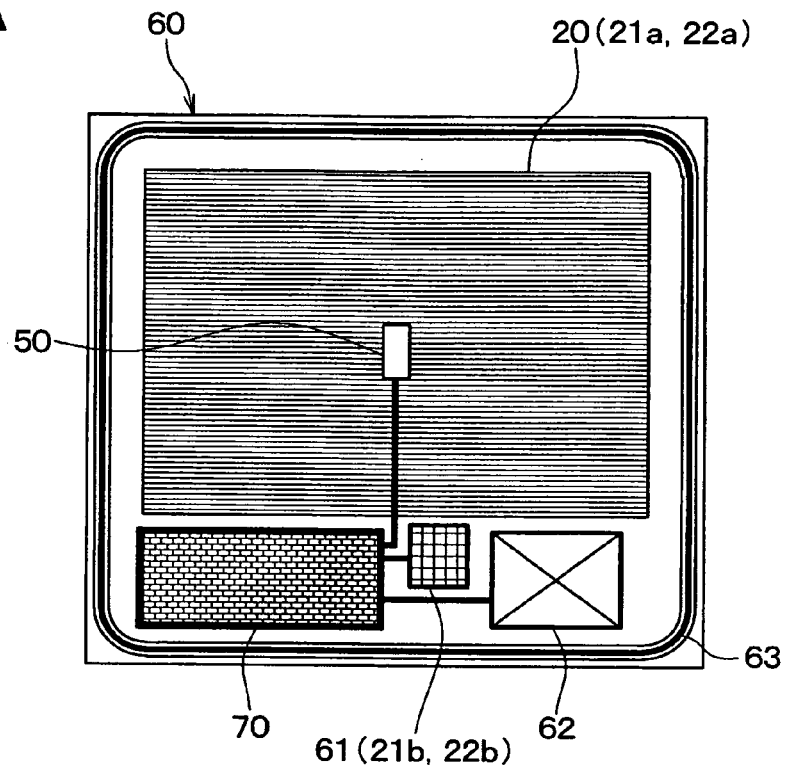
FIG. 5A is an overall illustrative diagram of a semiconductor chip in accordance with a third embodiment.
Figure 5B:
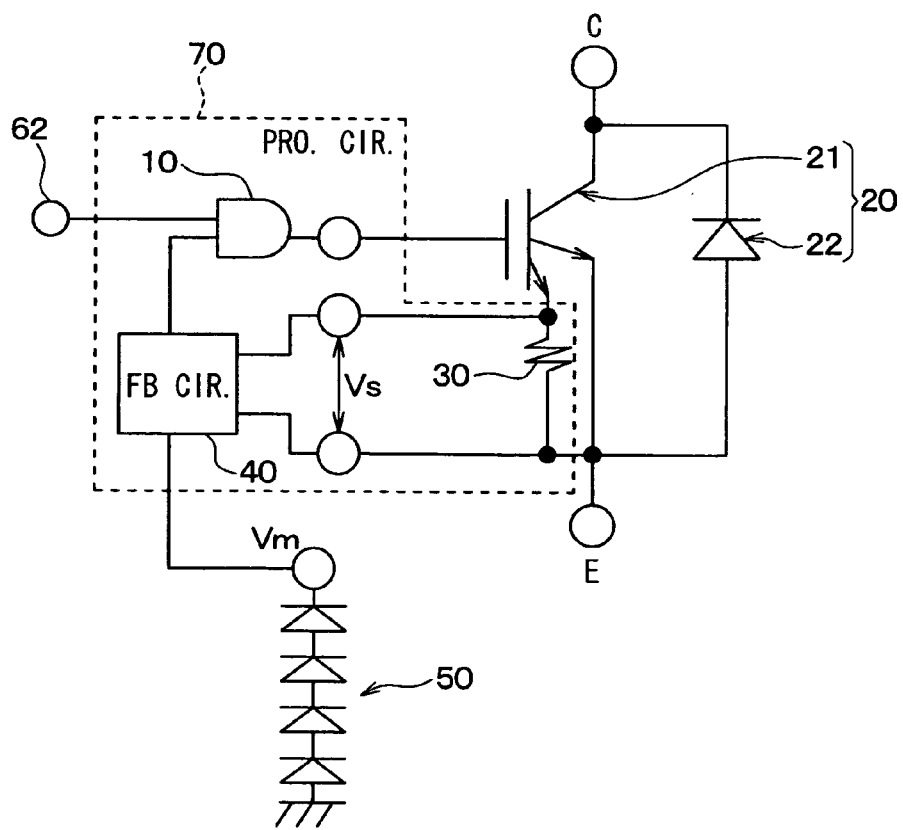
FIG. 5B is a circuit diagram of a semiconductor device stored in the semiconductor chip shown in FIG. 5A.

FIG. 5A is an overall illustrative diagram of a semiconductor chip 60 in accordance with the present embodiment. FIG. 5B is a circuit diagram of a circuit included in the semiconductor chip 60 and is identical to the circuit diagram of FIG. 3. As shown in FIG. 5A, the semiconductor chip 60 includes an IGBT 20 with a body diode, temperature sensitive diode elements 50, a processing circuit unit 70, current sensing elements 61, a gate pad 62, and a guard ring 63.

The processing circuit unit 70 shown in FIG. 5A includes a feedback circuit 40, an AND circuit 10, and a sense resistor 30 which are shown in FIG. 5B. The feedback circuit 40 is formed with, for example, a thin-film transistor circuit.

Moreover, the current sensing elements 61 sense currents that flow into IGBT elements 21a and diode elements 22a respectively, and includes diode sensing elements 22b and IGBT sensing elements 21b. In the present embodiment, the diode sensing elements 22b are not included in the IGBT 20 with a body diode, and the current sensing elements 61 detects a current flowing into the diode elements 21a. In the present embodiment, the current sensing elements 61 sense both the currents that flow into the IGBT elements 21a and diode elements 22a respectively. When the current sensing elements 61 are said to sense both the currents, it means that the current sensing elements 61 can detect both the current flowing into the diode elements 22a and the current flowing into the IGBT elements 21a.

The temperature sensitive diode elements 50 are disposed, for example, in the center of the semiconductor chip 60. Since the temperature of the center of the semiconductor chip 60 becomes highest because heat dissipated when the semiconductor chip 60 is put into action is concentrated on the center of the semiconductor chip 60, the temperature sensitive diode elements 50 are disposed in the center of the semiconductor chip 60.

The gate pad 62 is an electrode which is connected to the input terminal of the AND circuit 10 and to which a PWM gate signal is externally applied.

The guard ring 63 surrounding the IGBT 20 with a body diode, temperature sensitive diode elements 50, processing circuit unit 70, current sensing elements 61, and gate pad 62 is disposed on the perimeter of the semiconductor chip 60. The guard ring 63 fills the role of ensuring the dielectric strength of the semiconductor chip 60.

As mentioned above, when the semiconductor device is incorporated in the semiconductor chip 60, a general-purpose circuit can be adopted as a PWM control circuit that is used to drive the IGBT part 21.

Fourth Embodiment

Figure 6A:
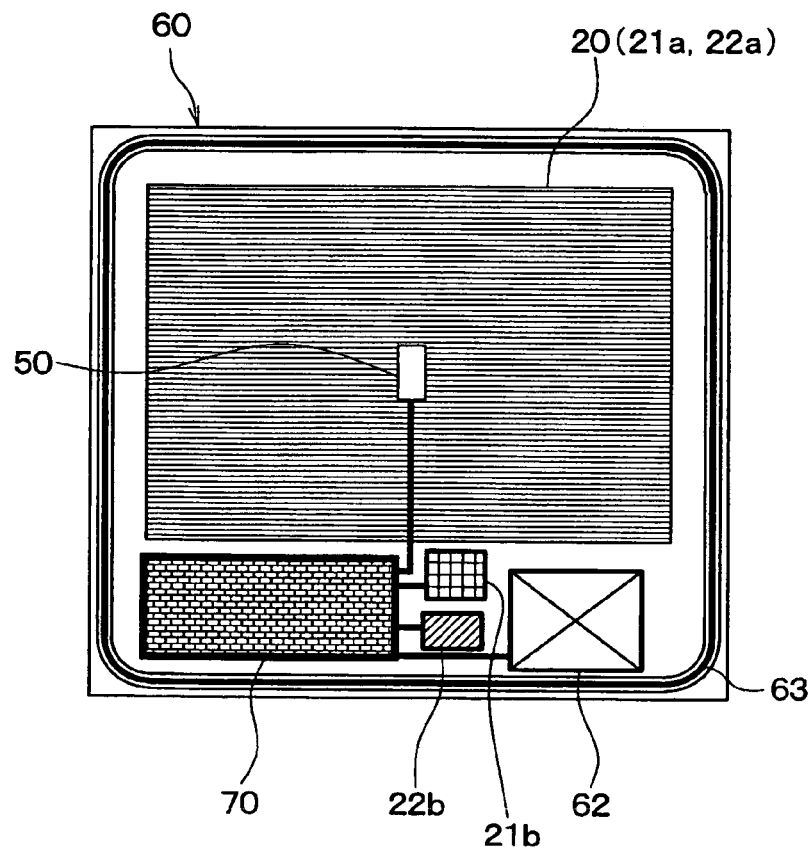
FIG. 6A is an overall illustrative diagram of a semiconductor chip in accordance with a fourth embodiment.
Figure 6B:
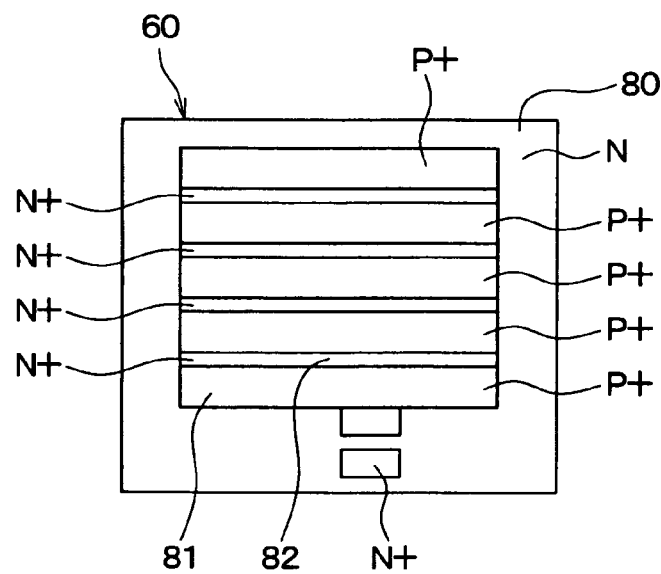
FIG. 6B shows the structure of the back of the semiconductor chip shown in FIG. 6A.

FIG. 6A is an overall illustrative diagram of a semiconductor chip 60 in accordance with the present embodiment. FIG. 6B shows the structure of the back of the semiconductor chip 60 shown in FIG. 6A. The semiconductor chip 60 shown in FIG. 6A includes, similarly to that of the third embodiment, a semiconductor device shown in the circuit diagram of FIG. 5B.

As shown in FIG. 6A, in the present embodiment, unlike the third embodiment, the diode sensing elements 22b and IGBT sensing elements 21b are incorporated in the semiconductor chip 60 independently of each other.

As shown in FIG. 6B, the semiconductor chip 60 is formed in an n-type substrate 80. In the back of the semiconductor chip 60, p+-type regions 81 realizing the IGBT part 21 and n+-type region 82 realizing the diode part 22 are alternately repeatedly disposed.

Normally, since only the p+-type regions 81 are formed in the back of a chip in the IGBT sensing elements 21b, a current flows into the IGBT sensing elements 21b but a current hardly flows into the diode sensing elements 22b. However, in the present embodiment, since the n+-type region 82s are disposed together with the p+-type regions 81 (both-side alignment), the output of the diode sensing elements 22b can be increased. Eventually, the current detecting sensitivity can be intensified.

Fifth Embodiment

In the first to fourth embodiments, the IGBT 20 with a body diode is adopted as a switching device. In the present embodiment, a double-diffused metal-oxide FET semiconductor (DMOS) is adopted.

Specifically, sensing elements incorporated in the DMOS are used to sense the polarity of a current flowing into diode elements so that a diode action will be realized with a DMOS action. During a time during which the diode elements act in a forward direction, a gate signal for DMOS elements is brought to an on-state voltage level so that a current oriented in the same direction as the direction of a current flowing into the diode elements will flow into the DMOS elements. Thus, a current is prevented from flowing into the diode elements in which a forward voltage is developed. Eventually, an increase in a dc loss in the diode elements is prevented.

Figure 7:
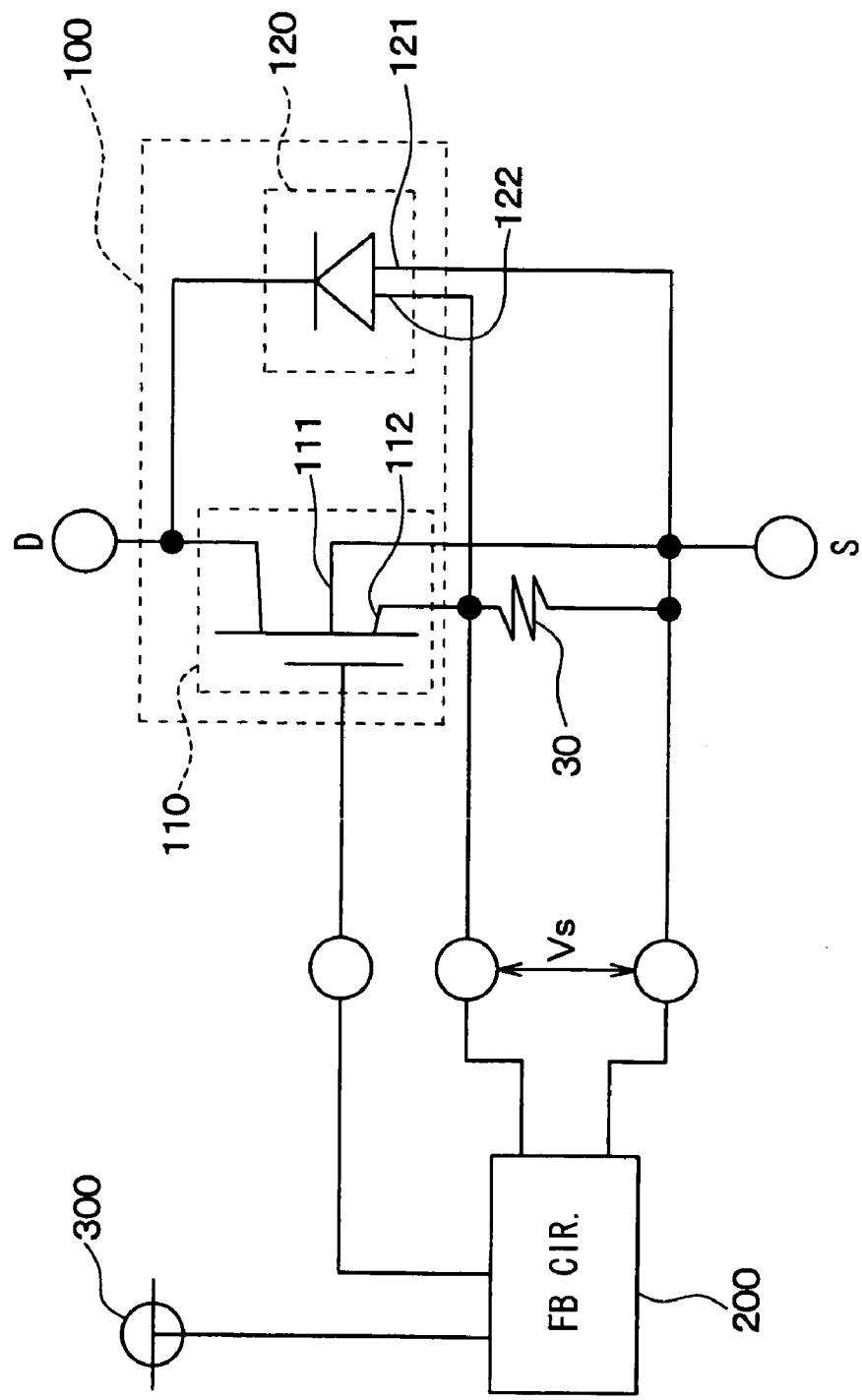
FIG. 7 is a circuit diagram of a semiconductor device in accordance with a fifth embodiment.

FIG. 7 is a circuit diagram of a semiconductor device in accordance with the present embodiment. As shown in the drawing, the semiconductor device includes a DMOS 100 with a body diode, a sense resistor 30, and a feedback circuit 200. Connection forms of the DMOS 100 with a body diode and the sense resistor 30 are identical to those shown in FIG. 1.

The DMOS 100 with a body diode includes a DMOS part 110 and a diode part 120. The DMOS 100 with a body diode has the DMOS part 110 and diode part 120 formed in the same semiconductor substrate.

The DMOS part 110 includes DMOS elements 111 for main cells that are connected to a load or the like, and DMOS sensing elements 112 for current detection cells that are used to detect a current flowing into the main-cell DMOS elements 111. The DMOS elements 111 and DMOS sensing elements 112 are formed to have the same structure. The current proportional to the current flowing into the DMOS elements 111 flows into the DMOS sensing elements 112. The gate voltages in the main-cell DMOS elements 111 and current-detection cell DMOS sensing elements 112 are controlled by the feedback circuit 200.

The diode part 120 includes diode elements 121 for main cells that are connected to the DMOS elements 111, and diode sensing elements 122 for current detection cells that are used to detect a current flowing into the main-cell diode elements 121.

The feedback circuit 200 inputs the potential difference Vs that occurs between the terminals of the sense resistor 30 when a current flows into the main-cell DMOS elements 111, decides based on the potential difference Vs whether a current has flowed into the diode elements 121, and controls driving of the DMOS elements 111 on the basis of the result of the decision. Therefore, the feedback circuit 200 has a diode current sensing threshold Vth1 to be used to decide whether a current has flowed into the diode elements 121. The diode current sensing threshold Vth1 is set to, for example, a voltage value. Similarly to the first embodiment, the diode current sensing threshold Vth1 is set to a negative value in order to detect whether a current has flowed into the diode elements 121. Incidentally, the feedback circuit 200 is put into action when applied a voltage from a power supply 300.

Figure 8:
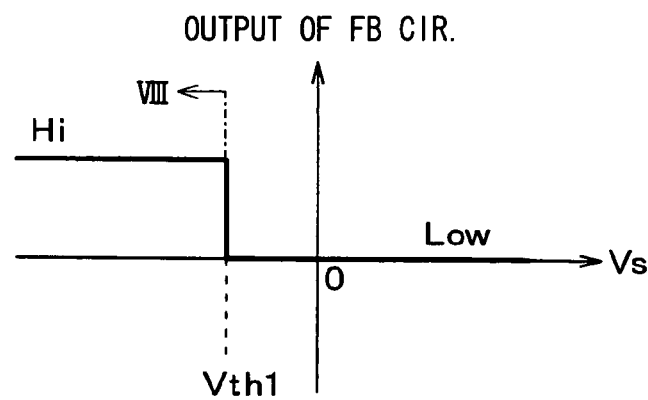
FIG. 8 shows the relationship among the potential difference Vs between the terminals of a sense resistor, a diode current sensing threshold Vth1, and an output of a feedback circuit which is established in the fifth embodiment.

Next, the actions in the semiconductor device will be described with reference to FIG. 8. FIG. 8 shows the relationship among the potential difference Vs between the terminals of the sense resistor 30, the diode current sensing threshold Vth1, and the output of the feedback circuit 200. VIII represents a region in which the potential difference Vs equal to or smaller than the diode current sensing threshold Vth1, and shows that diode current is detected so that a passage of a gate signal is permitted.

To begin with, at the timing at which the diode elements 121 act in a synchronous rectification mode, current flows in a forward direction into the diode elements 121, that is, from the anodes of the diode elements 121 to the cathodes thereof. Accordingly, a current also flows into the diode sensing elements 122. A potential difference therefore occurs in the sense resistor 30 connected to the diode sensing elements 122.

Specifically, when a forward current flows into the diode elements 121, the potential at the other terminal of the sense resistor 30 which is connected to the sources of the DMOS elements 111 gets higher than the potential at one terminal thereof connected to the sources of the DMOS sensing elements 112. The potential difference Vs between the terminals of the sense resistor 30 therefore has a negative value with the potential at the sources of the DMOS elements 111 regarded as a reference. The negative potential difference Vs is inputted to the feedback circuit 200, and compared with the negative diode current sensing threshold Vth1. If the potential difference Vs has a larger negative value than the diode current sensing threshold Vth1 does, the feedback circuit 200 produces a gate signal (high level) with which the DMOS elements 111 are turned on, and the DMOS elements 111 are then turned on.

When a current flows into the diode elements 121, a forward voltage Vf is required. This causes a dc loss to occur in a circuit in which the semiconductor device is incorporated. However, when the DMOS elements 111 are turned on, the DMOS elements 111 function as wiring (resistive elements). Therefore, a current flows from the sources of the DMOS elements 111 to the drains thereof but no current flows into the diode elements 121. In other words, the feedback circuit 200 turns on the DMOS elements 111 so that a current oriented in the same direction as the direction in which the forward current of the diode elements 121 flows will flow into the DMOS elements 111. Thus, the current that has flowed in a forward direction into the diode elements 121 flows into the DMOS elements 111. Consequently, an increase in a loss in the forward voltage Vf needed to cause the forward current to flow into the diode elements 121 is prevented.

On the other hand, an operation of rectification is exerted in the diode elements 121. At the timing at which a current oriented in an opposite direction flows into the diode elements 121, the potential at one of the terminals of the sense resistor 30 which is connected to the DMOS sensing elements 112 gets higher than the potential at the other terminal thereof connected to the sources of the DMOS elements 111. The potential difference Vs between the terminals of the sense resistor 30 has a positive value with the potential at the sources of the DMOS elements 111 regarded as a reference. If the feedback circuit 200 decides that the value of the positive potential difference Vs is larger than the value of the negative diode current sensing threshold Vth1, a gate signal (low level) with which the DMOS elements 111 are turned off is, as shown in FIG. 8, produced. The DMOS elements 111 are turned off by the feedback circuit 200. Thus, when the operation of rectification is exerted in the diode elements 121, the DMOS elements 111 are turned off.

As mentioned above, according to the present embodiment, in the semiconductor device employing the DMOS 100 with a body diode, when a forward current flows into the diode elements 121, the DMOS elements 111 are turned on so that a current will flow into the DMOS elements 111. Consequently, when the forward current flows into the diode elements 121, a loss in the forward voltage Vf developed in the diode elements 121 will not occur. A low-loss switching action can be achieved.

Sixth Embodiment

In the present embodiment, the circuit shown in FIG. 7 and presented as the fifth embodiment detects the temperature of a semiconductor device. Similarly to that in the second embodiment, the diode current sensing threshold Vth1 is changed to another on the basis of the detected temperature.

Figure 9:
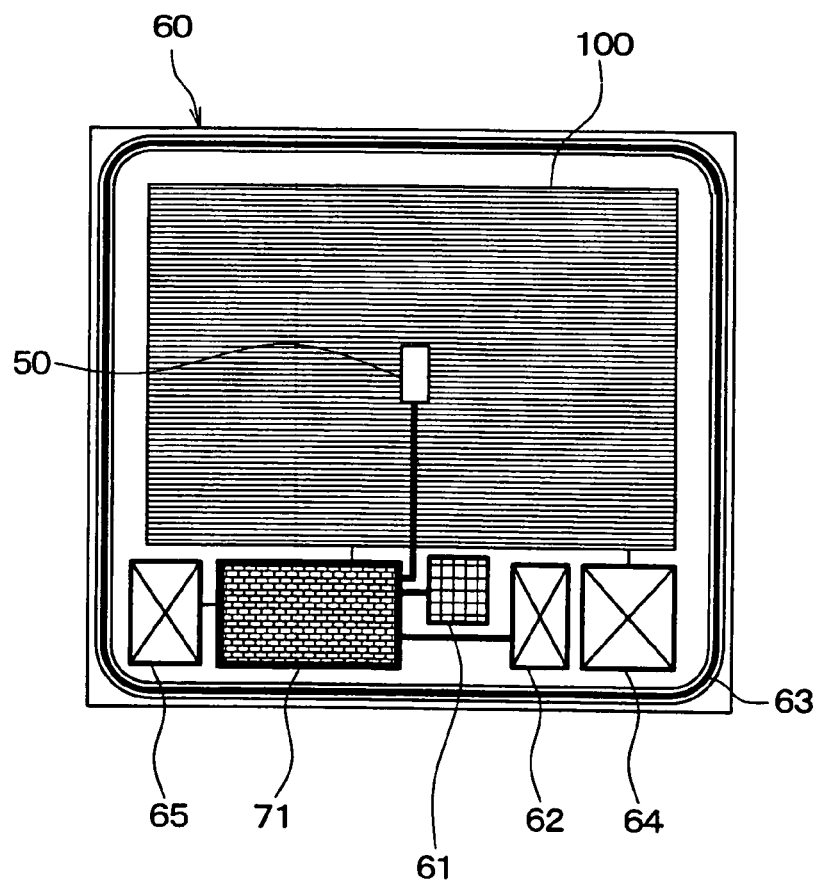
FIG. 9 is a plan view of a semiconductor chip in accordance with a sixth embodiment.

FIG. 9 is a plan view of a semiconductor chip 60 of the present embodiment. As shown in FIG. 9, the semiconductor chip 60 includes a DMOS 100 with a body diode, temperature sensitive diode elements 50, a processing circuit unit 71, current sensing elements 61, a gate pad 62, a guard ring 63, a source pad 64, and a power supply pad 65.

Figure 10:
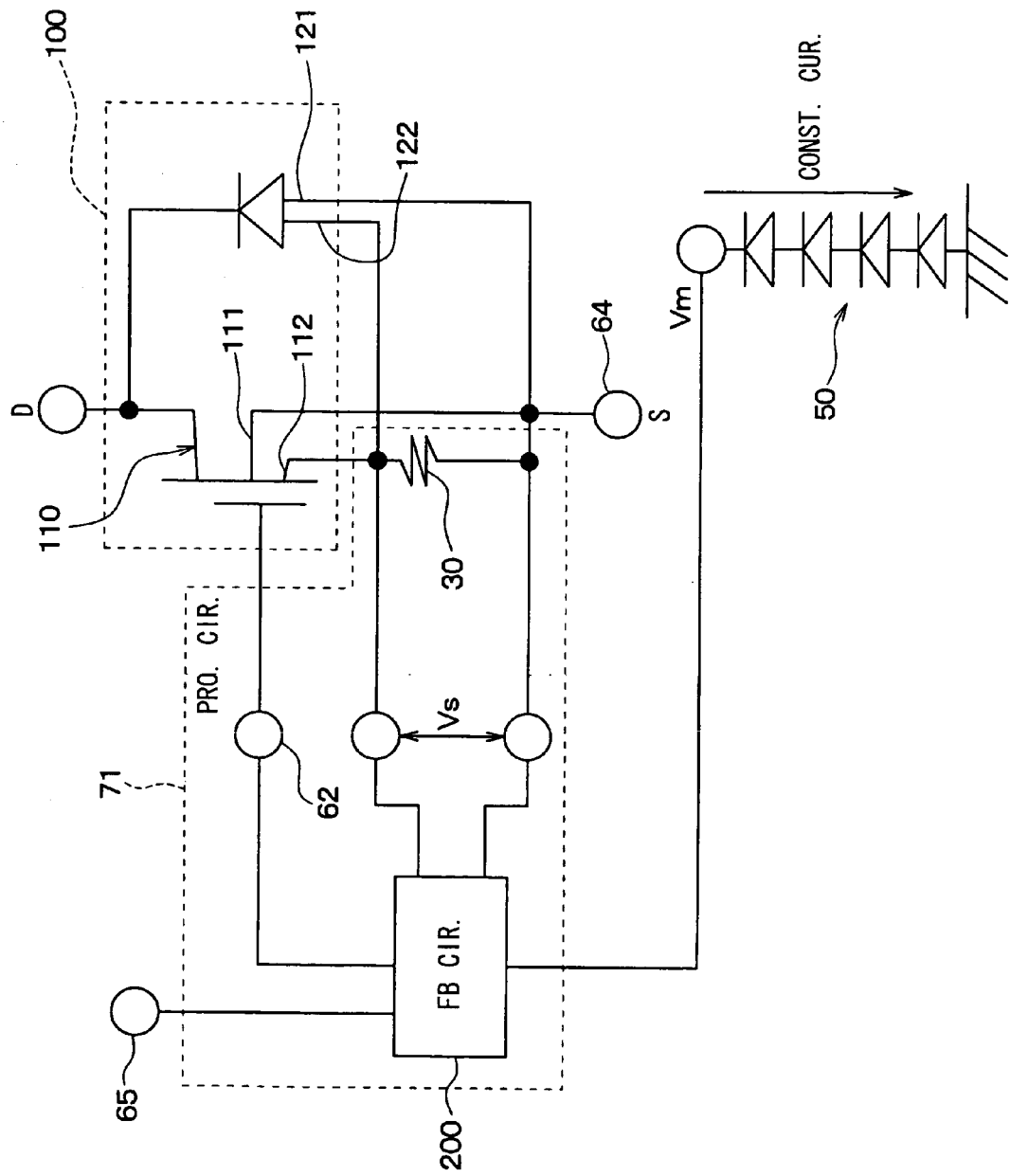
FIG. 10 is a circuit diagram of a semiconductor device in accordance with the sixth embodiment.

The source pad 64 is an electrode connected to a load. The power supply pad 65 is an electrode for use in applying a voltage from a power supply to a feedback circuit 200. Assuming that the surface of the semiconductor chip 60 shown in FIG. 9 is the face thereof, a drain pad is disposed on the back of the semiconductor chip 60. FIG. 10 shows an equivalent circuit of the construction.

In FIG. 10, the processing circuit unit 71 includes the feedback circuit 200 and a sense resistor 30. Moreover, the temperature sensitive diode elements 50 shown in FIG. 3 are connected to the feedback circuit 200. A constant current flows from the feedback circuit 200 to the temperature sensitive diode elements 50. As mentioned previously, the forward voltage Vm of the temperature sensitive diode elements 50 that varies depending on temperature is inputted to the feedback circuit 200.

The feedback circuit 200 has, similarly to that of the second embodiment, a first diode current sensing threshold Vth1 and a second diode current sensing threshold Vth1' larger than the first diode current sensing threshold Vth1. If the feedback circuit 200 decides that the forward voltage vm inputted from the temperature sensitive diode elements 50 exceeds a temperature threshold indicating the high-temperature state of the DMOS 100 with a body diode, the feedback circuit 200 compares the potential difference Vs between the terminals of the sense resistor 30 with the second diode current sensing threshold Vth1' but does not compare the potential difference Vs with the first diode current sensing threshold Vth1.

Figure 11:
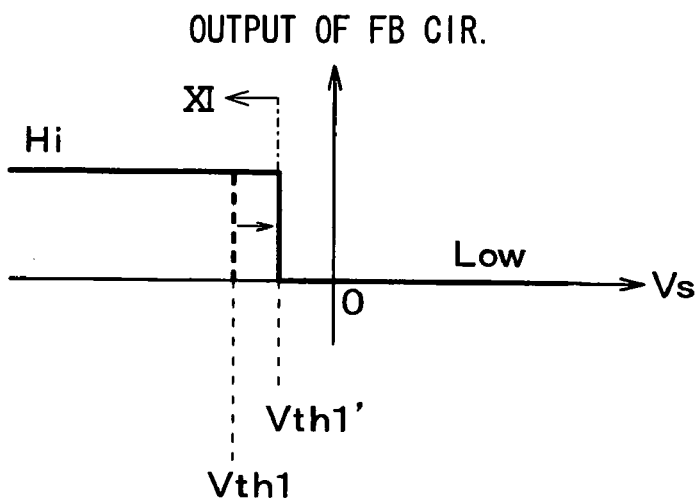
FIG. 11 shows the relationship among the potential difference Vs between the terminals of a sense resistor, a first diode current sensing threshold Vth1, a second diode current sensing threshold Vth1', and an output of a feedback circuit which is established in the sixth embodiment.

Specifically, as shown in FIG. 11, when the DMOS 100 with a body diode enters the high-temperature state, the feedback circuit 200 makes it easy to decide whether a current has flowed into the diode elements 121 irrespective of however microscopic the current flowing into the diode elements 121 is. Consequently, even when the microscopic current flows into the diode elements 121, the feedback circuit 200 drives the DMOS elements 121a so as to disable a forward current from flowing into the diode elements 121. XI represents a region in which the potential difference Vs equal to or smaller than the diode current sensing threshold Vth1', and shows that diode current is detected so that a passage of a gate signal is permitted.

As mentioned above, when the semiconductor device operates at the high temperature at which a loss in the diode elements 121 causes a trouble, the feedback circuit 200 lowers the threshold for use in sensing a diode current. Thus, an increase in a dc loss in even a small current flowing into the diode elements 121 is prevented, and heat dissipation from the diode elements 121 can be suppressed.

Seventh Embodiment

In the present embodiment, the noise resistivity is improved in order to cope with a case where the potential difference Vs fluctuates due to noise.

Consequently, the feedback circuit 200 has a diode current sensing threshold Vth1" larger than the diode current sensing threshold Vth1. Herein, the diode current sensing threshold Vth1 shall be called a first diode current sensing threshold, and the diode current sensing threshold Vth1" shall be called a third diode current sensing threshold.

Figure 12:
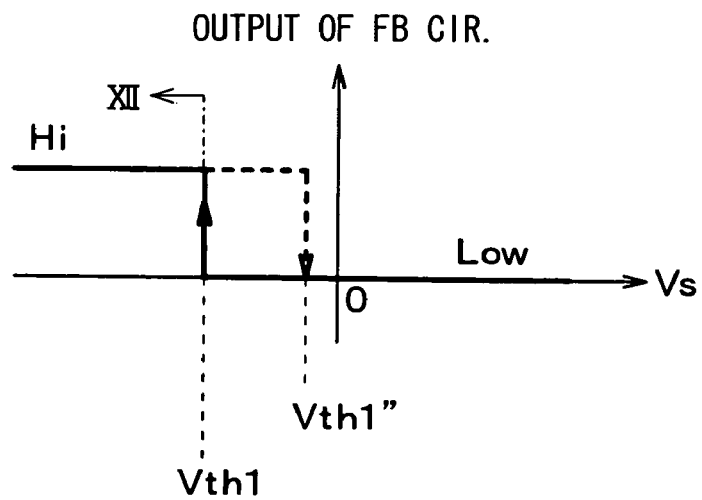
FIG. 12 shows the relationship among the potential difference Vs between the terminals of a sense resistor, a first diode current sensing threshold Vth1, a third diode current sensing threshold Vth1", and an output of a feedback circuit which is established in a seventh embodiment.

As shown in FIG. 12, when the value of the potential difference Vs changes to a negative side, the feedback circuit 200 uses the first diode current sensing threshold Vth1 to decide whether the DMOS elements 111 should be driven. On the other hand, when the value of the potential difference Vs changes to a positive side, the feedback circuit 200 uses the third diode current sensing threshold Vth1" to decide whether the DMOS elements 111 should be driven. Thus, the feedback circuit 200 acts like a Schmitt circuit. XII represents a region in which the potential difference Vs equal to or smaller than the diode current sensing threshold Vth1, and shows that diode current is detected so that a passage of a gate signal is permitted.

Consequently, even when the potential difference Vs fluctuates due to noise, since the first diode current sensing threshold Vth1 and third diode current sensing threshold Vth1" have a noise margin between them, such an incident will not take place that the on and off states of the DMOS elements 111 are switched due to the noise. A semiconductor device highly resistant to noise can be realized.

Eighth Embodiment

In the fifth to seventh embodiments, the semiconductor device itself diagnoses a current flowing into the diode elements 121 so as to turn on or off the DMOS elements 111 for the purpose of minimizing a dc loss in the diode elements 121. The DMOS with a body diode functions as a diode in relation to an external circuit. In the present embodiment, the DMOS elements 111 function as switching elements.

Figure 13:
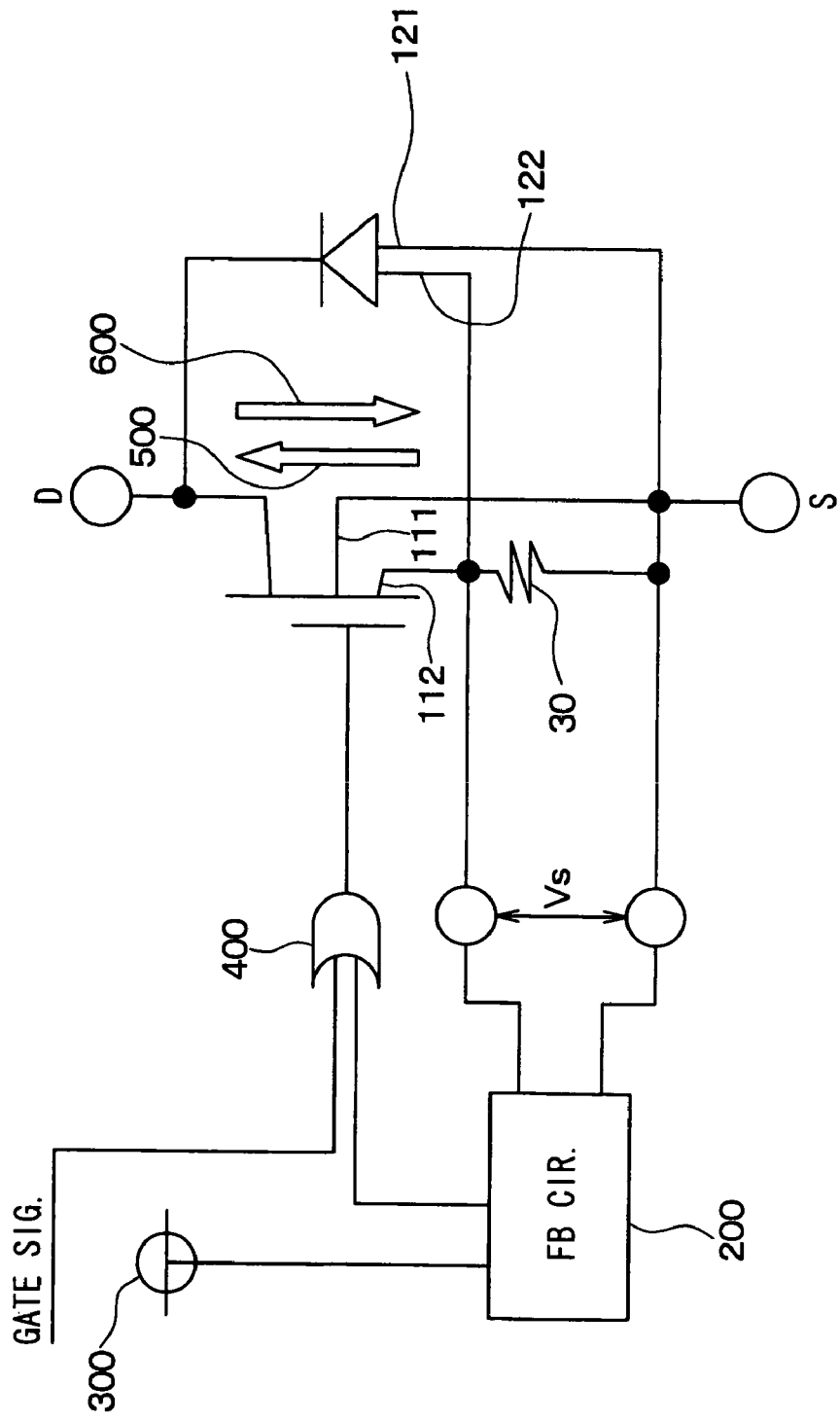
FIG. 13 is a circuit diagram of a semiconductor device in accordance with an eighth embodiment.

FIG. 13 is a circuit diagram of a semiconductor device in accordance with the present embodiment. As shown in the drawing, the output of the feedback circuit 200 is inputted to an OR circuit 400. Moreover, a switching signal with which the DMOS elements 111 are turned on or off is inputted from an external control circuit to the OR circuit 400.

Consequently, when a current flows into the diode elements 121, the feedback circuit 200 inputs a driving signal, with which the DMOS elements 111 are turned on, to the OR circuit 400. Accordingly, the DMOS elements 111 are turned on. As described in relation to the fifth embodiment, a current flows, as indicated with an arrow 500 in FIG. 3, from the sources of the DMOS elements 111 to the drains thereof. A loss in the forward voltage Vf of the diode elements 121 is minimized.

On the other hand, when the feedback circuit 200 does not sense that a current has flowed into the diode elements 121, if the DMOS elements 111 are allowed to function as switching elements, the external control circuit inputs the switching signal, with which the DMOS elements 111 are turned on, to the OR circuit 400. The OR circuit 400 then turns on the DMOS elements 111. Consequently, a current flows, as indicated with an arrow 600 in FIG. 13, from the drains of the DMOS elements 111 to the sources thereof. The DMOS elements 111 therefore function as the switching elements.

As mentioned above, the DMOS elements 111 included in the semiconductor device can be not only used to minimize a dc loss in the diode elements 121 but also used as switching elements. The OR circuit 400 is equivalent to a driving means or a driving unit.

Other Embodiments

The embodiments have been described on the assumption that the IGBT part 21 is controlled according to a pulse-width modulation (PWM) control method. The PWM control is merely one form of controls. For example, the IGBT elements 21a may be driven in a full-on mode. The same applies to driving of the DMOS elements 111 included in the eighth embodiment.

In the first to fourth embodiments, the feedback circuit 40 decides both a current flowing into the diode elements 22a and an over current flowing into the IGBT elements 21a. A semiconductor device may be designed so that the feedback circuit 40 will decide only the current flowing into the diode part 22. In this case, the IGBT sensing elements 21b need not be included in the IGBT part 21. The semiconductor device may include as the IGBT 20 with a body diode the IGBT elements 21a and the diode part 22. Hall-effect elements may be adopted as elements that detect current components flowing into the respective diode elements 21a. As for the adoption of the Hall-effect elements, the same applies to the fifth to eighth embodiments.

Incidentally, the circuitry in which the diode sensing elements 22b are not employed but a current that flows into the diode elements 22a is directly detected may be adopted. In this case, a semiconductor device should merely include the IGBT 20 with a body diode, and a means (or a unit) that detects a current flowing into the diode elements 22a, that if no current flows into the diode elements 22a, permits the passage of an externally inputted pulse-width-modulated (PWM) gate signal, and that if a current flows into the diode elements 22a, ceases the passage of the PWM gate signal (for example, the AND circuit 10, sense resistor 30, and feedback circuit 40). In this case, the circuitry including the sense resistor 30 in addition to the means or the unit for permitting or ceasing the passage of the PWM gate signal will do. Further, the circuitry in which a current flowing into the diode sensing elements 22b flows into the sense resistor 30 will do. Needless to say, the circuitry in which the temperature sensitive diode elements 50 are further included will do. The circuitry in which the diode sensing elements 122 may not be employed but a current flowing into the diode elements 121 is directly detected may be adopted in the fifth to eights embodiments.

In the embodiments, the diode current sensing thresholds Vth1, Vth1', and Vth1" are set to negative values, and the over current sensing threshold Vth2 is set to a positive value. This is a mere example. Thus, it is not limited to the threshold values. Moreover, the diode current sensing thresholds Vth1, Vth1', and Vth" and over current sensing threshold Vth2 are set to voltage values. In a case where the feedback means including the AND circuit 10, sense resistor 30, and feedback circuit 40 detects a current flowing into the diode elements 22a, the thresholds are set to current values.

For the second and sixth embodiments, as shown in FIG. 3 and FIG. 10, the circuit form in which the four temperature sensitive diode elements 50 are directly connected has been introduced. The number of temperature sensitive diode elements 50 that is four is a mere example. Multiple temperature sensitive diode elements or one temperature sensitive diode element may be adopted.

The feedback circuit 200 that is included in the seventh embodiment and functions like a Schmitt circuit may be adopted as the feedback circuit 200 that is included in the sixth embodiment and senses temperature.

Ninth Embodiment

Figure 14:
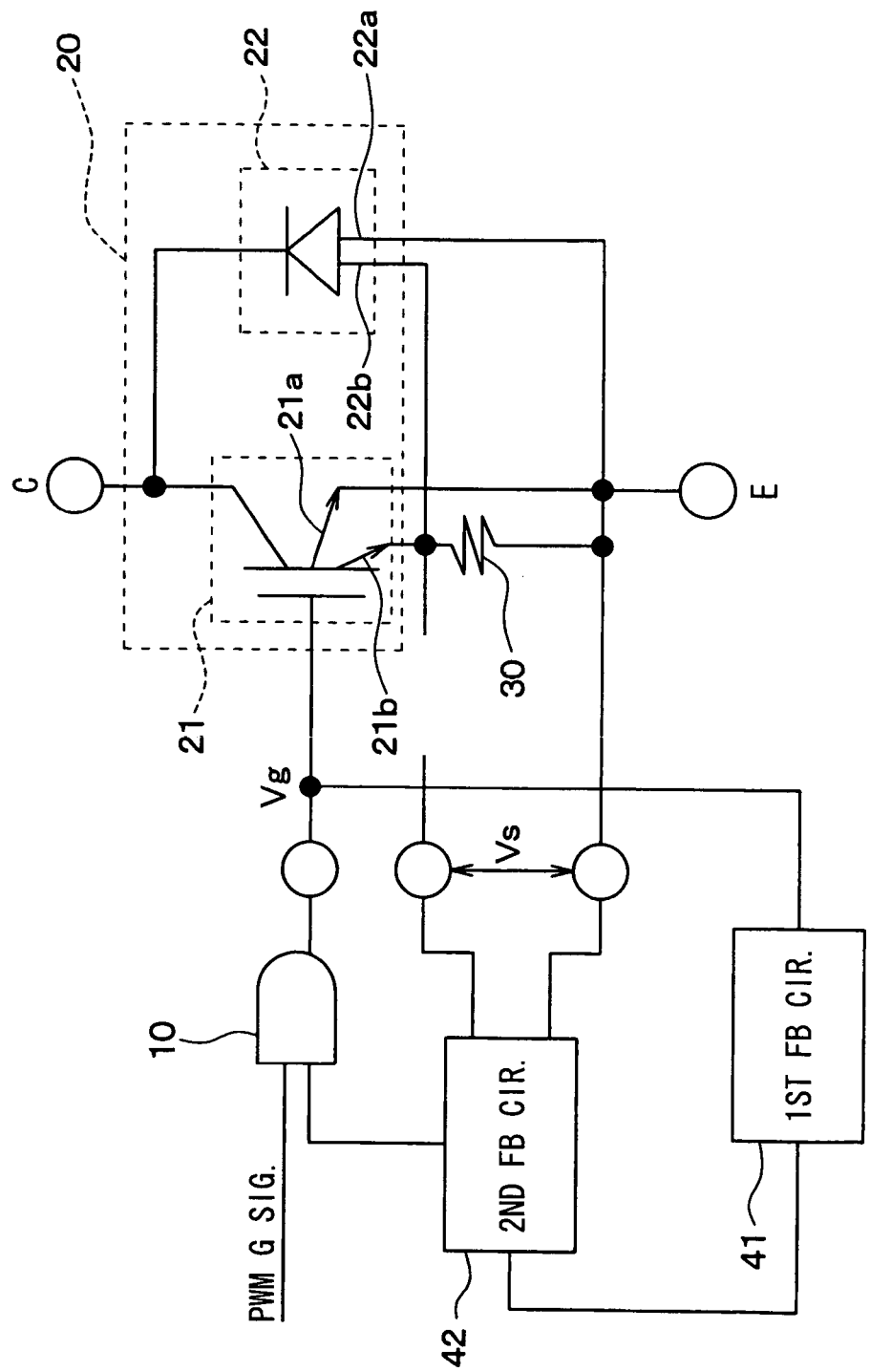
FIG. 14 is a circuit diagram of a semiconductor device in accordance with a ninth embodiment.

FIG. 14 is a circuit diagram of a semiconductor device in accordance with the present embodiment. As shown in the drawing, the circuitry includes, in addition to the circuits shown in FIG. 1, a first feedback circuit 41 and a second feedback circuit 42.

The first feedback circuit 41 is connected between the output terminal of the AND circuit 10 and the second feedback circuit 42. The first feedback circuit 41 decides whether the IGBT elements 21a are turned on or off with a gate signal (gate potential Vg) outputted from the AND circuit 10, and outputs the result of the decision to the second feedback circuit 42.

To be more specific, the first feedback circuit 41 has a criterial threshold H0 for the gate signal (gate potential Vg). If the gate signal outputted from the AND circuit 10 exceeds the criterial threshold H0, the first feedback circuit outputs a first diode current sensing threshold H1, which signifies that the IGBT elements 21a have been turned on, to the second feedback circuit 42. If the gate signal does not exceed the criterial threshold H0, the first feedback circuit outputs a second diode current sensing threshold, which has a larger value than the first diode current sensing threshold H1 does and signifies that the IGBT elements 21a have been turned off, to the second feedback circuit 42. The thresholds H1 and H2 are set to negative values.

The second feedback circuit 42 compares the potential difference Vs with the threshold H1 or H2 inputted from the first feedback circuit 41. Based on the result of the decision, the second feedback circuit 42 permits or ceases the passage of a pulse-width-modulated (PWM) gate signal to be inputted to the AND circuit 10. Moreover, the second feedback circuit 42 has an over current sensing threshold Vth2 described in relation to the first embodiment.

As mentioned above, the second feedback circuit 42 compares the potential difference Vs with either of the different thresholds H1 and H2 according to the gate signal. This is because the magnitude of a current flowing into the diode elements 22a (freewheeling diode (FWD) elements) varies depending on whether the IGBT elements 21a have been turned on or off.

Figure 15:
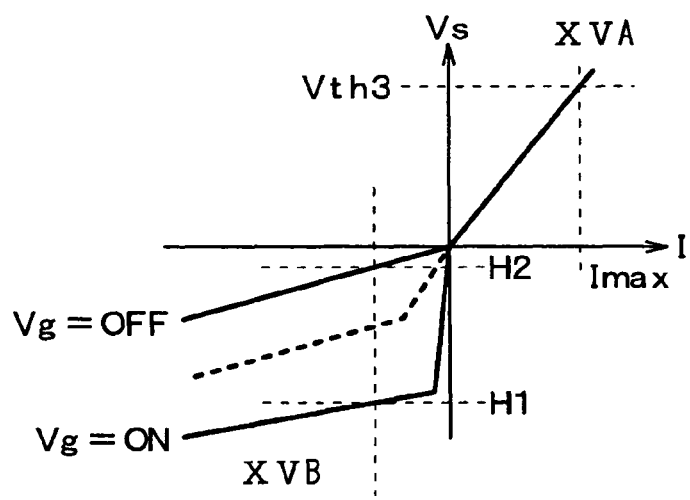
FIG. 15 shows the relationship between a current flowing into diode elements and a potential difference Vs occurring between the terminals of a sense resistor.

FIG. 15 shows the relationship between a current flowing into the diode elements 22a and the potential difference Vs between the terminals of the sense resistor 30. XVA represents an IGBT action domain, and XVB represents a FWD action domain. As indicated in the drawing, when both the current I flowing into the diode elements 22a and the potential difference Vs have positive values, the current I and potential difference Vs have a relationship of proportion. However, when the current flowing into the diode elements 22a becomes negative, that is, when the diode elements 22a are put into action, the potential difference Vs assumes a different value with respect to the current value according to whether the IGBT elements 21a have been turned on (Vg=on-state voltage) or off (Vg=off-state voltage). In other words, while ideal current values are plotted as a dashed line in an FWD action domain in FIG. 15, different lines are drawn in association with the values of the gate potential Vg.

Specifically, when a current has flowed into the diode elements 22a, if the IGBT elements 21a are turned on, since a current flows from the IGBT sensing elements 21b to the sense resistor 30, the potential difference Vs between the terminals of the sense resistor 30 gets larger. In contrast, when a current has flowed into the diode elements 22a, if the IGBT elements 21a are turned off, since the potential difference Vs in the sense resistor 30 depends on the current flowing into the diode elements 22a, the potential difference Vs gets smaller than that attained when the IGBT elements 21a are turned on.

Consequently, since either of the different thresholds H1 and H2 is used depending on whether the IGBT elements 21a have been turned on or off when a current has flowed into the diode elements 22a, the IGBT elements 21a can be controlled more stably. According to the threshold H1 or H2 inputted from the first feedback circuit 41, when the IGBT elements 21a have been turned on, the second feedback circuit 42 compares the potential difference Vs with the first diode current sensing threshold H1. When the IGBT elements 21a have been turned off, the second feedback circuit 42 compares the potential difference Vs with the second diode current sensing threshold H2 smaller than the first diode current sensing threshold H1.

In FIG. 15, within an IGBT action domain, when the potential difference Vs has a value Vth3, a current Imax flows into the diode elements 22a.

Figure 16A:
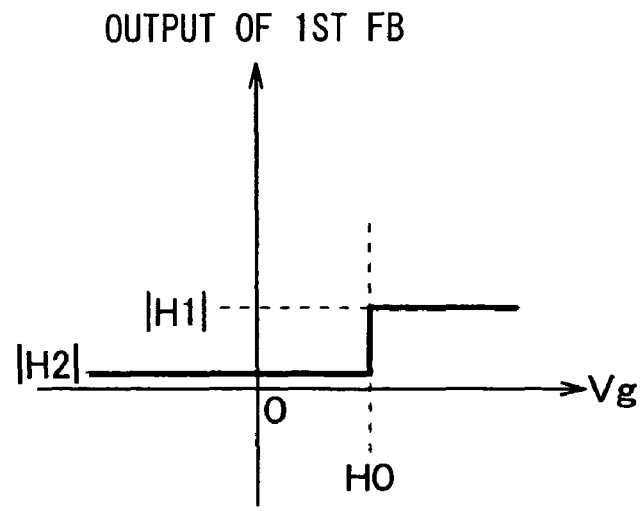
FIG. 16A shows an output of a first feedback circuit with respect to a gate potential Vg outputted from an AND circuit.
Figure 16B:
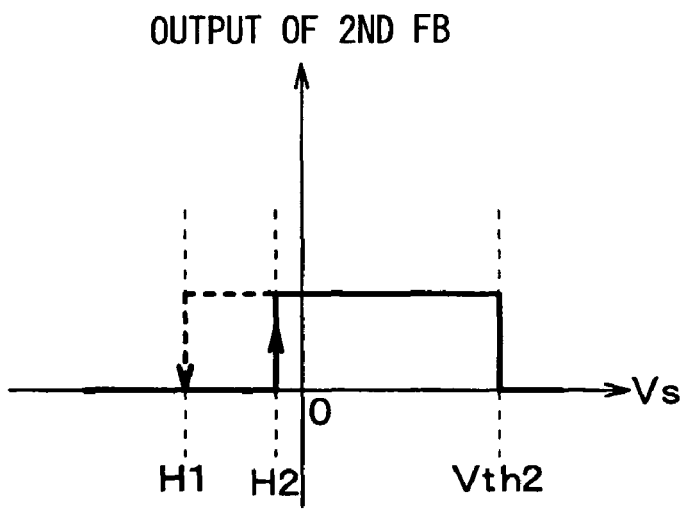
FIG. 16B shows an output of a second feedback circuit with respect to the potential difference Vs.

Referring to FIG. 16A and FIG. 16B, a description will be made below. FIG. 16A shows an output of the first feedback circuit 41 with respect to the gate potential Vg outputted from the AND circuit 10, and FIG. 16B shows an output of the second feedback circuit 42 with respect to the potential difference Vs. In FIG. 16A, the axis of ordinates indicates negative values. In FIG. 16B, the axis of ordinates indicates positive values.

As shown in FIG. 16A, the first feedback circuit 41 compares the gate potential Vg outputted from the AND circuit 10 with the criterial threshold H0 and decides whether the gate potential Vg has a value with which the IGBT elements 21a are driven. If the gate potential Vg exceeds the criterial threshold H0, the first feedback circuit 41 outputs the first diode current sensing threshold H1. If the gate potential Vg falls below the criterial threshold H0, the first feedback circuit 41 outputs the second diode current sensing threshold H2.

Thereafter, as indicated by FIG. 16B, the second feedback circuit 42 compares the potential difference Vs with either the first diode current sensing threshold H1 or second diode current sensing threshold H2 inputted from the first feedback circuit 41. When the potential difference Vs increases from a negative side to a positive side, if the potential difference Vs exceeds the second diode current sensing threshold H2, the second feedback circuit permits the PWM gate signal, which is externally inputted to the AND circuit 10, to pass through the AND circuit 10. On the other hand, when the potential difference Vs decreases from the positive side to the negative side, if the potential difference Vs falls below the first diode current sensing threshold H1, the second feedback circuit 42 does not permit the PWM gate signal, which is externally inputted to the AND circuit 10, to pass through the AND circuit 10. The second feedback circuit 42 controls the passage of the PWM gate signal through the AND circuit 10 according to the gate potential Vg of the IGBT elements 21a so that the passage will have a hysteresis.

Moreover, similarly to the first embodiment, when the potential difference Vs between the terminals of the sense resistor 30 is larger than the over current sensing threshold Vth2, the second feedback circuit 42 ceases the passage of the PWM gate signal to be inputted to the AND circuit 10 so as to protect the IGBT elements 21a from being broken due to an over current.

As mentioned above, in the present embodiment, information on the on or off state of the IGBT elements 21a is fed back to the AND circuit 10 in order to control driving of the IGBT elements 21a. Specifically, driving the IGBT elements 21a according to the gate potential Vg is provided with a hysteresis. When the IGBT elements 21a have been turned off, a current readily flows into the diode elements 22a. Therefore, by comparing the potential difference Vs with the smaller second diode current sensing threshold H2, the IGBT elements 21a can be turned off at the timing at which a current flows into the diode elements 22a. Moreover, when the IGBT elements 21a have been turned on, a current does not readily flow into the diode elements 22a. Therefore, by comparing the potential difference Vs with the larger first diode current sensing threshold H1, as long as no current flows into the diode elements 22a, the IGBT elements 21a can be turned on.

Consequently, the interference between the action of the diode elements 22a and the action of the IGBT elements 21a can be avoided in order to prevent an increase in a forward loss in the diode part 22. In addition, the IGBT elements 21a can be controlled stably without being caused to chatter or vibrate.

Incidentally, the first feedback circuit 41 is equivalent to the first feedback means or the first feedback unit, and the AND circuit 10 and second feedback circuit 42 are equivalent to the second feedback means or the second feedback unit.

Tenth Embodiment

In the ninth embodiment, an output of the AND circuit 10 (gate potential Vg) is inputted to the first feedback circuit 41 in order to decide the on or off state of the IGBT elements 21a. In the present embodiment, a circuit providing a hysteresis is employed. Thus, the same actions as those in the semiconductor device of the ninth embodiment are performed without the necessity of sensing the gate potential Vg.

Figure 17:
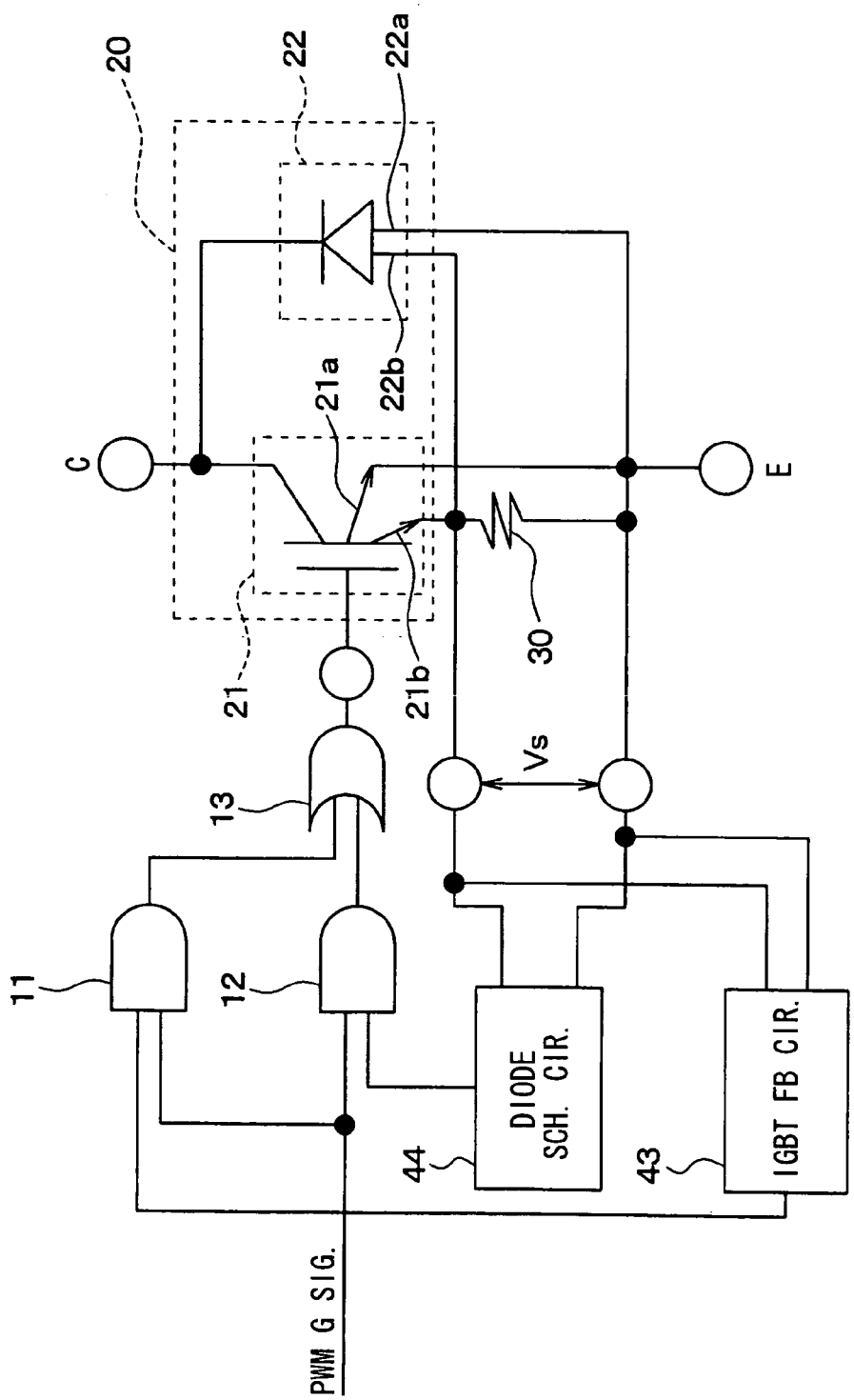
FIG. 17 is a circuit diagram of a semiconductor device in accordance with a tenth embodiment.

FIG. 17 is a circuit diagram of a semiconductor device in accordance with the present embodiment. As shown in the drawing, the potential difference Vs in the sense resistor 30 is inputted to an IGBT feedback circuit 43 and a diode Schmitt circuit 44. Moreover, an external PWM gate signal and the output of the IGBT feedback circuit 43 are inputted to an AND circuit 11, and the external PWM gate signal and the output of the diode Schmitt circuit 44 are inputted to an AND circuit 12. Further, the outputs of the AND circuits 11 and 12 are inputted to an OR circuit 13, and the output of the OR circuit 13 is inputted as the gate potential Vg to the IGBT elements 21a.

Figure 18A:
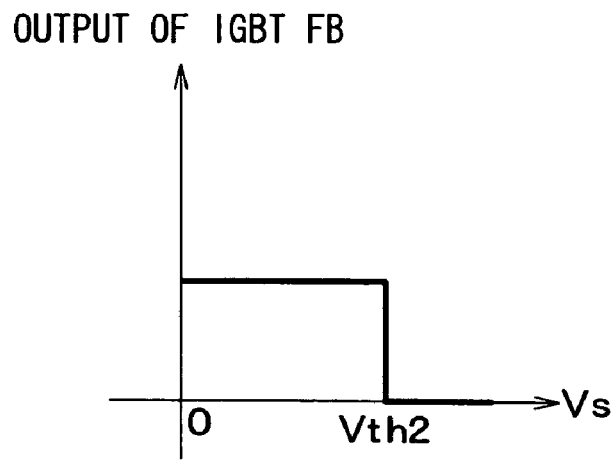
FIG. 18A shows an output of an IGBT feedback circuit with respect to a potential difference Vs.

The IGBT feedback circuit 43 detects an over current flowing into the IGBT elements 21a and has an over current sensing threshold Vth2. The IGBT feedback circuit 43 inputs the potential difference Vs between the terminals of the sense resistor 30 and compares the potential difference Vs with the over current sensing threshold Vth2. As shown in FIG. 18A, if the potential difference Vs exceeds the over current sensing threshold Vth2, the IGBT feedback circuit 43 outputs a signal with which the IGBT elements 21a are turned off.

Figure 18B:
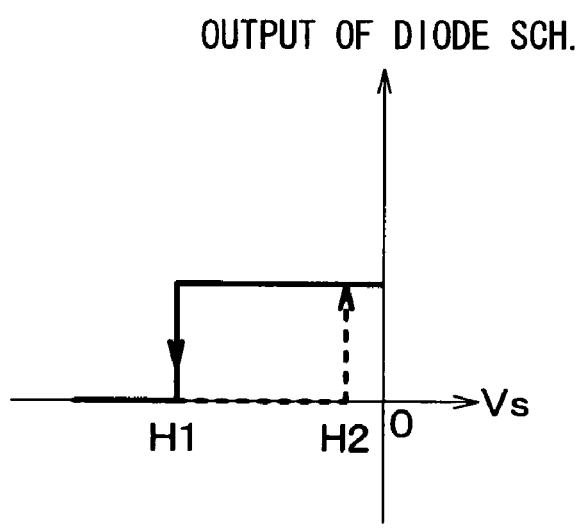
FIG. 18B shows an output of a diode Schmitt circuit with respect to the potential difference Vs.

Moreover, the diode Schmitt circuit 44 senses a current flowing into the diode elements 22a, and has the thresholds H1 and H2 employed in the ninth embodiment. The diode Schmitt circuit 44 inputs the potential difference Vs between the terminals of the sense resistor 30 and compares the potential difference with the threshold H1 or H2. As shown in FIG. 18B, when the potential difference Vs increases from a negative side to a positive side, if the potential difference Vs exceeds the second diode current sensing threshold H2, the diode Schmitt circuit 44 outputs a signal with which the IGBT elements 21a are turned on. When the potential difference Vs decreases from the positive side to the negative side, if the potential difference Vs falls below the first diode current sensing threshold H1, the diode Schmitt circuit 44 outputs a signal with which the IGBT elements 21a are turned off.

When both the PWM gate signal and the output of the IGBT feedback circuit 43 have a high level, the AND circuit 11 outputs a high-level signal. On the other hand, when both the PWM gate signal and the output of the diode Schmitt circuit 44 have the high level, the AND circuit 12 outputs the high-level signal.

When the OR circuit 13 inputs the high-level signal from either of the AND circuits 11 and 12, the OR circuit 13 outputs a signal with which the IGBT elements 21a are turned on so that the IGBT elements 21a will be turned on. On the other hand, when the high-level signal is not inputted from the AND circuits 11 and 12, the OR circuit 13 does not output the signal with which the IGBT elements 21a are turned on. The IGBT elements 21a are therefore turned off.

As mentioned above, the IGBT feedback circuit 43 intended to implement feedback control by sensing an over current in the IGBT elements 21a and the diode Schmitt circuit 44 intended to implement feedback control by sensing a diode current are included independently of each other. The outputs of the circuits 43 and 44 are synthesized with the PWM gate signal and then synthesized by the OR circuit 13. Consequently, similarly to the ninth embodiment, driving of the IGBT elements 21a can be controlled to exhibit a hysteresis.

Incidentally, the IGBT feedback circuit 43, AND circuit 11, and OR circuit 13 are equivalent to the IGBT feedback means or the IGBT feedback unit, and the diode Schmitt circuit 44, AND circuit 12, and OR circuit 13 are equivalent to the diode Schmitt means or the diode Schmitt unit.

Eleventh Embodiment

In the present embodiment, a sense resistor dedicated to the IGBT sensing elements 21b and a sense resistor dedicated to the diode sensing elements 22b are included.

Figure 19:
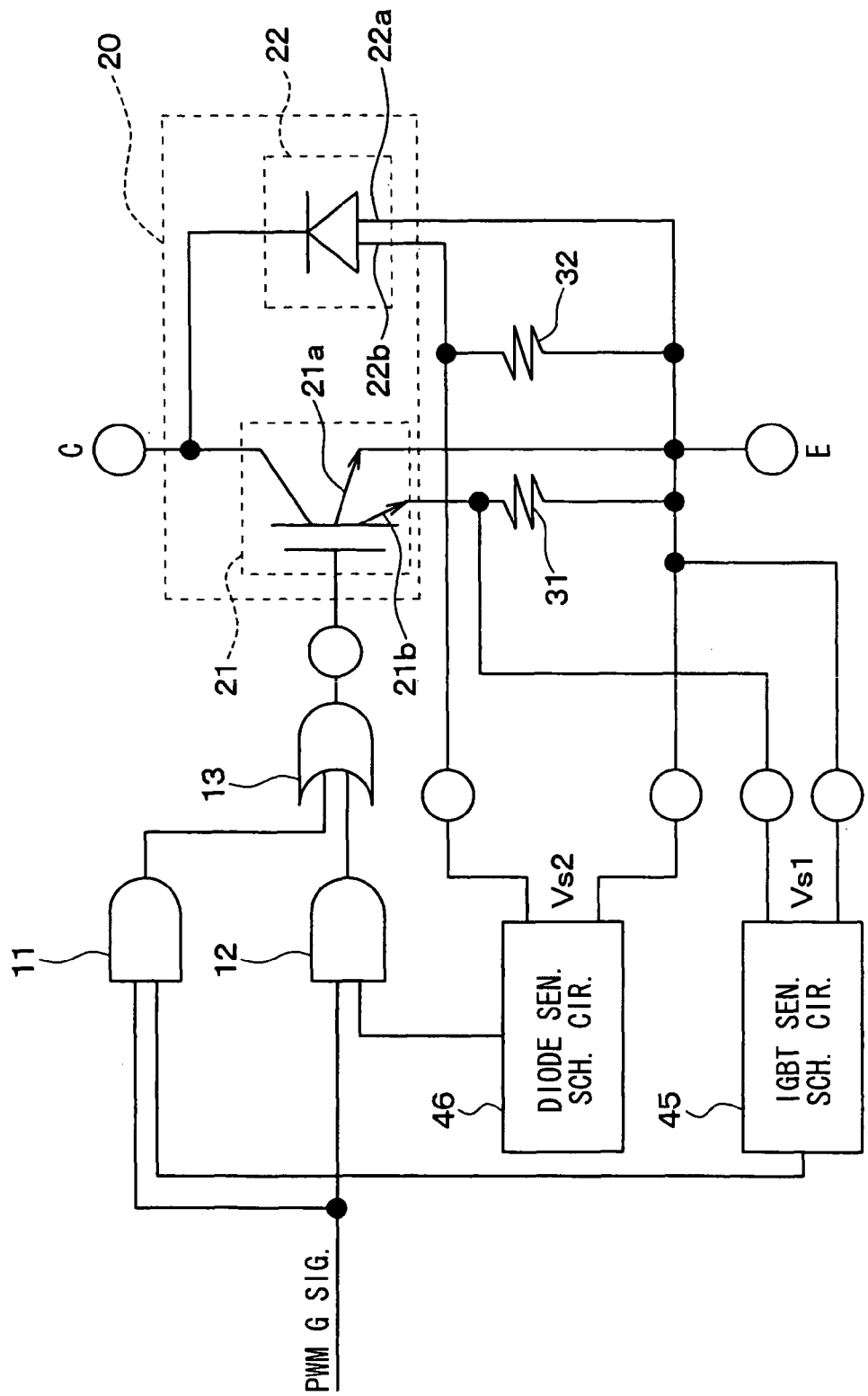
FIG. 19 is a circuit diagram of a semiconductor device in accordance with a eleventh embodiment.

FIG. 19 is a circuit diagram of a semiconductor device in accordance with the present embodiment. As shown in the drawing, a first sense resistor 31 is connected to the IGBT sensing elements 21b, and the first potential difference Vs1 between the terminals of the first sense resistor 31 is inputted to the IGBT sensing Schmitt circuit 45. Moreover, a second sense resistor 32 is connected to the diode sensing elements 22b, and the second potential difference Vs2 between the terminals of the second sense resistor 32 is inputted to the diode sensing Schmitt circuit 46.

Figure 20A:
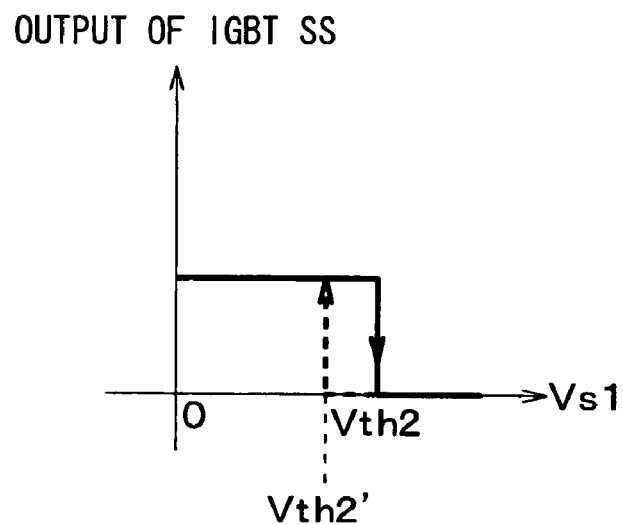
FIG. 20A shows an output of an IGBT sensing feedback circuit with respect to a potential difference Vs1.

The IGBT sensing Schmitt circuit 45 detects an over current flowing into the IGBT elements 21a, and has a first over current sensing threshold Vth2 and a second over current sensing threshold Vth2', which is smaller than the first over current sensing threshold Vth2, for the first potential difference Vs1. The IGBT sensing Schmitt circuit 45 inputs the first potential difference Vs1 between the terminals of the first sense resistor 31 and compares the first potential difference Vs1 with the threshold Vth2 or Vth2'. As indicated in FIG. 20A, when the first potential difference Vs1 increases from a negative side to a positive side, if the first potential difference Vs1 exceeds the first over current sensing threshold Vth2, the IGBT sensing Schmitt circuit 45 outputs a signal with which the IGBT elements 21a are turned off. When the first potential difference Vs1 decreases from the positive side to the negative side, if the first potential difference Vs1 falls below the second over current sensing threshold Vth2', the IGBT sensing Schmitt circuit 45 outputs a signal with which the IGBT elements 21a are turned on.

Figure 20B:
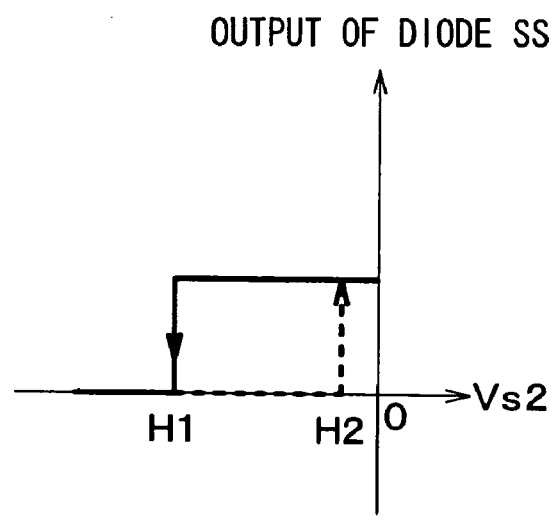
FIG. 20B shows an output of a diode sensing Schmitt circuit with respect to a potential difference Vs2.

The diode sensing Schmitt circuit 46 is identical to the diode Schmitt circuit 44 employed in the tenth embodiment. Consequently, as indicated in FIG. 20B, when the second potential difference Vs2 increases from the negative side to the positive side, if the second potential difference Vs2 exceeds the second diode current sensing threshold H2, the diode sensing Schmitt circuit 46 outputs a signal with which the IGBT elements 21a are turned on. When the second potential difference Vs2 decreases from the positive side to the negative side, if the second potential difference Vs2 falls below the first diode current sensing threshold H1, the diode sensing Schmitt circuit 46 outputs a signal with which the IGBT elements 21a are turned off.

Similarly to the tenth embodiment, when the AND circuits 11 and 12 and OR circuit 13 are put into action, the IGBT elements 21a are driven.

As mentioned above, since the sense resistors 31 and 32 are included in association with the IGBT sensing elements 21b and diode sensing elements 22b, the thresholds H1, H2, Vth2, and Vth2' can be set to optimal values according to the output characteristics of the IGBT sensing elements 21b and diode sensing elements 22b. The freedom in designing can be improved.

Incidentally, IGBT sensing Schmitt circuit 45, AND circuit 11, and OR circuit 13 are equivalent to the IGBT sensing Schmitt means or the IGBT sensing Schmitt unit, and the diode sensing Schmitt circuit 46, AND circuit 12, and OR circuit 13 are equivalent to the diode sensing Schmitt means or the diode sensing Schmitt unit.

Twelfth Embodiment

In the present embodiment, a semiconductor device shown in FIG. 19 and provided with the temperature sensitive diode elements 50 shown in FIG. 3 is integrated into a semiconductor chip 60.

Figure 21:
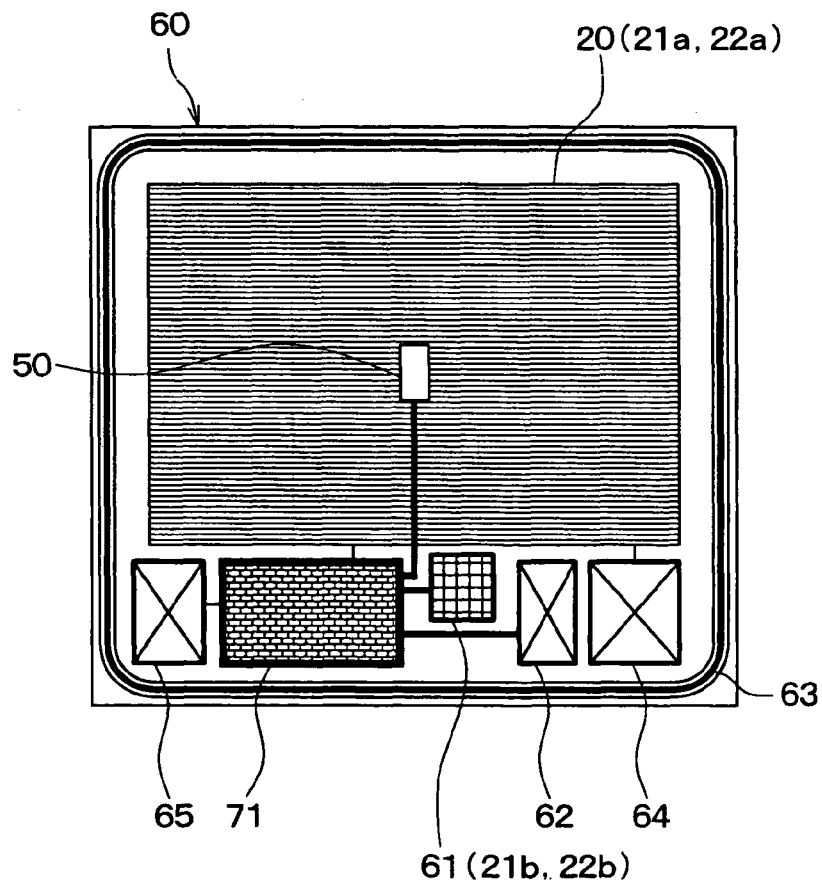
FIG. 21 is a plan view of a semiconductor chip in accordance with a twelfth embodiment.

FIG. 21 is a plan view of the semiconductor chip 60 in accordance with the present embodiment. As shown in FIG. 21, the semiconductor chip 60 includes an IGBT 21a with a body diode, temperature sensitive diode elements 50, a processing circuit unit 71, current sensing elements 61, a gate pad 62, a guard ring 63, an emitter pad 64, and a power supply pad 65.

The processing circuit unit 71 is a circuit unit into which the IGBT feedback circuit 43, diode Schmitt circuit 44, sense resistor 30, AND circuits 11 and 12, and OR circuit 13 which are shown in FIG. 17 are integrated.

The emitter pad 64 is an electrode connected to a load. The power supply pad 65 is an electrode through which a voltage is applied from a power supply to the IGBT feedback circuit 43 and diode Schmitt circuit 44. Assuming that the surface of the semiconductor chip 60 shown in FIG. 21 is the face thereof, a collector pad is disposed in the back of the semiconductor chip 60.

As mentioned above, the semiconductor device can be fabricated into a chip as the semiconductor chip 60. Consequently, the general-purpose property can be improved.

Other Embodiments

In the aforesaid embodiments, the IGBT part 21 is controlled according to a pulse width modulation (PWM) control method. However, the PWM control is a mere form of control. The IGBT elements 21a may be driven in, for example, a full-on mode.

In the aforesaid embodiments, the feedback circuit 40 decides both a current flowing into the diode elements 22a and an over current flowing into the IGBT elements 21a. A semiconductor device may be designed so that the feedback circuit 40 decides only the current flowing into the diode part 22. In this case, the IGBT part 21 need not include the IGBT sensing elements 21b. The semiconductor device may include as the IGBT 20 with a body diode the IGBT elements 21a and the diode part 22. Moreover, Hall-effect elements may be adopted as elements that detect current components flowing into the respective diode elements 21a. The same applies to the first feedback circuit 41, second feedback circuit 42, IGBT feedback circuit 43, diode Schmitt circuit 44, IGBT sensing Schmitt circuit 45, and diode sensing Schmitt circuit 46.

In the aforesaid embodiments, the diode current sensing thresholds Vth1 and Vth1' and thresholds H1 and H2 are set to negative values, and the over current sensing thresholds Vth2 and Vth2' are set to positive values. This is a mere example of threshold values. The present invention is not limited to the threshold values. Moreover, the diode current sensing thresholds Vth1 and Vth1', thresholds H1 and H2, and over current sensing thresholds Vth2 and Vth2' are set to voltage values. However, when the feedback means or the feedback unit including the AND circuit 10, sense resistor 30, and feedback circuit 40 detects a current flowing into the diode elements 22a, the threshold values are current values.

The temperature sensitive diode elements 50 employed in the second embodiment may be included in the semiconductor devices of the ninth to eleventh embodiments. In this case, as shown in FIG. 4, the thresholds H1 and H2 are changed to thresholds H1' and H2' larger than the thresholds H1 and H2. The potential difference Vs or Vs2 is compared with the threshold H1' or H2'.

Thirteenth Embodiment

Figure 22:
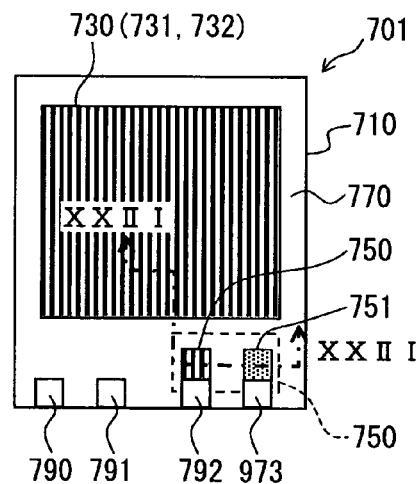
FIG. 22 is a plan view showing the outline construction of a semiconductor device in accordance with a thirteenth embodiment.
Figure 23:
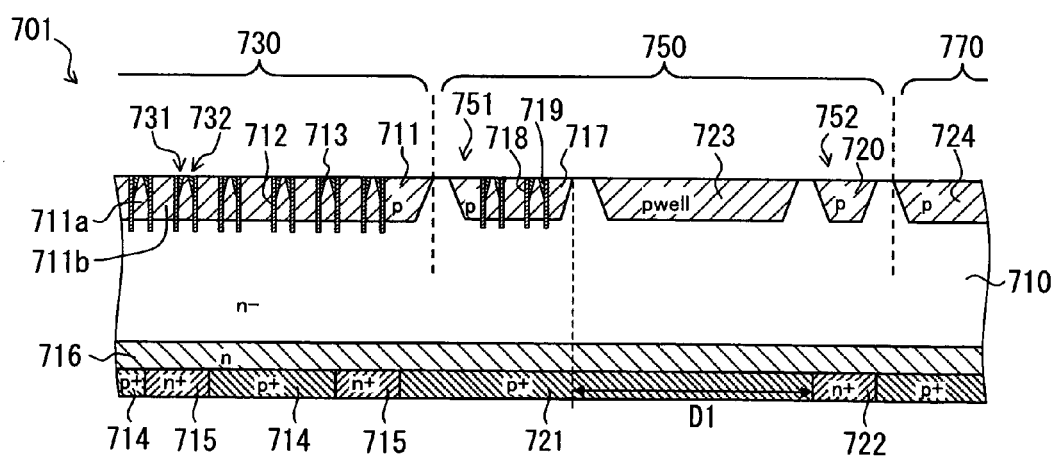
FIG. 23 is a sectional view along an XXIII-XXIII cutting-plane line in FIG. 22.

FIG. 22 is a plan view showing the outline construction of a semiconductor device in accordance with the thirteenth embodiment. FIG. 23 is a sectional view along an XXIII-XIII cutting-plane line shown in FIG. 22. The semiconductor device of the present embodiment is used as a power switching device in, for example, an inverter module for electric and hybrid vehicles (EHVs).

As shown in FIG. 22 and FIG. 23, the semiconductor device 701 includes a semiconductor substrate 710 of a first conductivity type. The semiconductor substrate 710 has a main region 730 and a sense region 750 whose principal surfaces are smaller than those of the main region 730. In the main region 730, insulated-gate bipolar transistor (IGBT) elements 731 each having a commutation diode element 732 (that is, a freewheeling diode (FWD) element 732) incorporated therein (so-called reverse-conducting (RC) IGBT elements) are formed. Moreover, in the sense region 750, IGBT-only sensing elements 751 and FWD element-only sensing elements 752 are formed. The semiconductor device 701 of the present embodiment is characterized in that the FWD element-only sensing elements 752 are disposed in the semiconductor substrate 710 in which the RC-IGBT elements are formed. As the other components, known structures can be adopted. To begin with, the main region 730 will be described below.

In the present embodiment, as the semiconductor substrate 710, a monocrystalline bulk silicon substrate of n-type conductivity (n−) (FZ wafer) whose impurity density is, for example, on the order of $1 \times 10^{14}$ cm$^{-3}$ is adopted. The part of the main region 730 of the semiconductor substrate 710 functions as the drift layers of the IGBT elements 731 and the cathodes of the FWD elements 732 (pn-junction diodes). Base regions 711 of p-type conductivity (p) are selectively formed in the superficial layer of the first principal surface of the semiconductor substrate 710 within the main region 730.

The base regions 711 are used as regions to be formed as channels of the IGBT elements 731 and the anode regions of the FWD elements 732. In the base regions 711, trenches which penetrate through the base regions 711 from the first principal surface of the semiconductor substrate 710 and whose bottoms reach the semiconductor substrate 710 are selectively formed. A polysilicon whose impurity density is on the order of $1 \times 10^{20}$ cm$^{-3}$ is poured into the trenches through gate insulating films (not shown) formed on the bottoms and flanks of the trenches, whereby gate electrodes 712 are formed.

Moreover, in the base regions 711, emitter regions 713 of n-type conductivity (n+) are selectively formed in the superficial layer of the first principal surface adjacently to the flanks of the gate electrodes 712 (trenches). In the present embodiment, the emitter regions 713 have a thickness of about 0.5 μm and have an impurity density of about $1 \times 10^{19}$ cm$^{-3}$. The emitter regions 713 are electrically connected to emitter electrodes (not shown) made of, for example, an aluminum material.

Moreover, each of the emitter regions 713 is formed in only one of adjoining base regions 711 out of the multiple base regions segmented by the gate electrodes 712 (trenches). Consequently, the base regions 711 are classified into multiple first regions 711a each of which includes the emitter region 713 and is electrically connected to the emitter electrode, and multiple second regions 711b each of which does not include the emitter region 713. In other words, the first regions 711a and second regions 711b are alternately arranged. Among the multiple second regions 711b, at least part of the second regions 711b is electrically connected to the emitter electrodes. Among the base regions 711, in the regions electrically connected to the emitter electrodes (all of the first regions 711a and at least part of the second regions 711b), contact regions (not shown) of p-type conductivity (p+) having a thickness of about 0.8 μm and an impurity density of about $1 \times 10^{19}$ cm$^{-3}$ are selectively formed in the superficial layer of the first principal surface.

In the superficial layer of the second principal surface of the semiconductor substrate 710 within the main region 730, collector layers 714 of p-type conductivity (p+) are selectively formed. In the present embodiment, the collector layers 714 have a thickness of about 0.5 μm and an impurity density of about $1 \times 10^{18}$ cm$^{-3}$. The collector layers 714 and cathode layers 715 are electrically connected to collector electrodes (not shown) made of, for example, an aluminum material.

In the present embodiment, as shown in FIG. 23, a field stop layer 716 of n-type conductivity (n) is formed between the semiconductor substrate 710 and the collector layers 714 and cathode layers 715. When IGBT elements sharing the field stop layer 716 that terminates depletion layers are adopted as IGBT elements each having the trench gate structure, compared with when IGBT elements having any other trench structure (of a punch-through type or a non-punch-through type) are adopted, the thickness of the semiconductor substrate 710 (semiconductor device 701) can be reduced. Consequently, since the number of excessive carriers is small, and the remaining width of a neutral region with each of the depletion layers is fully stretched is limited, a switching loss can be minimized. Incidentally, the thickness from the surfaces of the base regions 711 shown in FIG. 23 (the first principal surface of the semiconductor substrate 710) to the surfaces of the collector layers 714 (the second principal surface of the semiconductor substrate 710) is about 130 μm.

As mentioned above, in the main region 730 of the semiconductor substrate 710, the IGBT elements 731 and FWD elements 732 are integrated with each other. Specifically, the anode electrodes of the FWD elements 732 and the emitter electrodes of the IGBT elements 731 are formed in common, and the cathode electrodes of the FWD elements 732 and the collector electrodes of the IGBT elements 731 are formed in common. Next, the sense region 750 will be described below.

As a region of the semiconductor substrate 710 other than the region formed as the main region 730, the sense region 750 is formed over a range whose principal surfaces are smaller than those of the main region 730. In the sense region 750, the IGBT-only sensing elements 751 which have the same structure as the IGBT elements 731 do and into which a current proportional to a current flowing into the IGBT elements 731 flows are formed. Moreover, the FWD-only sensing elements 752 which have the same structure as the FWD elements 732 do and into which a current proportional to a current flowing into the FWD elements 732 flows are formed in the sense region. Specifically, the area of the IGBT-only sensing elements 751 is about one-thousandths of the area of the IGBT elements 731, and the area of the FWD-only sensing elements 752 is about one-thousandths of the area of the FWD elements 732.

To be more specific, base regions 717 of p-type conductivity (p) are selectively formed in the superficial layer of the first principal surface of the semiconductor substrate 710 within the sense region 750. The base regions 717 are used as regions formed as the channels of the IGBT-only sensing elements 751. Trenches which penetrate through the base regions 717 from the first principal surface of the semiconductor substrate 710 and whose bottoms reach the semiconductor substrate 710 are selectively formed in the base regions 717. A polysilicon whose impurity density is, for example, on the order of $1 \times 10^{20}$ cm$^{-3}$ is poured into the trenches through gate insulating films (not shown) formed on the bottoms and flanks of the trenches, whereby gate electrodes 718 are formed.

Moreover, in the base regions 717, emitter regions 719 of n-type conductivity (n+) are selectively formed in the superficial layer of the first principal surface adjacently to the flanks of the gate electrodes 718 (trenches). In the present embodiment, the emitter regions 719 have a thickness of about 0.5 μm and an impurity density of about $1\times10^{19}$ cm$^{-3}$. The emitter regions 719 are electrically connected to emitter electrodes (not shown) made of, for example, an aluminum material.

Moreover, anode regions 720 of p-type conductivity (p) are selectively formed separately from the base regions 717 in the superficial layer of the first principal surface of the semiconductor substrate 710 within the sense region 750. The anode regions 720 function as the anodes of the FWD-only sensing elements 752. In the anode regions 720, contact regions (not shown) of p-type conductivity (p+) are selectively formed to have a thickness of about 0.8 μm and an impurity density of about $1\times10^{19}$ cm$^{-3}$.

Collector layers 721 of p-type conductivity (p+) are selectively formed in the superficial layer of the second principal surface of the semiconductor substrate 710 within the sense region 750 so that the collector layers will include the regions immediately below the base regions 717. In the present embodiment, the collector layers 721 have a thickness of about 0.5 μm and an impurity density of about $1\times10^{18}$ cm$_{-3}$. Moreover, cathode layers 722 of n-type conductivity (n+) are selectively formed over a range in the superficial layer of the second principal surface of the semiconductor substrate 710 other than a range thereof, over which the collector layers 721 are formed, immediately below the anode regions 720. In the present embodiment, the cathode layers 722 have a thickness of about 0.5 μm and an impurity density of about $1\times10^{18}$ cm$_{-3}$. The collector layers 721 and cathode layers 722 are electrically connected to the collector electrodes (not shown) in common with the collector layers 714 and cathode layers 715 within the main region 730.

As mentioned above, in the present embodiment, the IGBT-only sensing elements 751 and FWD-only sensing elements 752 are formed independently of each other within the sense region 750 of the semiconductor substrate 710.

Preferably, the cathode layers 722 are formed separately from the base regions 711 of the IGBT elements 731 and the base regions of the IGBT-only sensing elements 751 in a direction perpendicular to the thickness direction of the semiconductor substrate 710. In the present embodiment, the FWD-only sensing elements 752 are formed so that the lengths from the base regions 711 of the IGBT elements 731 within the main region 730 to the cathode layers 722 will be equal to or larger than the thickness of the semiconductor substrate 710. Moreover, the FWD-only sensing elements 752 are formed so that the length D1 from the base regions 717 to the cathode layers 722 in the direction perpendicular to the thickness direction of the semiconductor substrate 710 will be equal to or larger than the thickness of the semiconductor substrate 710. Well regions 723 of p-type conductivity (p) are formed between the base regions 717 and anode regions 720 in the superficial layer of the first principal surface of the semiconductor substrate 710 for the purpose of improving a dielectric strength. Moreover, the collector layers 721 are extended to immediately below the well regions 723 and to the boundaries of the cathode layers 722 (the boundaries of the anode regions 720 in the direction perpendicular to the thickness direction of the semiconductor substrate 710).

As shown in FIG. 23, a guard ring 724 of p-type conductivity is formed as an electric-field concentration inhibitor in the superficial layer of the first principal surface in the marginal region of the semiconductor substrate 710 (near the margin thereof) so that the guard ring will surround the main region 730 and sense region 750. Moreover, reference numeral 790 in FIG. 22 denotes a gate pad through which a driving signal is applied to the gate electrodes 712, and reference numeral 791 denotes an emitter sensing pad. Reference numeral 792 denotes an IGBT sensing pad connected to the emitter regions 719 of the IGBT-only sensing elements 751, and reference numeral 793 denotes an FWD sensing pad connected to the anode regions 720 of the FWD-only sensing elements 752.

Figure 24:
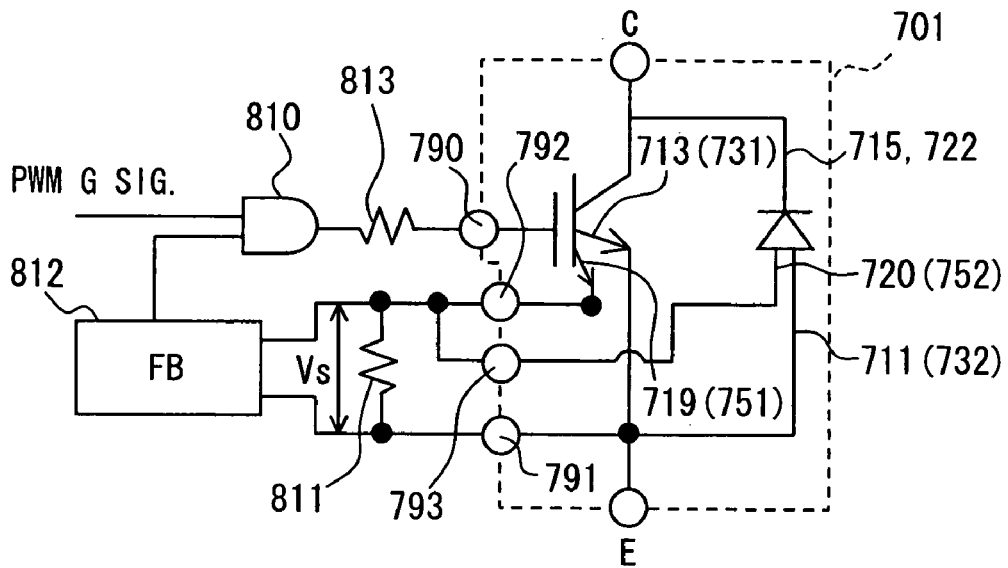
FIG. 24 shows an example of a feedback circuit to which the semiconductor device is adapted.
Figure 25:
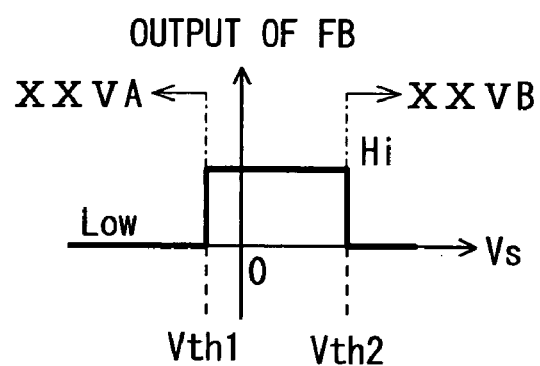
FIG. 25 shows the relationship among the potential difference Vs between the terminals of a sense resistor, a diode current sensing threshold Vth1, an over current sensing threshold Vth2, and an output of a feedback unit.

Next, a feedback circuit for a gate driving signal to which the semiconductor device 701 having the foregoing construction is adapted will be described below. FIG. 24 shows an example of the feedback circuit to which the semiconductor device of the present embodiment is adapted. FIG. 25 shows the relationship among the potential difference Vs between the terminals of a sense resistor, a diode current sensing threshold Vth1, an over current sensing threshold Vth2, and an output of a feedback unit. The feedback circuit is formed as part of an inverter circuit (one of upper and lower arms), and is identical to that (semiconductor device) described in IP-A-2007-229959 filed by the present inventor. In relation to the present embodiment, the description of the feedback circuit will be omitted. FIG. 24 shows an example in which the sense resistor is shared by the IGBT-only sensing elements 751 and FWD-only sensing elements 752.

As shown in FIG. 24, the feedback circuit includes the aforesaid semiconductor device 701, an AND circuit 810, a sense resistor 811, and a feedback unit 812.

The AND circuit 810 is a logic circuit that when all inputted signals have a high level, outputs a high-level signal. An external pulse-width-modulated (PWM) gate signal (equivalent to a driving signal) with which the semiconductor device 701 (IGBT elements 731 and IGBT-only sensing elements 751) is driven, and an output of the feedback unit 812 are inputted to the AND circuit 810. The PWM gate signal is produced by an external PWM signal generation circuit or the like, and applied to the input terminal of the AND circuit 810.

The AND circuit 810 is electrically connected to the gate pad 790 of the semiconductor device 701 via a gate resistor 813. The gate voltages of the IGBT elements 731 and IGBT-only sensing elements 751 are controlled with the PWM gate signal fed from the AND circuit 810 via the gate resistor 813. For example, if the PWM gate signal whose passage through the AND circuit 810 is permitted is a high-level signal, the IGBT elements 731 are turned on in order to drive the IGBT elements. If the PWM gate signal is a low-level signal, the IGBT elements 731 are turned off in order to cease driving the IGBT elements. Moreover, if the passage of the PWM gate signal through the AND circuit 810 is ceased, the IGBT elements 731 and IGBT-only sensing elements 751 are not driven.

Moreover, a load, a power supply, or the like that is not shown is connected to the collectors of the IGBT elements 731 so that a main current will flow between the collectors of the IGBT elements 731 and the emitters thereof. Moreover, the collectors of the IGBT-only sensing elements 751 are formed in common with the collectors of the IGBT elements 731. The emitter regions 719 of the IGBT-only sensing elements 751 are connected to one of the terminals of the sense resistor 811 via the pad 792 for the IGBT-only sensing elements 751. The other terminal of the sense resistor 811 is connected to the emitter regions 713 of the IGBT elements 731 via the emitter sensing pad 791. Consequently, a sense current for current detection flowing from the emitter regions 719 of the IGBT-only sensing elements 751, that is, a current proportional to a main current flowing into the IGBT elements 731 flows into the sense resistor 811. The potential difference Vs between the terminals of the sense resistor 811 is fed back to the feedback unit 812.

The feedback unit 812 is formed with a combination of, for example, operational amplifiers or the like, decides whether a current has flowed into the FWD elements 732 or whether an over current has flowed into the IGBT elements 731, and permits or ceases the passage of the PWM gate signal, which is inputted to the AND circuit 810, on the basis of the result of the decision. Therefore, the feedback unit 812 has a diode current sensing threshold Vth1 to be used to decide whether a current has flowed into the FWD elements 732, and an over current sensing threshold Vth2 to be used to decide whether an over current has flowed into the IGBT elements 731. In the present embodiment, the thresholds Vth1 and Vth2 are set to voltage values.

If the IGBT elements 731 are normally driven (if no current flows into the FWD elements 732), a current flows from the IGBT-only sensing elements 751 to the sense resistor 811. Consequently, assuming that the potential at the emitter regions 713 of the IGBT elements 731 is regarded as a reference, the potential difference Vs between the terminals of the sense resistor 811 has a positive value. In contrast, if a current flows into the FWD elements 732, a current flows from the sense resistor 811 to the FWD-only sensing elements 752. Consequently, assuming that the potential at the emitter regions 713 of the IGBT elements 732 is regarded as a reference, the potential difference Vs between the terminals of the sense resistor 811 has a negative value. Therefore, the diode current sensing threshold Vth1 for use in detecting whether a current has flowed into the FWD elements 732 is set to a negative value. Moreover, if an over current flows into the IGBT elements 731, the value of a sense current flowing from the IGBT-only sensing elements 751 to the sense resistor 811 gets larger, that is, the potential difference Vs between the terminals of the sense resistor 811 has a larger positive value. Therefore, the over current sensing threshold Vth2 is set to a positive value.

For driving the IGBT elements 731, the feedback unit 812 outputs a signal with which the passage of the PWM gate signal to be inputted to the AND circuit is permitted, and inputs the potential difference Vs between the terminals of the sense resistor 811. As shown in FIG. 25, when the potential difference Vs is smaller than the diode current sensing threshold Vth1, or when the potential difference Vs is larger than the over current sensing threshold Vth2, the feedback unit 812 outputs a signal with which the passage of the PWM gate signal to be inputted to the AND circuit 810 is ceased.

For example, normally, the PWM gate signal is produced as a driving signal, with which the IGBT elements 731 (and the IGBT-only sensing elements 751) are driven, by an external circuit such as a PWM signal generation circuit, and inputted to the AND circuit 810. On the other hand, the FWD elements 732 are turned off, and no current flows into even the FWD-only sensing elements 752. Consequently, the potential at one of the terminals of the sense resistor 810, which is connected to the emitter regions 719 of the IGBT-only sensing elements 751 (IGBT sensing pad 792) gets higher than the potential at the other terminal thereof. Eventually, the potential difference Vs between the terminals of the sense resistor 811 has a positive value.

Consequently, as shown in FIG. 25, the potential difference Vs is larger than the negative diode current sensing threshold Vth1, the feedback unit 812 decides that no current has flowed into the FWD elements 732. Therefore, the output of the feedback unit 812 is, as shown in FIG. 25, brought to a high level, and inputted to the AND circuit 810. When the high-level PWM gate signal and the high-level output of the feedback unit 812 are inputted to the AND circuit 810, the PWM gate signal has the passage thereof through the AND circuit 810 permitted, and is inputted to the gate electrodes 712 and 718 of the IGBT elements 731 and IGBT-only sensing elements 751 via the gate resistor 813. The IGBT elements 731 and IGBT-only sensing elements 751 are turned on. Consequently, the IGBT elements 731 and IGBT-only sensing elements 751 are driven, and a current flows into the load that is not shown and that is connected to the collector electrodes or emitter electrodes of the IGBT elements 731.

When a current flows into the FWD elements 732, the potential at one of the terminals connected to the anodes 711 (emitter sensing pad 791) of the FWD elements 732 gets higher than the potential at the other terminal thereof connected to the anode regions 720 (FWD sensing pad 793) of the FWD-only sensing elements 752. Consequently, the potential difference between the terminals of the sense resistor 811 becomes negative.

Consequently, as shown in FIG. 25, when the potential difference Vs gets smaller than the diode current sensing threshold Vth1, the feedback unit 812 decides that current has flowed into the FWD elements 732. Therefore, the output of the feedback unit 812 is an output with which the passage of the PWM gate signal, which is inputted to the AND circuit 810, is ceased, and is then inputted to the AND circuit 810.

Consequently, since a signal with which the IGBT elements 731 are driven is not inputted from the AND circuit 810, driving the IGBT elements 731 is ceased (the gate signal is set to a zero level). Namely, when the FWD elements 732 act in the forward direction, the IGBT elements 731 are not put into action.

Moreover, if an over current flows into the IGBT elements 731, a sense current flowing from the IGBT-only sensing elements 751 to the sense resistor 811 gets larger proportionally to the over current. Consequently, the potential difference Vs between the terminals of the sense resistor 811 gets larger than the potential difference Vs attained when the IGBT elements 731 act normally.

Consequently, as shown in FIG. 25, when the potential difference Vs gets larger than the over current sensing threshold Vth2, the feedback unit 812 decides that an over current has flowed into the IGBT elements 731. Therefore, the output of the feedback unit 812 is an output with which the passage of the PWM gate signal to be inputted to the AND circuit 810 is ceased, and is then inputted to the AND circuit 810.

Consequently, since a signal with which the IGBT elements 731 are driven is not inputted from the AND circuit 810, driving the IGBT elements 731 is ceased. In other words, the IGBT elements 731 are protected from being broken with an over current flowing into the IGBT elements 731.

As described so far, in the semiconductor device 701 of the present embodiment, the FWD-only sensing elements 752 are disposed within the sense region 750 of the semiconductor substrate 710 in such a manner that they are devoid of a gate electrode to which the PWM gate signal is applied. When the FWD-only sensing elements 752 act in the forward direction, the anode regions 720 of the FWD-only sensing elements 752 and the cathode regions (semiconductor substrate 710) thereof will not be brought to the same potential. Therefore, the FWD-only sensing elements 752 will not be able to readily act in the forward direction due to the gate potential thereof (PWM gate signal). In other words, a current proportional to a current flowing into the FWD elements 732 readily flows into the FWD-only sensing elements 752 (a detective voltage is readily developed). Consequently, when the semiconductor device 701 having the FWD-only sensing elements 752 is adapted, whether the PWM gate signal has been applied to the gate electrodes 712 of the IGBT elements 731 can be highly precisely controlled based on the action of the FWD elements 732. In other words, although the FWD elements 732 are incorporated in the IGBT elements 731, an increase in a forward loss caused by the FWD elements 732 can be effectively suppressed.

Moreover, in the present embodiment, the cathode layers 722 included in the FWD-only sensing elements 752 are disposed within the sense region 750 of the semiconductor substrate 710, and are formed separately from the base regions 711 of the IGBT elements 731 disposed in the main region 730 in the direction perpendicular to the thickness direction of the semiconductor substrate 710. Moreover, the cathode layers 722 are formed separately from the base regions 717 of the IGBT-only sensing elements 751 in the direction perpendicular to the thickness direction of the semiconductor substrate 710. Consequently, the FWD-only sensing elements 751 are prevented from incorrectly acting because at least part of carriers accumulated in the semiconductor substrate 710 along with the action of the IGBT elements 731 (the action of the IGBT-only sensing elements 751) (holes injected from the collector layers 714 and 721 included in the IGBT elements 731 and IGBT-only sensing elements 751) flows into the cathode layers 722 of the FWD-only sensing elements 752. In other words, current detection to be performed using the FWD-only sensing elements 752 can be more accurately achieved according to the action of the FWD elements 732 (a current flowing into the FWD elements 732).

In the present embodiment, the distance between the base regions 711 and 717 and the cathode layers 722 in the direction perpendicular to the thickness direction of the semiconductor substrate 710 is equal to or larger than the thickness of the semiconductor substrate 710. Consequently, holes injected from the collector layers 714 and 721 included in the IGBT elements 731 and IGBT-only sensing elements 751 readily flow into the channels and the emitter regions 713 and 719 but hardly flow into the cathode layers 722. Therefore, the precision in current detection by the FWD-only sensing elements 752 can be upgraded.

In the present embodiment, the cathode layers 722 of the FWD-only sensing elements 752 are formed immediately below the anode regions 720. Namely, the distance between the anode regions 720 and cathode layers 722 is the shortest. Consequently, the action resistance offered by the FWD-only sensing elements 752 can be reduced, a current can readily flow (a detective voltage can be readily developed), and the precision in current detection by the FWD-only sensing elements 752 can be upgraded.

Fourteenth Embodiment

Figure 26:
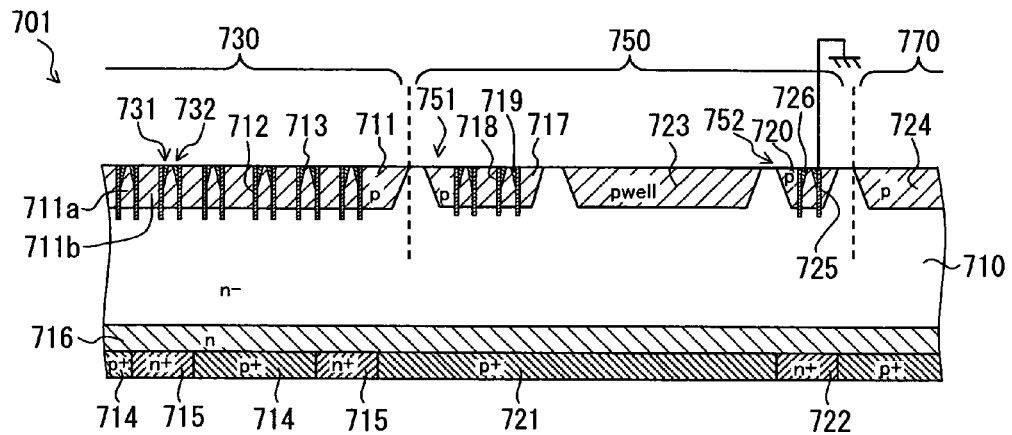
FIG. 26 is a sectional view showing the outline construction of a semiconductor device in accordance with a fourteenth embodiment.

Next, the fourteenth embodiment of the present invention will be described in conjunction with FIG. 26. FIG. 26 is a sectional view showing the outline construction of a semiconductor device in accordance with the fourteenth embodiment, and is comparable to FIG. 23 showing the thirteenth embodiment.

The semiconductor device in accordance with the fourteenth embodiment has a lot in common with the thirteenth embodiment. The description of the common parts will be omitted, and a different part will be intensively described below. The same reference numerals will be assigned to the components identical to those of the thirteenth embodiment.

As shown in FIG. 26, in the present embodiment, the FWD-only sensing elements 752 include dummy gate electrodes 725 which are formed by putting a conducting material to trenches, which penetrate through the anode regions 720 from the first principal surface and whose bottoms reach the semiconductor substrate 710, through insulating films. The dummy gate electrodes 725 have the same structure as the gate electrodes 712 of the IGBT elements 731 formed in the main region 730, and are grounded. The dummy gate electrodes 725 are therefore electrically independent of the gate electrodes 712. Moreover, dummy emitter regions 726 of n-type conductivity (n+) are selectively formed in the superficial layer of the first principal surface adjacently to the flanks of the dummy gate electrodes 725 (trenches). Although the dummy emitter regions 726 have the same structure as the emitter regions 713 of the IGBT elements 731 formed in the main region 730, the dummy emitter regions 726 are electrically independent of the emitter regions 713.

As mentioned above, in the semiconductor device 701 of the present embodiment, the dummy gate electrodes 725 that have the same structure as the gate electrodes 712 but are not electrically connected to the gate electrodes 712 and are grounded are included as parts of the respective FWD-only sensing elements 752. Consequently, although the FWD-only sensing elements 752 include the dummy gate electrodes 725 having the same structure as the gate electrodes 712, when the FWD-only sensing elements 752 act in the forward direction, the anode regions 720 of the FWD-only sensing elements 752 and the cathode regions (semiconductor substrate 710) thereof will not be brought to the same potential. The FWD-only sensing elements 752 will not be able to readily act in the forward direction due to the gate potential (PWM gate signal). In other words, a current proportional to a current flowing into the FWD elements 732 readily flow into the FWD-only sensing elements 752 (a detective voltage is readily developed). Consequently, even when the semiconductor device 701 including the FWD-only sensing elements 752 is adapted, whether the PWM gate signal is applied to the gate electrodes 712 of the IGBT elements 731 can be highly precisely controlled based on the action of the FWD elements 732. Namely, although the FWD elements 732 are incorporated in the IGBT elements 731, an increase in the forward loss caused by the FWD elements 732 can be effectively suppressed.

Moreover, in the present embodiment, the dummy gate electrodes 725 and dummy emitter regions 726 have the same structures as the gate electrodes 712 and emitter regions 713 respectively. Consequently, a design ensuring the dielectric strength of the FWD-only sensing elements 752 can be attained in the same manner as that of the FWD elements 732 disposed in the main region 730.

Figure 27:
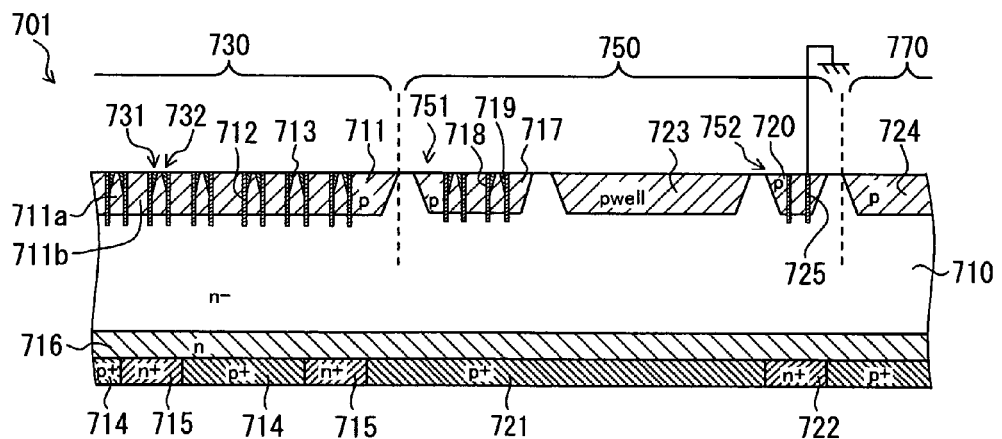
FIG. 27 is a sectional view showing a variant.

In the present embodiment, the FWD-only sensing elements 752 further include, unlike those of the thirteenth embodiment, the grounded dummy gate electrodes 725 and the dummy emitter regions 726. However, for example, as shown in FIG. 27, the FWD-only sensing elements 752 may further include only the grounded dummy gate electrodes 725 (devoid of the dummy emitter regions 726). FIG. 27 is a sectional view showing a variant.

Fifteenth Embodiment

Figure 28:
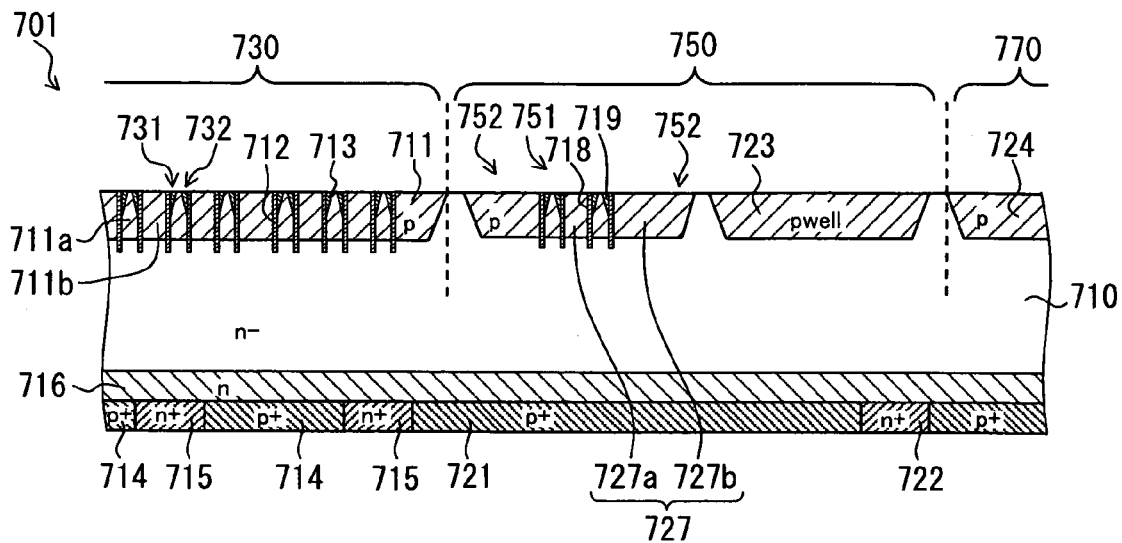
FIG. 28 is a sectional view showing the outline construction of a semiconductor device in accordance with fifteenth embodiment.

Next, the fifteenth embodiment of the present invention will be described in conjunction with FIG. 28. FIG. 28 is a sectional view showing the outline construction of a semiconductor device in accordance with the fifteenth embodiment, and is comparable to FIG. 23 showing the thirteenth embodiment.

The semiconductor device in accordance with the fifteenth embodiment has a lot in common with the aforesaid embodiments. The description of the common parts will be omitted, and a different part will be intensively described. The same reference numerals will be assigned to components identical to those of the aforesaid embodiments.

In the aforesaid embodiments, in the sense region 750, the base regions 717 included in the IGBT-only sensing elements 751 and the anode regions 720 included in the FWD-only sensing elements 752 are separated from each other.

In contrast, in the semiconductor device 701 of the present embodiment, for example, as shown in FIG. 28, IGBT-only sensing elements 751 which include: base regions 727 of a second conductivity type selectively formed in the superficial layer of the first principal surface of the semiconductor substrate 710; gate electrodes 718 formed by putting a conducting material to trenches, which penetrate through the base regions 727 from the first principal surface in the centers 727a of the base regions 727 and of which bottoms reach the semiconductor substrate 710, through insulating films; emitter regions 719 selectively formed in the superficial layer of the first principal surface within the base regions 727; collector layers 721 selectively formed in the second principal surface of the semiconductor substrate 710, and into which a current proportional to a current flowing into the IGBT elements 731 flows are disposed within the sense region 750.

Moreover, the perimeters 727 of the base regions 727 outside the centers 727a in which the gate electrodes 718 are formed are used as the anode regions of the FWD-only sensing elements 752 (equivalent to the anode regions 720 included in the thirteenth embodiment). Preferably, the cathode layers 722 of the FWD-only sensing elements 752 are formed separately at least from the base regions 727 in a direction perpendicular to the thickness direction of the semiconductor substrate 710 by a distance equal to or larger than the thickness of the semiconductor substrate 710.

As mentioned above, in the semiconductor device 701 of the present embodiment, the centers 727a of the base regions 727 substantially function as the base regions of the IGBT-only sensing elements 751, and the perimeters 727b thereof function as the anode regions of the FWD-only sensing elements 752. In short, the base regions of the IGBT-only sensing elements 751 and the anode regions of the FWD-only sensing elements 752 are formed as united bodies. Moreover, the cathode layers 722 are formed separately from the base regions 727. Consequently, while the same operation and advantage as those of the semiconductor devices 1 of the aforesaid embodiments are exerted, the constitution can be made smaller than those of the semiconductor devices 1 of the aforesaid embodiments in the direction perpendicular to the thickness direction of the semiconductor substrate 710.

In the present embodiment, the semiconductor device 701 includes the field stop layer 716. However, IGBT elements of a punch-through type or a non-punch-through type may be adopted as the IGBT elements 731 (IGBT-only sensing elements 751).

Moreover, in the present embodiment, the first conductivity type set forth in Claims refers to the n-type conductivity and the second conductivity type refers to the p-type conductivity (the construction including the IGBT elements 731 having n-type channels). Alternatively, the first conductivity type may refer to the p-type conductivity and the second conductivity type may refer to the n-type conductivity (the construction including the IGBT elements 731 having p-type channels).

In the present embodiment, when the present embodiment is adapted to the feedback circuit, the IGBT-only sensing elements 751 and FWD-only sensing elements 752 share the sense resistor 811 to which they are connected through one of the terminals thereof. Alternatively, the IGBT-only sensing elements 751 and FWD-only sensing elements 752 may be associated with different sense resistors.

In the present embodiment, the sense resistor 811 is connected to the emitters of the IGBT-only sensing elements 751 and the anodes of the FWD-only sensing elements 752. Alternatively, a sense resistor may be connected to the collectors of the IGBT-only sensing elements 751, and a sense resistor may be connected to the cathodes of the FWD-only sensing elements 752.

In the present embodiment, the semiconductor device 701 includes as sensing elements the IGBT-only sensing elements 751 and FWD-only sensing elements 752. However, the semiconductor device 701 may include as the sensing elements at least the FWD-only sensing elements 752.

In the present embodiment, the FWD-only sensing elements 752 include the cathode layers 722. Alternatively, the cathode layers 715 of the FWD elements 732 formed in the main region 730 may be used as the cathode layers of the FWD-only sensing elements 752 (the cathode layers are shared by the FWD elements and FWD-only sensing elements). Even in this construction, the cathode layers (cathode layers 715) of the FWD-only sensing elements 752 can be formed separately from the base regions 717 (or base regions 727) of the IGBT-only sensing elements 751. In particular, like the construction of the semiconductor device 701 of the fifteenth embodiment, in the construction in which the base regions of the IGBT-only sensing regions 751 and the anode regions of the FWD-only sensing elements 752 are formed as the united bodies of the base regions 727, the cathode layers 715 of the FWD elements 732 are thought to be adopted as the cathode layers formed separately from the base regions 727. However, the cathode layers 715 adjoin the collector layers 714 included in the IGBT elements 731. Therefore, preferably, the cathode layers 722 of the FWD-only sensing elements 752 are formed separately from the cathode layers 715 of the FWD elements 732.

Figure 29:
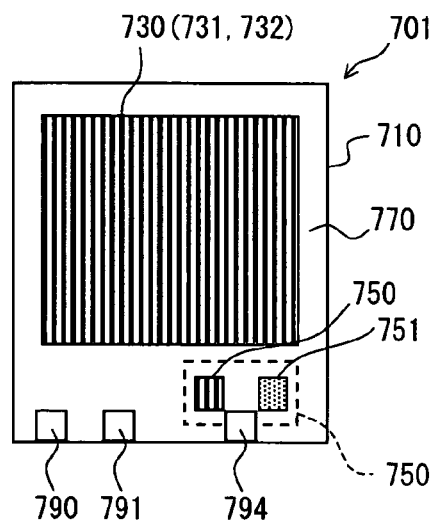
FIG. 29 is a plan view showing another variant.

In the present embodiment, the IGBT sensing pad 792 connected to the emitter regions 719 of the IGBT-only sensing elements 751 and the FWD sensing pad 793 connected to the anode regions 720 of the FWD-only sensing elements 752 are formed independently of each other. Alternatively, for example, as shown in FIG. 29, the IGBT sensing pad 792 and FWD sensing pad 793 may be formed in common as one sensing pad 794. FIG. 29 is a plan view showing another variant.

The above disclosure has the following aspects.

According to a first aspect of the present disclosure, a semiconductor device includes: a semiconductor substrate; a diode-built-in insulated-gate bipolar transistor having an insulated-gate bipolar transistor and a diode, which are disposed in the substrate, wherein the insulated-gate bipolar transistor includes a gate, and is driven with a driving signal input into the gate; and a feedback unit for detecting current passing through the diode. The driving signal is input from an external unit into the feedback unit. The feedback unit passes the driving signal to the gate of the insulated-gate bipolar transistor when the feedback unit detects no current through the diode. The feedback unit stops passing the driving signal to the gate of the insulated-gate bipolar transistor when the feedback unit detects the current through the diode.

Consequently, when a current flows into the diode elements, driving the IGBT elements can be ceased. Namely, when a current flows into the diode elements, a gate signal for use in driving the IGBT elements is not inputted to the IGBT elements. Consequently, the interference of the action of the diode elements with the action of the IGBT elements can be avoided.

Consequently, since the diode elements and IGBT elements are simultaneously turned on, an increase in the forward voltage of the diode elements derived from the fact that the diode elements formed in the same semiconductor substrate as the IGBT elements are cannot readily act in a forward direction can be avoided. Eventually, an increase in a loss in the forward voltage of the diode elements can be prevented.

Alternatively, the feedback unit may include a sensing resistor for detecting the current through the diode. The feedback unit provides a first diode current threshold for determining whether the current flows through the diode. The feedback unit compares a voltage between two ends of the sensing resistor with the first diode current threshold. The feedback unit passes the driving signal to the gate of the insulated-gate bipolar transistor when the voltage between two ends of the sensing resistor is equal to or larger than the first diode current threshold, and the feedback unit stops passing the driving signal to the gate of the insulated-gate bipolar transistor when the voltage between two ends of the sensing resistor is smaller than the first diode current threshold.

As mentioned above, the circuitry including the sense resistor for the purpose of detecting whether a current has flowed into the diode elements will do. In this case, the potential difference between the terminals of the sense resistor can be used to detect the current flowing into the diode elements.

Further, the diode-built-in insulated-gate bipolar transistor may further include a diode current sensing element. The diode current sensing element passes current in proportion to the current of the diode, and the current passing through the diode current sensing element flows through the sensing resistor.

Further, the semiconductor device may further include: a temperature sensing diode element for outputting a forward voltage corresponding to temperature generated in the diode-built-in insulated-gate bipolar transistor. The feedback unit further provides a second diode current threshold, which is larger than the first diode current threshold. The feedback unit replaces the first diode current threshold with the second diode current threshold so that the feedback unit compares the voltage between two ends of the sensing resistor with the second diode current threshold when the forward voltage is larger than a predetermined forward voltage. The predetermined forward voltage corresponds to the temperature in the diode-built-in insulated-gate bipolar transistor equal to or higher than a predetermined temperature. The feedback unit passes the driving signal to the gate of the insulated-gate bipolar transistor when the voltage between two ends of the sensing resistor is equal to or larger than the second diode current threshold in a case where the forward voltage is larger than a predetermined forward voltage, and the feedback unit stops passing the driving signal to the gate of the insulated-gate bipolar transistor when the voltage between two ends of the sensing resistor is smaller than the second diode current threshold in a case where the forward voltage is larger than a predetermined forward voltage.

Consequently, when the IGBT with a body diode enters a high-temperature state, even if a current flowing into the diode elements is microscopic, the flow of the current into the diode elements can be decided. Consequently, when the IGBT with a body diode enters the high-temperature state and a small current flows into the diode elements, driving the IGBT elements can be ceased. Eventually, the IGBT with a body diode can be protected from being broken due to high temperature.

Further, the feedback unit may further detect current passing through the insulated-gate bipolar transistor. The feedback unit passes the driving signal to the gate of the insulated-gate bipolar transistor when the feedback unit detects no over current through the insulated-gate bipolar transistor. The over current is equal to or larger than a predetermined current, and the feedback unit stops passing the driving signal to the gate of the insulated-gate bipolar transistor when the feedback unit detects the over current through the insulated-gate bipolar transistor.

As mentioned above, even when an over current flows into the IGBT elements, driving the IGBT elements can be ceased. The IGBT elements can therefore be protected from being broken.

Furthermore, the predetermined current may provide an over current threshold. The feedback unit compares the voltage between two ends of the sensing resistor with the over current threshold. The feedback unit passes the driving signal to the gate of the insulated-gate bipolar transistor when the voltage between two ends of the sensing resistor is equal to or smaller than the over current threshold, and the feedback unit stops passing the driving signal to the gate of the insulated-gate bipolar transistor when the voltage between two ends of the sensing resistor is larger than the over current threshold.

Similarly to the case of the diode elements, a current flowing into the IGBT elements can be detected by utilizing the potential difference between the terminals of the sense resistor.

Furthermore, the diode-built-in insulated-gate bipolar transistor may further include a IGBT current sensing element. The IGBT current sensing element passes current in proportion to the current of the insulated-gate bipolar transistor, and the current passing through the IGBT current sensing element flows through the sensing resistor.

According to a second aspect of the present disclosure, a semiconductor device includes: a semiconductor substrate; a diode-built-in double diffused metal oxide semiconductor transistor having a double diffused metal oxide semiconductor transistor and a diode, which are disposed in the substrate; wherein the double diffused metal oxide semiconductor transistor includes a gate, which is driven with a driving signal input into the gate; and a feedback unit for detecting current passing through the diode. The driving signal is input from an external unit into the feedback unit. The feedback unit stops driving the double diffused metal oxide semiconductor transistor when the feedback unit detects no current through the diode, and the feedback unit drives the double diffused metal oxide semiconductor transistor so that current having a direction equal to a forward direction of the forward current flows through the double diffused metal oxide semiconductor transistor when the feedback unit detects a forward current through the diode.

Consequently, when a forward current flows into the diode elements, the current passes through the DMOS elements. Consequently, an increase in a dc loss equivalent to a forward voltage Vf occurring when the forward current flows into the diode elements can be prevented.

Alternatively, the feedback unit may include a sensing resistor for detecting the current through the diode. The feedback unit provides a first diode current threshold for determining whether the current flows through the diode. The feedback unit compares a voltage between two ends of the sensing resistor with the first diode current threshold. The feedback unit stops driving the double diffused metal oxide semiconductor transistor when the voltage between two ends of the sensing resistor is equal to or larger than the first diode current threshold, and the feedback unit drives the double diffused metal oxide semiconductor transistor when the voltage between two ends of the sensing resistor is smaller than the first diode current threshold.

As mentioned above, the potential difference occurring between the terminals of the sense resistor may be used to sense the flow of a current into the diode elements.

Further, the diode-built-in double diffused metal oxide semiconductor transistor may further include a diode current sensing element. The diode current sensing element passes current in proportion to the current of the diode, and the current passing through the diode current sensing element flows through the sensing resistor so that the voltage between two ends of the sensing resistor is generated.

Further, the semiconductor device may further include: a temperature sensing diode element for outputting a forward voltage corresponding to temperature generated in the diode-built-in double diffused metal oxide semiconductor transistor. The feedback unit further provides a second diode current threshold, which is larger than the first diode current threshold. The feedback unit replaces the first diode current threshold with the second diode current threshold so that the feedback unit compares the voltage between two ends of the sensing resistor with the second diode current threshold when the forward voltage is larger than a predetermined forward voltage. The predetermined forward voltage corresponds to the temperature in the diode-built-in double diffused metal oxide semiconductor transistor equal to or higher than a predetermined temperature. The feedback unit stops driving the double diffused metal oxide semiconductor transistor when the voltage between two ends of the sensing resistor is equal to or larger than the second diode current threshold in a case where the forward voltage is larger than a predetermined forward voltage, and the feedback unit drives the double diffused metal oxide semiconductor transistor when the voltage between two ends of the sensing resistor is smaller than the second diode current threshold in a case where the forward voltage is larger than a predetermined forward voltage.

Consequently, even when the DMOS with a body diode acts at high temperature at which a dc loss caused by the diode elements brings about a trouble, a current flowing into the diode elements can be readily sensed. Consequently, even when a small current flows into the diode elements, the DMOS elements can be turned on so that a current will flow into the DMOS elements. Therefore, while an increase in the dc loss caused by the diode elements is prevented, heat dissipation of the diode elements can be suppressed.

Further, the feedback unit may further provide a third diode current threshold, which is larger than the first diode current threshold. The feedback unit compares the voltage between two ends of the sensing resistor with the first diode current threshold so that the feedback unit determines whether the feedback unit drives the double diffused metal oxide semiconductor transistor when the voltage between two ends of the sensing resistor decreases, and the feedback unit compares the voltage between two ends of the sensing resistor with the third diode current threshold so that the feedback unit determines whether the feedback unit drives the double diffused metal oxide semiconductor transistor when the voltage between two ends of the sensing resistor increases.

Consequently, even when the potential difference fluctuates due to noise in the vicinity of the first diode current sensing threshold or third diode current sensing threshold, the on and off states of the DMOS elements will not be switched due to the noise. Consequently, the noise resistivity of the semiconductor device can be improved.

Further, the semiconductor device may further include: a driving unit. The feedback unit inputs the driving signal to the gate of the double diffused metal oxide semiconductor transistor. The double diffused metal oxide semiconductor transistor is further driven with a switching signal input into the gate from an external unit, and the driving unit drives the double diffused metal oxide semiconductor transistor according to the switching signal so that the double diffused metal oxide semiconductor transistor provides a switching element when the switching signal is input in the gate and the driving signal is not input in the gate.

Consequently, a semiconductor device having both a rectifying facility realized with the diode elements and a switching facility realized with the DMOS elements can be provided.

According to a third aspect of the present disclosure, a semiconductor device includes: a semiconductor substrate; a diode-built-in insulated-gate bipolar transistor having an insulated-gate bipolar transistor and a diode unit, which are disposed in the substrate, wherein the insulated-gate bipolar transistor includes a gate, and is driven with a driving signal input into the gate, wherein the diode unit includes a diode element and a diode current sensing element, and wherein the diode current sensing element passes current in proportion to current flowing through the diode element; a sensing resistor coupled with the diode current sensing element; and a feedback unit. The driving signal is input from an external unit into the feedback unit. The feedback unit provides a first diode current threshold, which defines whether the diode element passes current. The feedback unit compares a voltage between two ends of the sensing resistor with the first diode current threshold. The feedback unit passes the driving signal to the gate of the insulated-gate bipolar transistor so that the insulated-gate bipolar transistor turns on when the voltage between two ends of the sensing resistor is equal to or larger than the first diode current threshold, and the feedback unit stops passing the driving signal to the gate of the insulated-gate bipolar transistor so that the insulated-gate bipolar transistor turns off when the voltage between two ends of the sensing resistor is smaller than the first diode current threshold.

Consequently, when a current has flowed into the diode elements, driving the IGBT elements can be ceased. When a current has flowed into the diode elements, since a gate signal with which the IGBT elements are driven is not inputted to the IGBT elements, the interference between the action of the diode elements and the action of the IGBT elements can be avoided.

Since the diode elements and IGBT elements are simultaneously turned on, an increase in the forward voltage of the diode elements attributable to the fact that the diode elements formed in the same semiconductor substrate as the IGBT elements are cannot readily act in a forward direction can be avoided. Thus, an increase in a loss in the forward voltage of the diode elements can be prevented.

Alternatively, the diode-built-in insulated-gate bipolar transistor may further include a IGBT current sensing element. The IGBT current sensing element passes current in proportion to current flowing through the insulated-gate bipolar transistor. The IGBT current sensing element is coupled with the sensing resistor so that the current passing through the IGBT current sensing element flows through the sensing resistor. The feedback unit provides an over current threshold, which defines whether over current passes through the insulated-gate bipolar transistor. The feedback unit compares the voltage between two ends of the sensing resistor with the over current threshold. The feedback unit passes the driving signal to the gate of the insulated-gate bipolar transistor so that the insulated-gate bipolar transistor turns on when the voltage between two ends of the sensing resistor is equal to or smaller than the over current threshold, and the feedback unit stops passing the driving signal to the gate of the insulated-gate bipolar transistor so that the insulated-gate bipolar transistor turns off when the voltage between two ends of the sensing resistor is larger than the first diode current threshold.

As mentioned above, since the IGBT sensing elements that sense a current flowing into the IGBT elements are included, if an over current flows into the IGBT elements, driving the IGBT elements can be ceased. Consequently, the IGBT elements can be protected from being broken.

Alternatively, the semiconductor device may further include: a temperature sensing diode element for outputting a forward voltage corresponding to temperature generated in the diode-built-in insulated-gate bipolar transistor. The feedback unit further provides a second diode current threshold, which is larger than the first diode current threshold. The feedback unit replaces the first diode current threshold with the second diode current threshold so that the feedback unit compares the voltage between two ends of the sensing resistor with the second diode current threshold when the forward voltage is larger than a predetermined forward voltage. The predetermined forward voltage corresponds to the temperature in the diode-built-in insulated-gate bipolar transistor equal to or higher than the predetermined temperature. The feedback unit passes the driving signal to the gate of the insulated-gate bipolar transistor when the voltage between two ends of the sensing resistor is equal to or larger than the second diode current threshold in a case where the forward voltage is larger than the predetermined forward voltage, and the feedback unit stops passing the driving signal to the gate of the insulated-gate bipolar transistor when the voltage between two ends of the sensing resistor is smaller than the second diode current threshold in a case where the forward voltage is larger than the predetermined forward voltage.

Consequently, when the IGBT with a body diode enters the high-temperature state, however microscopic a current flowing into the diode elements is, the flow of the current into the diode elements can be decided. Therefore, when a small current flows into the diode elements with the IGBT with a body diode left in the high-temperature state, driving the IGBT elements can be ceased. Therefore, the IGBT with a body diode can be protected from being broken with the high temperature.

According to a fourth aspect of the present disclosure, a semiconductor device includes: a semiconductor substrate; a diode-built-in insulated-gate bipolar transistor having an insulated-gate bipolar transistor and a diode unit, which are disposed in the substrate, wherein the insulated-gate bipolar transistor includes a gate, and is driven with a driving signal input into the gate, wherein the diode unit includes a diode element and a diode current sensing element, and wherein the diode current sensing element passes current in proportion to current flowing through the diode element; a sensing resistor coupled with the diode current sensing element; and first and second feedback units. The first feedback unit provides a decision threshold, which defines whether the insulated-gate bipolar transistor is in an on-state. The first feedback unit compares a gate voltage of the insulated-gate bipolar transistor with the decision threshold. The first feedback unit outputs a first diode current threshold when the gate voltage is larger than the decision threshold. The first diode current threshold shows that the insulated-gate bipolar transistor is in the on-state. The first feedback unit outputs a second diode current threshold when the gate voltage is equal to or smaller than the decision threshold. The second diode current threshold shows that the insulated-gate bipolar transistor is in an off-state, and the second diode current threshold is larger than the first diode current threshold. The driving signal is input from an external unit into the second feedback unit. The second feedback unit compares a voltage between two ends of the sensing resistor with the first diode current threshold when the voltage between two ends of the sensing resistor decreases. The feedback unit passes the driving signal to the gate of the insulated-gate bipolar transistor so that the insulated-gate bipolar transistor turns on when the voltage between two ends of the sensing resistor is equal to or larger than the first diode current threshold in a case where the voltage between two ends of the sensing resistor decreases. The feedback unit stops passing the driving signal to the gate of the insulated-gate bipolar transistor so that the insulated-gate bipolar transistor turns off when the voltage between two ends of the sensing resistor is smaller than the first diode current threshold in a case where the voltage between two ends of the sensing resistor decreases. The second feedback unit compares the voltage between two ends of the sensing resistor with the second diode current threshold when the voltage between two ends of the sensing resistor increases. The feedback unit stops passing the driving signal to the gate of the insulated-gate bipolar transistor so that the insulated-gate bipolar transistor turns off when the voltage between two ends of the sensing resistor is smaller than the second diode current threshold in a case where the voltage between two ends of the sensing resistor increases, and the feedback unit passes the driving signal to the gate of the insulated-gate bipolar transistor so that the insulated-gate bipolar transistor turns on when the voltage between two ends of the sensing resistor is equal to or larger than the second diode current threshold in a case where the voltage between two ends of the sensing resistor increases.

Consequently, driving the IGBT elements according to the gate potential of the IGBT elements can be provided with a hysteresis. Specifically, when the IGBT elements are off, a current readily flows into the diode elements. Therefore, if the potential difference is compared with the second diode current sensing threshold smaller than the first diode current sensing threshold, the IGBT elements can be turned off at the timing at which a current flows into the diode elements. Moreover, when the IGBT elements are on, a current cannot readily flow into the diode elements. Therefore, if the potential difference is compared with the first diode current sensing threshold, as long as no current flows into the diode elements, the IGBT elements can be turned on. Consequently, the IGBT elements can be controlled stably without being vibrated. Moreover, the interference between the action of the diode elements and the action of the IGBT elements can be avoided in order to prevent an increase in a forward loss in the diode part.

Alternatively, the diode-built-in insulated-gate bipolar transistor may further include a IGBT current sensing element. The IGBT current sensing element passes current in proportion to the current of the insulated-gate bipolar transistor. The IGBT current sensing element is coupled with the sensing resistor so that the current passing through the IGBT current sensing element flows through the sensing resistor. The second feedback unit provides an over current threshold, which defines whether over current passes through the insulated-gate bipolar transistor. The second feedback unit compares the voltage between two ends of the sensing resistor with the over current threshold. The second feedback unit passes the driving signal to the gate of the insulated-gate bipolar transistor so that the insulated-gate bipolar transistor turns on when the voltage between two ends of the sensing resistor is equal to or smaller than the over current threshold, and the feedback unit stops passing the driving signal to the gate of the insulated-gate bipolar transistor so that the insulated-gate bipolar transistor turns off when the voltage between two ends of the sensing resistor is larger than the first diode current threshold.

Consequently, when an overcurrent has flowed into the IGBT elements, driving the IGBT elements can be ceased, and the IGBT elements can be protected from being broken.

According to a fifth aspect of the present disclosure, a semiconductor device includes: a semiconductor substrate; a diode-built-in insulated-gate bipolar transistor having an insulated-gate bipolar transistor unit and a diode unit, which are disposed in the substrate, wherein the insulated-gate bipolar transistor unit includes an insulated-gate bipolar transistor and an IGBT current sensing element, wherein the insulated-gate bipolar transistor includes a gate, and is driven with a driving signal input into the gate, wherein the IGBT current sensing element passes current in proportion to current flowing through the insulated-gate bipolar transistor, wherein the diode unit includes a diode element and a diode current sensing element, and wherein the diode current sensing element passes current in proportion to current flowing through the diode element; a sensing resistor coupled with the IGBT current sensing element and the diode current sensing element; an IGBT feedback unit; and a diode Schmitt unit. The driving signal is input from an external unit into the IGBT feedback unit. The IGBT feedback unit provides an over current threshold, which defines whether over current passes through the insulated-gate bipolar transistor. The IGBT feedback unit compares a voltage between two ends of the sensing resistor with the over current threshold. The IGBT feedback unit passes the driving signal to the gate of the insulated-gate bipolar transistor so that the insulated-gate bipolar transistor turns on when the voltage between two ends of the sensing resistor is equal to or smaller than the over current threshold. The IGBT feedback unit stops passing the driving signal to the gate of the insulated-gate bipolar transistor so that the insulated-gate bipolar transistor turns off when the voltage between two ends of the sensing resistor is larger than the first diode current threshold. The driving signal is further input from the external unit into the diode Schmitt unit. The diode Schmitt unit provides a first diode current threshold, which defines whether the diode element passes current, and a second diode current threshold, which is larger than the first diode current threshold. The diode Schmitt unit compares the voltage between two ends of the sensing resistor with the first diode current threshold when the voltage between two ends of the sensing resistor decreases. The diode Schmitt unit passes the driving signal to the gate of the insulated-gate bipolar transistor so that the insulated-gate bipolar transistor turns on when the voltage between two ends of the sensing resistor is equal to or larger than the first diode current threshold in a case where the voltage between two ends of the sensing resistor decreases. The diode Schmitt unit stops passing the driving signal to the gate of the insulated-gate bipolar transistor so that the insulated-gate bipolar transistor turns off when the voltage between two ends of the sensing resistor is smaller than the first diode current threshold in a case where the voltage between two ends of the sensing resistor decreases. The diode Schmitt unit compares the voltage between two ends of the sensing resistor with the second diode current threshold when the voltage between two ends of the sensing resistor increases. The diode Schmitt unit stops passing the driving signal to the gate of the insulated-gate bipolar transistor so that the insulated-gate bipolar transistor turns off when the voltage between two ends of the sensing resistor is smaller than the second diode current threshold in a case where the voltage between two ends of the sensing resistor increases, and the diode Schmitt unit passes the driving signal to the gate of the insulated-gate bipolar transistor so that the insulated-gate bipolar transistor turns on when the voltage between two ends of the sensing resistor is equal to or larger than the second diode current threshold in a case where the voltage between two ends of the sensing resistor increases.

When a current has flowed into the diode elements, driving the IGBT elements can be ceased. The interference between the action of the diode elements and the action of the IGBT elements can be avoided in order to prevent an increase in a forward loss in the diode part. In this case, since the diode current sensing thresholds have a difference equivalent to a hysteresis, the diode Schmitt means can prevent a chattering from occurring during implementation of feedback control in the IGBT elements. Moreover, when an overcurrent has flowed into the IGBT elements, the IGBT feedback means ceases driving the IGBT elements so as to protect the IGBT elements from being broken.

According to a sixth aspect of the present disclosure, a semiconductor device includes: a semiconductor substrate; a diode-built-in insulated-gate bipolar transistor having an insulated-gate bipolar transistor unit and a diode unit, which are disposed in the substrate, wherein the insulated-gate bipolar transistor unit includes an insulated-gate bipolar transistor and an IGBT current sensing element, wherein the insulated-gate bipolar transistor includes a gate, and is driven with a driving signal input into the gate, wherein the IGBT current sensing element passes current in proportion to current flowing through the insulated-gate bipolar transistor, wherein the diode unit includes a diode element and a diode current sensing element, and wherein the diode current sensing element passes current in proportion to current flowing through the diode element; a first sensing resistor coupled with the IGBT current sensing element; a second sensing resistor coupled with the diode current sensing element; an IGBT Schmitt unit; and a diode Schmitt unit. The driving signal is input from an external unit into the IGBT Schmitt unit. The IGBT Schmitt unit provides a first over current threshold, which defines whether over current passes through the insulated-gate bipolar transistor, and a second over current threshold, which is smaller than the first over current threshold. The IGBT Schmitt unit compares a first voltage between two ends of the first sensing resistor with the first over current threshold when the first voltage increases. The IGBT Schmitt unit passes the driving signal to the gate of the insulated-gate bipolar transistor so that the insulated-gate bipolar transistor turns on when the first voltage is equal to or smaller than the first over current threshold in a case where the first voltage increases. The IGBT Schmitt unit stops passing the driving signal to the gate of the insulated-gate bipolar transistor so that the insulated-gate bipolar transistor turns off when the first voltage is larger than the first over current threshold in a case where the first voltage increases. The IGBT Schmitt unit compares the first voltage with the second over current threshold when the first voltage decreases. The IGBT Schmitt unit stops passing the driving signal to the gate of the insulated-gate bipolar transistor so that the insulated-gate bipolar transistor turns off when the first voltage is larger than the second over current threshold in a case where the first voltage decreases. The IGBT Schmitt unit passes the driving signal to the gate of the insulated-gate bipolar transistor so that the insulated-gate bipolar transistor turns on when the first voltage is equal to or smaller than the second over current threshold in a case where the first voltage decreases. The driving signal is further input from the external unit into the diode Schmitt unit. The diode Schmitt unit provides a first diode current threshold, which defines whether the diode element passes current, and a second diode current threshold, which is larger than the first diode current threshold. The diode Schmitt unit compares a second voltage between two ends of the second sensing resistor with the first diode current threshold when the second voltage decreases. The diode Schmitt unit passes the driving signal to the gate of the insulated-gate bipolar transistor so that the insulated-gate bipolar transistor turns on when the second voltage is equal to or larger than the first diode current threshold in a case where the second voltage decreases. The diode Schmitt unit stops passing the driving signal to the gate of the insulated-gate bipolar transistor so that the insulated-gate bipolar transistor turns off when the second voltage is smaller than the first diode current threshold in a case where the second voltage decreases. The diode Schmitt unit compares the second voltage with the second diode current threshold when the second voltage increases. The diode Schmitt unit stops passing the driving signal to the gate of the insulated-gate bipolar transistor so that the insulated-gate bipolar transistor turns off when the second voltage is smaller than the second diode current threshold in a case where the second voltage increases, and the diode Schmitt unit passes the driving signal to the gate of the insulated-gate bipolar transistor so that the insulated-gate bipolar transistor turns on when the second voltage is equal to or larger than the second diode current threshold in a case where the second voltage increases.

Consequently, an increase in a forward loss in the diode part can be prevented, and a chattering by the IGBT elements can be prevented. Moreover, since a current flowing into the IGBT sensing elements and a current flowing into the diode elements are sensed by the different sense resistors, the thresholds can be designed according to the output characteristics of the IGBT sensing elements and diode sensing elements.

According to a seventh aspect of the present disclosure, a semiconductor device includes: a semiconductor substrate having a first conductivity type, having a first principal surface and a second principal surface, and including a main region and a sensing region, wherein an area of the sensing region on the first principal surface is smaller than the main region; a diode-built-in insulated-gate bipolar transistor having an insulated-gate bipolar transistor and a free wheel diode, which are disposed in the main region of the substrate, wherein the insulated-gate bipolar transistor has a gate electrode, and is driven with a driving signal input into the gate electrode; and a diode current sensing element disposed in the sensing region of the substrate. The free wheel diode includes a FWD anode having a second conductive type and a FWD cathode having the first conductive type. The FWD anode is provided by a first surface portion of the main region in the substrate on the first principal surface, and provides a base of the insulated-gate bipolar transistor. The FWD cathode is disposed in a second surface portion of the main region in the substrate on the second principal surface. The insulated-gate bipolar transistor includes a collector disposed in a third surface portion of the main region in the substrate on the second principal surface, which is different from the second surface portion. The diode current sensing element includes a sensing element anode having the second conductive type. The sensing element anode is disposed in a fourth surface portion of the sensing region in the substrate on the first principal surface, and the diode current sensing element passes current in proportion to current flowing through the free wheel diode.

As mentioned above, according to the present invention, the diode-only sensing elements are formed within the sense region. The diode-only sensing elements have no gate electrode through which a gate driving signal is inputted, and are thus formed to remain unaffected by a gate potential. Consequently, a current proportional to a current flowing into the commutation diode elements readily flows into the diode-only sensing elements (a detective voltage can be readily developed). Therefore, as long as the diode-only sensing elements are employed, a feedback means that controls whether the gate driving signal should be inputted through the gate electrodes can be highly precisely put into action according to whether a current has flowed into the commutation diode elements. In other words, although the commutation diode elements are incorporated in the IGBT elements, an increase in a forward loss caused by the commutation diode elements can be effectively suppressed.

Alternatively, the semiconductor device may further include: wherein the diode current sensing element further includes a sensing element cathode having the first conductive type. The sensing element cathode is disposed in a fifth surface portion of the sensing region in the substrate on the second principal surface, and the sensing element cathode is spaced apart from the base of the insulated-gate bipolar transistor by a predetermined distance along with a direction parallel to the first principal surface.

Owing to the above construction, at least part of carriers accumulated in the semiconductor substrate within the main cell region along with the action of the IGBT elements (holes injected from the collector regions included in the IGBT elements) flows into the cathode regions of the diode-only sensing elements. This prevents the incorrect action of the diode-only sensing elements. Namely, current detection to be performed using the diode-only sensing elements can be more accurately achieved according to a current flowing into the commutation diode elements.

Further, the sensing element anode may be disposed just over the sensing element cathode.

Owing to the above construction, the action resistance offered by the diode-only sensing elements can be reduced so that a current can more readily flow (a detective voltage can be readily developed).

Alternatively, the diode current sensing element may further include a sensing element cathode having the first conductive type. The FWD cathode provides the sensing element cathode.

Alternatively, the gate electrode may be disposed in a gate trench via an insulation film. The gate trench is disposed in the first surface portion of the main region in the substrate on the first principal surface, and penetrates the base of the insulated-gate bipolar transistor so that the gate trench reaches the substrate. The diode current sensing element further includes a dummy gate electrode, which is electrically grounded. The dummy gate electrode is disposed in a dummy gate trench via an insulation film, and the dummy gate trench is disposed in the fourth surface portion of the sensing region in the substrate on the first principal surface, and penetrates the sensing element anode of the diode current sensing element so that the dummy gate trench reaches the substrate.

Owing to the above construction, since the dummy gate electrodes are grounded but are not electrically connected to the gate electrodes of the IGBT elements. Although the dummy gate electrodes having the same structure as the gate electrodes do are included, the action of the diode-only sensing elements will remain unaffected by the gate potential. Moreover, a design ensuring a dielectric strength may be identical to that for the commutation diode elements within the main region.

Alternatively, the semiconductor device may further include: a IGBT current sensing element disposed in the sensing region of the substrate. The IGBT current sensing element includes a sensing element base having the second conductive type, a sensing element gate electrode, a sensing element emitter having the first conductive type, and a sensing element collector having the second conductive type. The sensing element base is provided by a sixth surface portion of the sensing region in the substrate on the first principal surface. The sensing element gate electrode is disposed in a sensing element gate trench via an insulation film. The sensing element gate trench is disposed in the sixth surface portion of the sensing region in the substrate on the first principal surface, and penetrates the sensing element base of the IGBT current sensing element so that the sensing element gate trench reaches the substrate. The sensing element emitter is disposed in the sixth surface portion of the sensing region in the substrate on the first principal surface, and is adjacent to the sensing element gate trench. The sensing element collector is disposed in a seventh surface portion of the sensing region in the substrate on the second principal surface, and the IGBT current sensing element passes current in proportion to current flowing through the insulated-gate bipolar transistor.

Owing to the above structure, by sensing the current flowing into the IGBT-only sensing elements, the IGBT elements can be protected from an over current.

Further, the sensing element cathode of the diode current sensing element may be spaced apart from the sensing element base of the IGBT current sensing element by a predetermined distance along with the direction parallel to the first principal surface.

Owing to the above construction, at least part of carriers accumulated in the semiconductor substrate along with the action of the IGBT-only sensing elements (holes injected from the collector regions included in the IGBT-only sensing elements) flows into the cathode regions of the diode-only sensing elements. This prevents the incorrect action of the diode-only sensing elements. In other words, current detection to be performed using the diode-only sensing elements can be more accurately achieved according to the current flowing into the commutation diode elements.

Alternatively, the semiconductor device may further include: a IGBT current sensing element disposed in the sensing region of the substrate. The IGBT current sensing element includes a sensing element base having the second conductive type, a sensing element gate electrode, a sensing element emitter having the first conductive type, and a sensing element collector having the second conductive type. The sensing element base is provided by a sixth surface portion of the sensing region in the substrate on the first principal surface. The sensing element gate electrode is disposed in a sensing element gate trench via an insulation film. The sensing element gate trench is disposed in a center of the sixth surface portion of the sensing region in the substrate on the first principal surface, and penetrates the sensing element base of the IGBT current sensing element so that the sensing element gate trench reaches the substrate. The sensing element emitter is disposed in the sixth surface portion of the sensing region in the substrate on the first principal surface, and is adjacent to the sensing element gate trench. The sensing element collector is disposed in a seventh surface portion of the sensing region in the substrate on the second principal surface. The IGBT current sensing element passes current in proportion to current flowing through the insulated-gate bipolar transistor. The sensing element base includes a part, which is disposed on a periphery from the center of the sixth surface portion. The part of the sensing element base provides the sensing element anode, and the sensing element cathode is spaced apart from the sensing element base by a predetermined distance along with the direction parallel to the first principal surface.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device comprising:
   a semiconductor substrate;
   a diode-built-in insulated-gate bipolar transistor having an insulated-gate bipolar transistor and a diode, which are disposed in the substrate, wherein the insulated-gate bipolar transistor includes a gate, and is driven with a driving signal input into the gate; and
   a feedback unit for detecting current passing through the diode,
   wherein the driving signal is input from an external unit into the feedback unit,
   wherein the feedback unit passes the driving signal to the gate of the insulated-gate bipolar transistor when the feedback unit detects no current through the diode,
   wherein the feedback unit stops passing the driving signal to the gate of the insulated-gate bipolar transistor when the feedback unit detects the current through the diode,
   wherein the feedback unit includes a sensing resistor for detecting the current through the diode,
   wherein the diode-built-in insulated-gate bipolar transistor further includes a diode current sensing element,
   wherein the diode current sensing element passes current in proportion to the current of the diode, and
   wherein the sensing resistor is connected between the diode and the diode current sensing element.

2. The semiconductor device according to claim 1,
   wherein the feedback unit provides a first diode current threshold for determining whether the current flows through the diode,
   wherein the feedback unit compares a voltage between two ends of the sensing resistor with the first diode current threshold,
   wherein the feedback unit passes the driving signal to the gate of the insulated-gate bipolar transistor when the voltage between two ends of the sensing resistor is equal to or larger than the first diode current threshold, and
   wherein the feedback unit stops passing the driving signal to the gate of the insulated-gate bipolar transistor when the voltage between two ends of the sensing resistor is smaller than the first diode current threshold.

3. The semiconductor device according to claim 2,
   wherein the current passing through the diode current sensing element flows through the sensing resistor.

4. The semiconductor device according to claim 2, further comprising:
   a temperature sensing diode element for outputting a forward voltage corresponding to temperature generated in the diode-built-in insulated-gate bipolar transistor,
   wherein the feedback unit further provides a second diode current threshold, which is larger than the first diode current threshold,
   wherein the feedback unit replaces the first diode current threshold with the second diode current threshold so that the feedback unit compares the voltage between two ends of the sensing resistor with the second diode current threshold when the forward voltage is larger than a predetermined forward voltage, wherein the predetermined forward voltage corresponds to the temperature in the diode-built-in insulated-gate bipolar transistor equal to or higher than a predetermined temperature, wherein the feedback unit passes the driving signal to the gate of the insulated-gate bipolar transistor when the voltage between two ends of the sensing resistor is equal to or larger than the second diode current threshold in a case where the forward voltage is larger than the predetermined forward voltage, and wherein the feedback unit stops passing the driving signal to the gate of the insulated-gate bipolar transistor when the voltage between two ends of the sensing resistor is smaller than the second diode current threshold in a case where the forward voltage is larger than the predetermined forward voltage.

5. The semiconductor device according to claim 2, wherein the feedback unit further detects current passing through the insulated-gate bipolar transistor, wherein the feedback unit passes the driving signal to the gate of the insulated-gate bipolar transistor when the feedback unit detects no over current through the insulated-gate bipolar transistor, wherein the over current is equal to or larger than a predetermined current, and wherein the feedback unit stops passing the driving signal to the gate of the insulated-gate bipolar transistor when the feedback unit detects the over current through the insulated-gate bipolar transistor.

6. The semiconductor device according to claim 5, wherein the predetermined current provides an over current threshold, wherein the feedback unit compares the voltage between two ends of the sensing resistor with the over current threshold, wherein the feedback unit passes the driving signal to the gate of the insulated-gate bipolar transistor when the voltage between two ends of the sensing resistor is equal to or smaller than the over current threshold, and wherein the feedback unit stops passing the driving signal to the gate of the insulated-gate bipolar transistor when the voltage between two ends of the sensing resistor is larger than the over current threshold.

7. The semiconductor device according to claim 5, wherein the diode-built-in insulated-gate bipolar transistor further includes a IGBT current sensing element, wherein the IGBT current sensing element passes current in proportion to the current of the insulated-gate bipolar transistor, and wherein the current passing through the IGBT current sensing element flows through the sensing resistor.

8. A semiconductor device comprising:

a semiconductor substrate;

an insulated-gate bipolar transistor including, in the semiconductor substrate, a transistor part with a gate and a diode part with a diode and a diode-current sensing element, the insulated-gate bipolar transistor being driven by a driving signal applied to the gate; and a feedback unit, including a sensing resistor that connects the diode and the diode-current sensing element, that detects when there is current in the diode based in part on a voltage across the sensing resistor, and that selectively prevents the driving signal from being applied to the gate when it is detected that there is current in the diode, wherein any current in the diode-current sensing element is proportional to current in the diode.

* * * * *